(12) United States Patent
Kamidaki et al.

(10) Patent No.: US 8,946,560 B2
(45) Date of Patent: Feb. 3, 2015

(54) ELECTRIC WIRE AND COIL

(71) Applicant: Fujikura Ltd., Koto-ku, Tokyo (JP)

(72) Inventors: Chihiro Kamidaki, Sakura (JP); Ning Guan, Chiba (JP); Takashi Shinmoto, Noda (JP); Yasunobu Hori, Urayasu (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 14/208,662

(22) Filed: Mar. 13, 2014

(65) Prior Publication Data

US 2014/0272452 A1    Sep. 18, 2014

Related U.S. Application Data

(63) Continuation of application No. PCT/JP2012/073870, filed on Sep. 19, 2012.

(30) Foreign Application Priority Data

Sep. 22, 2011  (JP) ................................. 2011-207336

(51) Int. Cl.
*H01B 1/02* (2006.01)
*H05K 9/00* (2006.01)

(52) U.S. Cl.
CPC .................................... *H05K 9/0098* (2013.01)
USPC .................................... 174/126.2; 174/126.1

(58) Field of Classification Search
USPC ........................... 174/126.1, 126.2, 34, 36, 33
See application file for complete search history.

(56) References Cited

U.S. PATENT DOCUMENTS 4,079,192 A    3/1978  Josse

FOREIGN PATENT DOCUMENTS

| JP | 50-066171 U | 6/1975 |
|----|---|---|
| JP | 62-076216 A | 4/1987 |
| JP | 2000-030538 A | 1/2000 |
| JP | 2002-150633 A | 5/2002 |
| JP | 2003-301292 A | 10/2003 |
| JP | 2004-111072 A | 4/2004 |
| JP | 2004-139832 A | 5/2004 |
| JP | 2004139832 A * | 5/2004 |
| JP | 2005-108654 A | 4/2005 |
| JP | 2009-129550 A | 6/2009 |
| JP | 2009-277396 A | 11/2009 |
| JP | 2009-283176 A | 12/2009 |
| JP | 2010-157363 A | 7/2010 |
| JP | 2010-157416 A | 7/2010 |

(Continued)

OTHER PUBLICATIONS

Office Action issued by Chinese Patent Office in Chinese Application No. 201280046182.5 mailed Jul. 22, 2014.

(Continued)

*Primary Examiner* — Timothy Thompson
*Assistant Examiner* — Amol Patel
(74) *Attorney, Agent, or Firm* — Sughrue Mion, PLLC

(57) ABSTRACT

A electric wire includes a central conductor 1 made of aluminum or an aluminum alloy, a cover layer 2 made of copper and covering the central conductor 1, and a ferromagnetic layer 3 covering the cover layer 2 and blocking the external magnetic field. The thickness of the ferromagnetic layer 3 is in a range from 0.04 μm to 14 μm, the total diameter of the central conductor 1 and the cover layer 2 is in a range from 0.05 mm to 0.4 mm, and the cross-sectional area of the central conductor 1 is in a range from 85% to 95% of the total cross-sectional area of the central conductor 1 and the cover layer 2.

2 Claims, 55 Drawing Sheets

(56) References Cited

FOREIGN PATENT DOCUMENTS

| JP | 2010157363 A | * | 7/2010 |
|----|--------------|---|--------|
| WO | 2006/046358 A1 | | 5/2006 |

OTHER PUBLICATIONS

Tsutomu Mizuno et al., "Reduction in Eddy Current Loss in Conductor Using Magnetoplated Wire," The Journal of the Institute of Electrical Engineers of Japan A, 2007, vol. 127, No. 10, pp. 611-620.

Tsutomu Mizuno et al., "Reduction of Eddy Current Loss in Magnetoplated Wire," The International Journal for Computation and Mathematics in Electrical and Electronic Engineering, 2009, vol. 28, No. 1, pp. 57-66.

Japanese Office Action of 2012-554138 dated Feb. 5, 2013.
Japanese Office Action of 2012-554138 dated May 7, 2013.
Japanese Office Action of 2013-141425 dated Aug. 13, 2013.
International Search Report of PCT/JP2012/073870 dated Nov. 6, 2012.

* cited by examiner (a)

(b)

(a)

(b)

(a)

(b)

| 1kHz | 10kHz | 100kHz | 1000kHz |
|------|-------|--------|---------|
| 0.76 | 0.76  | 0.76   | 0.76    |

| $\mu r$ [-] | 1kHz | 10kHz | 100kHz | 1000kHz |
|-------------|------|-------|--------|---------|
| 100         | 1.38 | 1.38  | 1.38   | 1.38    |
| 300         | 0.76 | 0.76  | 0.76   | 0.76    |
| 500         | 0.57 | 0.57  | 0.57   | 0.57    |
| 1000        | 0.38 | 0.38  | 0.38   | 0.38    |

FCu: b=0.025mm

| μr [-] | 1kHz | 10kHz | 100kHz | 1000kHz |
|---|---|---|---|---|
| 100 | 1.67 | 1.67 | 1.67 | 1.67 |
| 300 | 0.92 | 0.92 | 0.92 | 0.92 |
| 500 | 0.68 | 0.68 | 0.68 | 0.68 |
| 1000 | 0.45 | 0.45 | 0.45 | 0.45 |

(b)

FCA85%: c=0.023mm, b=0.025mm

| μr [-] | 1kHz | 10kHz | 100kHz | 1000kHz |
|---|---|---|---|---|
| 100 | 1.45 | 1.45 | 1.45 | 1.45 |
| 300 | 0.80 | 0.80 | 0.80 | 0.80 |
| 500 | 0.59 | 0.59 | 0.59 | 0.59 |
| 1000 | 0.39 | 0.39 | 0.39 | 0.39 |

(c)

FCA90%: c=0.0237mm, b=0.025mm

| μr [-] | 1kHz | 10kHz | 100kHz | 1000kHz |
|---|---|---|---|---|
| 100 | 1.42 | 1.42 | 1.42 | 1.41 |
| 300 | 0.78 | 0.78 | 0.78 | 0.78 |
| 500 | 0.58 | 0.58 | 0.58 | 0.58 |
| 1000 | 0.38 | 0.38 | 0.38 | 0.38 |

(d)

FCA95%: c=0.0244mm, b=0.025mm

| μr [-] | 1kHz | 10kHz | 100kHz | 1000kHz |
|---|---|---|---|---|
| 100 | 1.38 | 1.38 | 1.38 | 1.38 |
| 300 | 0.76 | 0.76 | 0.76 | 0.76 |
| 500 | 0.57 | 0.57 | 0.57 | 0.57 |
| 1000 | 0.38 | 0.38 | 0.38 | 0.38 |

FCu: b=0.025mm

| $\mu r$ [-] | 1kHz | 10kHz | 100kHz | 1000kHz |
|---|---|---|---|---|
| 3000 | 0.23 | 0.23 | 0.23 | 0.23 |
| 5000 | 0.16 | 0.16 | 0.16 | 0.16 |
| 10000 | 0.104 | 0.104 | 0.104 | 0.104 |

(b)

FCA85%: c=0.023mm, b=0.025mm

| $\mu r$ [-] | 1kHz | 10kHz | 100kHz | 1000kHz |
|---|---|---|---|---|
| 3000 | 0.20 | 0.20 | 0.20 | 0.20 |
| 5000 | 0.14 | 0.14 | 0.14 | 0.14 |
| 10000 | 0.09 | 0.09 | 0.09 | 0.09 |

(c)

FCA90%: c=0.0237mm, b=0.025mm

| $\mu r$ [-] | 1kHz | 10kHz | 100kHz | 1000kHz |
|---|---|---|---|---|
| 3000 | 0.19 | 0.19 | 0.19 | 0.19 |
| 5000 | 0.14 | 0.14 | 0.14 | 0.14 |
| 10000 | 0.09 | 0.09 | 0.09 | 0.09 |

(d)

FCA95%: c=0.0244mm, b=0.025mm

| $\mu r$ [-] | 1kHz | 10kHz | 100kHz | 1000kHz |
|---|---|---|---|---|
| 3000 | 0.19 | 0.19 | 0.19 | 0.19 |
| 5000 | 0.14 | 0.14 | 0.14 | 0.14 |
| 10000 | 0.09 | 0.09 | 0.09 | 0.09 |

(a)

(b)

(a)

(b)

Rac[Ω/mm], α=5000 mm⁻¹

| FREQUENCY [kHz] | 40 | 60 | 130 |
|---|---|---|---|
| Cu | 0.054 | 0.110 | 0.485 |
| CA | 0.041 | 0.075 | 0.298 |
| FCu | 0.017 | 0.015 | 0.038 |
| FCA | 0.024 | 0.019 | 0.038 |

(a)

(b)

Rac[Ω/mm], α=1000 mm⁻¹

| FREQUENCY [kHz] | 40 | 60 | 130 |
|---|---|---|---|
| Cu | 0.010 | 0.013 | 0.028 |
| CA | 0.016 | 0.017 | 0.026 |
| FCu | 0.009 | 0.009 | 0.010 |
| FCA | 0.015 | 0.015 | 0.015 |

(a)

(b)

Rac[Ω/mm], α=500 mm⁻¹

| FREQUENCY [kHz] | 40 | 60 | 130 |
|---|---|---|---|
| Cu | 0.009 | 0.010 | 0.013 |
| CA | 0.015 | 0.016 | 0.018 |
| FCu | 0.008 | 0.009 | 0.009 |
| FCA | 0.014 | 0.015 | 0.015 |

(a)

(b)

(a)

(b)

(a)

(b)

| 1kHz | 10kHz | 100kHz | 1000kHz |
|---|---|---|---|
| 2.33 | 2.33 | 2.32 | 1.97 |

FCu: b=0.1mm

| $\mu r$ [−] | 1kHz | 10kHz | 100kHz | 1000kHz |
|---|---|---|---|---|
| 100 | 6.70 | 6.70 | 6.67 | 4.99 |
| 300 | 3.68 | 3.68 | 3.66 | 2.68 |
| 500 | 2.73 | 2.73 | 2.71 | 1.97 |
| 1000 | 1.79 | 1.79 | 1.78 | 1.29 |

(b)

FCA85%: c=0.092mm, b=0.1mm

| $\mu r$ [−] | 1kHz | 10kHz | 100kHz | 1000kHz |
|---|---|---|---|---|
| 100 | 5.79 | 5.79 | 5.78 | 4.96 |
| 300 | 3.20 | 3.20 | 3.19 | 2.69 |
| 500 | 2.38 | 2.38 | 2.37 | 1.99 |
| 1000 | 1.57 | 1.57 | 1.56 | 1.30 |

(c)

FCA90%: c=0.095mm, b=0.1mm

| $\mu r$ [−] | 1kHz | 10kHz | 100kHz | 1000kHz |
|---|---|---|---|---|
| 100 | 5.66 | 5.66 | 5.65 | 4.91 |
| 300 | 3.13 | 3.13 | 3.13 | 2.67 |
| 500 | 2.33 | 2.33 | 2.32 | 1.97 |
| 1000 | 1.54 | 1.54 | 1.53 | 1.30 |

(d)

FCA95%: c=0.097mm, b=0.1mm

| $\mu r$ [−] | 1kHz | 10kHz | 100kHz | 1000kHz |
|---|---|---|---|---|
| 100 | 5.52 | 5.52 | 5.51 | 4.84 |
| 300 | 3.06 | 3.06 | 3.05 | 2.64 |
| 500 | 2.27 | 2.27 | 2.27 | 1.95 |
| 1000 | 1.50 | 1.50 | 1.50 | 1.28 |

FCu: b=0.1mm

| μr [-] | 1kHz | 10kHz | 100kHz | 1000kHz |
|---|---|---|---|---|
| 3000 | 0.90 | 0.90 | 0.90 | 0.65 |
| 5000 | 0.65 | 0.65 | 0.65 | 0.47 |
| 10000 | 0.42 | 0.42 | 0.42 | 0.30 |

(b)

FCA85%: c=0.092mm, b=0.1mm

| μr [-] | 1kHz | 10kHz | 100kHz | 1000kHz |
|---|---|---|---|---|
| 3000 | 0.79 | 0.79 | 0.79 | 0.66 |
| 5000 | 0.57 | 0.57 | 0.57 | 0.47 |
| 10000 | 0.37 | 0.37 | 0.37 | 0.30 |

(c)

FCA90%: c=0.095mm, b=0.1mm

| μr [-] | 1kHz | 10kHz | 100kHz | 1000kHz |
|---|---|---|---|---|
| 3000 | 0.78 | 0.78 | 0.77 | 0.65 |
| 5000 | 0.56 | 0.56 | 0.56 | 0.47 |
| 10000 | 0.36 | 0.36 | 0.36 | 0.30 |

(d)

FCA95%: c=0.097mm, b=0.1mm

| μr [-] | 1kHz | 10kHz | 100kHz | 1000kHz |
|---|---|---|---|---|
| 3000 | 0.76 | 0.76 | 0.76 | 0.65 |
| 5000 | 0.55 | 0.55 | 0.55 | 0.47 |
| 10000 | 0.35 | 0.35 | 0.35 | 0.30 |

(a)

(b)

(a)

(b)

(a)

(b)

Rac[Ω/mm], α=5000 mm⁻¹

| FREQUENCY [kHz] | 40 | 60 | 130 |
|---|---|---|---|
| Cu | 11.390 | 26.318 | 119.314 |
| CA | 6.860 | 15.840 | 73.524 |
| FCu | 0.819 | 1.868 | 8.552 |
| FCA | 0.628 | 1.399 | 6.474 |

(a)

(b)

$R_{ac}[\Omega/mm]$, $\alpha=1000$ mm$^{-1}$

| FREQUENCY [kHz] | 40 | 60 | 130 |
|---|---|---|---|
| Cu | 0.257 | 1.028 | 4.805 |
| CA | 0.159 | 0.640 | 2.975 |
| FCu | 0.019 | 0.074 | 0.343 |
| FCA | 0.015 | 0.057 | 0.258 |

(a)

(b)

Rac[Ω/mm], α=500 mm⁻¹

| FREQUENCY [kHz] | 40 | 60 | 130 |
|---|---|---|---|
| Cu | 0.065 | 0.116 | 1.199 |
| CA | 0.041 | 0.072 | 0.740 |
| FCu | 0.005 | 0.009 | 0.088 |
| FCA | 0.004 | 0.007 | 0.067 |

(a)

(b)

Rac[Ω/mm], α=100 mm⁻¹

| FREQUENCY [kHz] | 40 | 60 | 130 |
|---|---|---|---|
| Cu | 0.003 | 0.005 | 0.048 |
| CA | 0.002 | 0.004 | 0.031 |
| FCu | 0.001 | 0.001 | 0.004 |
| FCA | 0.001 | 0.001 | 0.003 |

FCu: b=0.2mm

| μr [-] | 1kHz | 10kHz | 100kHz | 1000kHz |
|---|---|---|---|---|
| 100 | 13.40 | 13.38 | 12.54 | 4.58 |
| 300 | 7.00 | 7.00 | 6.82 | 2.47 |
| 500 | 5.45 | 5.45 | 5.05 | 1.83 |
| 1000 | 3.59 | 3.58 | 3.31 | 1.20 |

(b)

FCA85%: c=0.184mm, b=0.2mm

| μr [-] | 1kHz | 10kHz | 100kHz | 1000kHz |
|---|---|---|---|---|
| 100 | 11.58 | 11.58 | 11.24 | 5.10 |
| 300 | 6.40 | 6.40 | 6.18 | 2.74 |
| 500 | 4.76 | 4.75 | 4.59 | 2.02 |
| 1000 | 3.14 | 3.14 | 3.02 | 1.33 |

(c)

FCA90%: c=0.190mm, b=0.2mm

| μr [-] | 1kHz | 10kHz | 100kHz | 1000kHz |
|---|---|---|---|---|
| 100 | 11.32 | 11.32 | 11.02 | 5.14 |
| 300 | 6.26 | 6.26 | 6.07 | 2.77 |
| 500 | 4.66 | 4.66 | 4.51 | 2.04 |
| 1000 | 3.07 | 3.07 | 2.97 | 1.34 |

(d)

FCA95%: c=0.195mm, b=0.2mm

| μr [-] | 1kHz | 10kHz | 100kHz | 1000kHz |
|---|---|---|---|---|
| 100 | 11.04 | 11.04 | 10.78 | 5.18 |
| 300 | 6.11 | 6.11 | 5.94 | 2.79 |
| 500 | 4.55 | 4.55 | 4.42 | 2.06 |
| 1000 | 3.00 | 3.00 | 2.91 | 1.36 |

FCu: b=0.2mm

| μr [-] | 1kHz | 10kHz | 100kHz | 1000kHz |
|---|---|---|---|---|
| 3000 | 1.81 | 1.81 | 1.67 | 0.61 |
| 5000 | 1.30 | 1.30 | 1.20 | 0.44 |
| 10000 | 0.83 | 0.83 | 0.77 | 0.28 |

(b)

FCA85%: c=0.184mm, b=0.2mm

| μr [-] | 1kHz | 10kHz | 100kHz | 1000kHz |
|---|---|---|---|---|
| 3000 | 1.58 | 1.58 | 1.52 | 0.67 |
| 5000 | 1.15 | 1.14 | 1.10 | 0.49 |
| 10000 | 0.73 | 0.73 | 0.71 | 0.31 |

(c)

FCA90%: c=0.190mm, b=0.2mm

| μr [-] | 1kHz | 10kHz | 100kHz | 1000kHz |
|---|---|---|---|---|
| 3000 | 1.55 | 1.55 | 1.50 | 0.68 |
| 5000 | 1.12 | 1.12 | 1.08 | 0.49 |
| 10000 | 0.72 | 0.72 | 0.69 | 0.32 |

(d)

FCA95%: c=0.195mm, b=0.2mm

| μr [-] | 1kHz | 10kHz | 100kHz | 1000kHz |
|---|---|---|---|---|
| 3000 | 1.52 | 1.52 | 1.47 | 0.69 |
| 5000 | 1.10 | 1.10 | 1.06 | 0.50 |
| 10000 | 0.70 | 0.70 | 0.68 | 0.32 |

(a)

(b)

(a)

(b)

(a)

(b)

$R_{ac}[\Omega/mm]$, $\alpha=1000$ mm$^{-1}$

| FREQUENCY [kHz] | 40 | 60 | 130 |
|---|---|---|---|
| Cu | 7.314 | 15.943 | 67.182 |
| CA | 4.411 | 9.786 | 43.886 |
| FCu | 0.323 | 0.684 | 2.844 |
| FCA | 0.262 | 0.574 | 2.584 |

(a)

(b)

$R_{ac}[\Omega/mm]$, $\alpha = 500$ mm$^{-1}$

| FREQUENCY [kHz] | 40 | 60 | 130 |
|---|---|---|---|
| Cu | 1.828 | 4.014 | 16.304 |
| CA | 1.119 | 2.477 | 11.106 |
| FCu | 0.080 | 0.174 | 0.704 |
| FCA | 0.066 | 0.145 | 0.645 |

(a)

(b)

Rac[Ω/mm], α=100 mm⁻¹

| FREQUENCY [kHz] | 40 | 60 | 130 |
|---|---|---|---|
| Cu | 0.073 | 0.159 | 0.655 |
| CA | 0.044 | 0.098 | 0.449 |
| FCu | 0.003 | 0.007 | 0.028 |
| FCA | 0.003 | 0.006 | 0.026 |

(a)

(b)

Rac[Ω/mm], α=50 mm⁻¹

| FREQUENCY [kHz] | 40 | 60 | 130 |
|---|---|---|---|
| Cu | 0.018 | 0.040 | 0.166 |
| CA | 0.011 | 0.025 | 0.111 |
| FCu | 0.001 | 0.002 | 0.007 |
| FCA | 0.001 | 0.002 | 0.006 |

FIG. 42

(a) 0.05 φ, FCA95%

| ur | 1 kHz | 10 kHz | 100 kHz | 1000 kHz | 10000 kHz | 30000 kHz |
|---|---|---|---|---|---|---|
| 5 | 2.22 | 2.22 | 2.22 | 2.22 | 2.47 | 2.83 |
| 10 | 2.89 | 2.89 | 2.89 | 2.90 | 2.93 | 2.64 |
| 30 | 2.33 | 2.33 | 2.33 | 2.33 | 2.25 | 1.78 |
| 50 | 1.91 | 1.91 | 1.91 | 1.91 | 1.82 | 1.40 |
| 100 | 1.38 | 1.38 | 1.38 | 1.38 | 1.30 | 0.98 |
| 300 | 0.76 | 0.76 | 0.76 | 0.76 | 0.72 | 0.53 |
| 500 | 0.57 | 0.57 | 0.57 | 0.57 | 0.53 | 0.39 |
| 1000 | 0.38 | 0.38 | 0.38 | 0.38 | 0.35 | 0.26 |
| 3000 | 0.19 | 0.19 | 0.19 | 0.19 | 0.18 | 0.13 |
| 5000 | 0.14 | 0.14 | 0.14 | 0.14 | 0.13 | 0.09 |
| 10000 | 0.09 | 0.09 | 0.09 | 0.09 | 0.08 | 0.06 |

(b) 0.2 φ, FCA95%

| ur | 1 kHz | 10 kHz | 100 kHz | 1000 kHz | 10000 kHz | 30000 kHz |
|---|---|---|---|---|---|---|
| 5 | 8.88 | 8.88 | 8.90 | 10.80 | 4.74 | 2.12 |
| 10 | 11.58 | 11.58 | 11.58 | 11.66 | 3.98 | 1.78 |
| 30 | 9.32 | 9.32 | 9.32 | 8.52 | 2.56 | 1.16 |
| 50 | 7.62 | 7.62 | 7.62 | 6.82 | 2.02 | 0.92 |
| 100 | 5.52 | 5.52 | 5.51 | 4.84 | 1.42 | 0.66 |
| 300 | 3.06 | 3.06 | 3.05 | 2.64 | 0.78 | 0.38 |
| 500 | 2.27 | 2.27 | 2.27 | 1.95 | 0.58 | 0.29 |
| 1000 | 1.50 | 1.50 | 1.50 | 1.28 | 0.39 | 0.19 |
| 3000 | 0.76 | 0.76 | 0.76 | 0.65 | 0.20 | 0.10 |
| 5000 | 0.55 | 0.55 | 0.55 | 0.47 | 0.15 | 0.08 |
| 10000 | 0.35 | 0.35 | 0.35 | 0.30 | 0.09 | 0.05 |

(c) 0.4 φ, FCA95%

| ur | 1 kHz | 10 kHz | 100 kHz | 1000 kHz | 10000 kHz | 30000 kHz |
|---|---|---|---|---|---|---|
| 5 | 17.75 | 17.75 | 18.70 | 17.40 | 3.40 | 1.40 |
| 10 | 23.15 | 23.15 | 23.35 | 14.80 | 2.85 | 1.20 |
| 30 | 18.65 | 18.65 | 18.35 | 9.50 | 1.85 | 0.80 |
| 50 | 15.25 | 15.25 | 14.95 | 7.45 | 1.50 | 0.65 |
| 100 | 11.04 | 11.04 | 10.78 | 5.18 | 1.08 | 0.46 |
| 300 | 6.11 | 6.11 | 5.94 | 2.79 | 0.62 | 0.28 |
| 500 | 4.55 | 4.55 | 4.42 | 2.06 | 0.47 | 0.21 |
| 1000 | 3.00 | 3.00 | 2.91 | 1.36 | 0.32 | 0.15 |
| 3000 | 1.52 | 1.52 | 1.47 | 0.69 | 0.17 | 0.08 |
| 5000 | 1.10 | 1.10 | 1.06 | 0.50 | 0.13 | 0.06 |
| 10000 | 0.70 | 0.70 | 0.68 | 0.32 | 0.08 | 0.042 |

FIG. 43

(a) 0.05 φ, FCA90%

| ur | 1 kHz | 10 kHz | 100 kHz | 1000 kHz | 10000 kHz | 30000 kHz |
|---|---|---|---|---|---|---|
| 5 | 2.37 | 2.37 | 2.37 | 2.37 | 2.65 | 2.96 |
| 10 | 3.01 | 3.01 | 3.01 | 3.01 | 3.05 | 2.70 |
| 30 | 2.40 | 2.40 | 2.40 | 2.40 | 2.31 | 1.80 |
| 50 | 1.96 | 1.96 | 1.96 | 1.96 | 1.86 | 1.41 |
| 100 | 1.42 | 1.42 | 1.42 | 1.41 | 1.33 | 0.99 |
| 300 | 0.78 | 0.78 | 0.78 | 0.78 | 0.73 | 0.53 |
| 500 | 0.58 | 0.58 | 0.58 | 0.58 | 0.54 | 0.39 |
| 1000 | 0.38 | 0.38 | 0.38 | 0.38 | 0.36 | 0.26 |
| 3000 | 0.19 | 0.19 | 0.19 | 0.19 | 0.18 | 0.13 |
| 5000 | 0.14 | 0.14 | 0.14 | 0.14 | 0.13 | 0.09 |
| 10000 | 0.09 | 0.09 | 0.09 | 0.09 | 0.08 | 0.06 |

(b) 0.2 φ, FCA90%

| ur | 1 kHz | 10 kHz | 100 kHz | 1000 kHz | 10000 kHz | 30000 kHz |
|---|---|---|---|---|---|---|
| 5 | 9.48 | 9.48 | 9.50 | 11.50 | 4.82 | 2.10 |
| 10 | 12.04 | 12.04 | 12.04 | 12.06 | 3.98 | 1.74 |
| 30 | 9.60 | 9.60 | 9.58 | 8.68 | 2.54 | 1.14 |
| 50 | 7.84 | 7.84 | 7.82 | 6.94 | 2.00 | 0.90 |
| 100 | 5.66 | 5.66 | 5.65 | 4.91 | 1.40 | 0.64 |
| 300 | 3.13 | 3.13 | 3.13 | 2.67 | 0.77 | 0.36 |
| 500 | 2.33 | 2.33 | 2.32 | 1.97 | 0.57 | 0.28 |
| 1000 | 1.54 | 1.54 | 1.53 | 1.30 | 0.38 | 0.19 |
| 3000 | 0.78 | 0.78 | 0.77 | 0.65 | 0.20 | 0.10 |
| 5000 | 0.56 | 0.56 | 0.56 | 0.47 | 0.14 | 0.07 |
| 10000 | 0.36 | 0.36 | 0.36 | 0.30 | 0.09 | 0.05 |

(c) 0.4 φ, FCA90%

| ur | 1 kHz | 10 kHz | 100 kHz | 1000 kHz | 10000 kHz | 30000 kHz |
|---|---|---|---|---|---|---|
| 5 | 18.95 | 18.95 | 20.00 | 17.75 | 3.35 | 1.25 |
| 10 | 24.05 | 24.05 | 24.25 | 14.95 | 2.75 | 1.10 |
| 30 | 19.20 | 19.20 | 18.90 | 9.50 | 1.80 | 0.75 |
| 50 | 15.70 | 15.65 | 15.35 | 7.40 | 1.45 | 0.60 |
| 100 | 11.32 | 11.32 | 11.02 | 5.14 | 1.04 | 0.44 |
| 300 | 6.26 | 6.26 | 6.07 | 2.77 | 0.59 | 0.26 |
| 500 | 4.66 | 4.66 | 4.51 | 2.04 | 0.45 | 0.20 |
| 1000 | 3.07 | 3.07 | 2.97 | 1.34 | 0.31 | 0.14 |
| 3000 | 1.55 | 1.55 | 1.50 | 0.68 | 0.16 | 0.08 |
| 5000 | 1.12 | 1.12 | 1.08 | 0.49 | 0.12 | 0.06 |
| 10000 | 0.72 | 0.72 | 0.69 | 0.32 | 0.08 | 0.04 |

FIG. 44

(a) 0.05 φ, FCA85%

| ur | 1 kHz | 10 kHz | 100 kHz | 1000 kHz | 10000 kHz | 30000 kHz |
|---|---|---|---|---|---|---|
| 5 | 2.50 | 2.50 | 2.50 | 2.51 | 2.80 | 3.05 |
| 10 | 3.11 | 3.11 | 3.11 | 3.11 | 3.15 | 2.74 |
| 30 | 2.46 | 2.46 | 2.46 | 2.46 | 2.35 | 1.81 |
| 50 | 2.01 | 2.01 | 2.01 | 2.01 | 1.90 | 1.42 |
| 100 | 1.45 | 1.45 | 1.45 | 1.45 | 1.35 | 0.99 |
| 300 | 0.80 | 0.80 | 0.80 | 0.80 | 0.74 | 0.53 |
| 500 | 0.59 | 0.59 | 0.59 | 0.59 | 0.55 | 0.39 |
| 1000 | 0.39 | 0.39 | 0.39 | 0.39 | 0.36 | 0.26 |
| 3000 | 0.20 | 0.20 | 0.20 | 0.20 | 0.18 | 0.13 |
| 5000 | 0.14 | 0.14 | 0.14 | 0.14 | 0.13 | 0.09 |
| 10000 | 0.09 | 0.09 | 0.09 | 0.09 | 0.08 | 0.06 |

(b) 0.2 φ, FCA85%

| ur | 1 kHz | 10 kHz | 100 kHz | 1000 kHz | 10000 kHz | 30000 kHz |
|---|---|---|---|---|---|---|
| 5 | 10.02 | 10.02 | 10.04 | 12.12 | 4.78 | 2.02 |
| 10 | 12.44 | 12.44 | 12.46 | 12.42 | 3.92 | 1.68 |
| 30 | 9.84 | 9.84 | 9.82 | 8.82 | 2.50 | 1.10 |
| 50 | 8.02 | 8.02 | 8.02 | 7.02 | 1.96 | 0.86 |
| 100 | 5.79 | 5.79 | 5.78 | 4.96 | 1.37 | 0.62 |
| 300 | 3.20 | 3.20 | 3.19 | 2.69 | 0.75 | 0.35 |
| 500 | 2.38 | 2.38 | 2.37 | 1.99 | 0.56 | 0.27 |
| 1000 | 1.57 | 1.57 | 1.56 | 1.30 | 0.37 | 0.18 |
| 3000 | 0.79 | 0.79 | 0.79 | 0.66 | 0.19 | 0.10 |
| 5000 | 0.57 | 0.57 | 0.57 | 0.47 | 0.14 | 0.07 |
| 10000 | 0.37 | 0.37 | 0.37 | 0.30 | 0.09 | 0.05 |

(c) 0.4 φ, FCA85%

| ur | 1 kHz | 10 kHz | 100 kHz | 1000 kHz | 10000 kHz | 30000 kHz |
|---|---|---|---|---|---|---|
| 5 | 20.00 | 20.05 | 21.15 | 17.95 | 3.15 | 1.15 |
| 10 | 24.90 | 24.90 | 25.10 | 14.90 | 2.65 | 1.00 |
| 30 | 19.70 | 19.70 | 19.35 | 9.45 | 1.75 | 0.70 |
| 50 | 16.05 | 16.05 | 15.70 | 7.35 | 1.40 | 0.60 |
| 100 | 11.58 | 11.58 | 11.24 | 5.10 | 1.00 | 0.42 |
| 300 | 6.40 | 6.40 | 6.18 | 2.74 | 0.57 | 0.25 |
| 500 | 4.76 | 4.75 | 4.59 | 2.02 | 0.44 | 0.20 |
| 1000 | 3.14 | 3.14 | 3.02 | 1.33 | 0.30 | 0.14 |
| 3000 | 1.58 | 1.58 | 1.52 | 0.67 | 0.16 | 0.08 |
| 5000 | 1.15 | 1.14 | 1.10 | 0.49 | 0.12 | 0.06 |
| 10000 | 0.73 | 0.73 | 0.71 | 0.31 | 0.08 | 0.039 |

(a)

(b)

| STRAND DIA METER(mm) | 0.4 |
|---|---|
| NUMBER OF STRAND | 55 |
| NUMBER OF TURNS | 17 |
| LENGTH(m) | 6.6 |

| STRUCTURE | | PRESENT INVENTION (DIES) | COMPARATIVE EXAMPLE (ANNEAL) |
|---|---|---|---|
| | COPPER | WORKED STRUCTURE | RECRYSTALLIZED STRUCTURE |
| | ALUMINUM | FIBER-LIKE STRUCTURE IN LONGITUDINAL DIRECTION | LARGE CRYSTAL GRAIN SIZE |
| SPECIFIC RESISTANCE ($\mu\Omega$cm) | COPPER | 1.770 | 1.724 |
| | ALUMINUM | 2.826 | 2.826 |
| CONDUCTIVITY (%IACS) | COPPER | 97 | 100 |
| | ALUMINUM | 61 | 61 |
| VICKERS HARDNESS (Hv) | COPPER | 120 | 60 |
| | ALUMINUM | 45 | 25 |

(b)

(a)

(b)

(a)

ELECTRIC WIRE AND COIL

CROSS-REFERENCE TO RELATED APPLICATIONS

The application is a Continuation of PCT Application No. PCT/JP2012/073870, filed on Sep. 19, 2012, and claims the benefit of priority from the prior Japanese Patent Applications No. 2011-207336, filed on Sep. 22, 2011, the entire contents of which are incorporated herein by reference.

BACKGROUND OF THE INVENTION

The present invention relates to an electric wire and a coil, and more particularly, the present invention relates to an electric wire and a coil used for a winding wire, a litz wire, a cable, and the like in various types of high frequency devices.

In winding wires and power cables of devices to which high frequency current is applied (such as transformers, motors, reactors, induction heaters, and magnetic head devices), a magnetic field generated by the high frequency current causes an eddy current loss within a conductor. As a result, AC resistance increases (a skin effect and a proximity effect increase). This causes heat generation and increases power consumption. General countermeasures to prevent the increase of the skin effect and the proximity effect include a reduction in diameter of wires and an employment of litz wires in which strands are individually subjected to insulation covering (refer to, for example, Patent Literature 1 (Japanese Patent Application Laid-open Publication No. 2009-129550), Patent Literature 2 (Japanese Patent Application Laid-open Publication No. 62-076216), Patent Literature 3 (Japanese Patent Application Laid-open Publication No. 2005-108654), Patent Literature 4 (International Publication No. 2006/046358) and Patent Literature 5 (Japanese Patent Application Laid-open Publication No. 2002-150633)).

However, in the prior art described in Patent Literatures 1 to 5, there is a limit of the reduction in diameter of the wires because of difficulty of the process of removing insulation films of the wires during a solder treatment for wire connection and because of an increase in the number of strands. In addition, effective measures to prevent the AC resistance have not been found in wires with diameters in which the proximity effect is overwhelmingly dominant compared with the skin effect, and the fact that characteristics obtained by the reduction in diameter are limited is a matter of common knowledge. Although Patent Literatures 1 to 5 describe examples of the measures against the AC resistance, these examples are not effective measures because these are conceptional and lack concreteness.

Patent Literature 6 (Japanese Utility Model Application Laid-open Publication No. 50-066171) describes a structure in which the periphery of an aluminum (Al) conductor is covered with a copper layer, and a nickel layer is formed thereon. However, the structure is not used in order to decrease AC resistance because the nickel layer is merely formed for ease of soldering.

Patent Literature 7 (Japanese Patent Application Laid-open Publication No. 2010-157363) and Non-Patent Literature 1 (Tsutomu Mizuno and seven others; "Reduction in Eddy Current Loss in Conductor Using Magnetoplated Wire", The Journal of the Institute of Electrical Engineers of Japan A, 2007, Vol. 127, No. 10, p. 611 to 620) and Non-Patent Literature 2 (Tsutomu Mizuno and seven others; "Reduction of Eddy Current Loss in Magnetoplated Wire", The International Journal for Computation and Mathematics in Electrical and Electronic Engineering, 2009, Vol. 28, No. 1, p. 57 to 66) each teach that the periphery of a copper (Cu) wire is plated with a soft magnetic material layer (a magnetic thin film) in order to decrease AC resistance. However, the soft magnetic material layer (the magnetic thin film) cannot completely prevent an external magnetic field from entering therethrough. As a result, a loss due to the proximity effect increases because the unavoidable external magnetic field causes eddy currents.

SUMMARY

In the light of the aforementioned problem, an object of the present invention is to provide an electric wire and a coil capable of preventing an external magnetic field from entering therethrough, reducing eddy currents caused by the entrance of the external magnetic field not completely prevented, and suppressing a loss due to a proximity effect.

An aspect of the present invention provides an electric wire including: a central conductor made of aluminum or an aluminum alloy; a cover layer made of copper and covering the central conductor; and a ferromagnetic layer covering the cover layer and blocking an external magnetic field, wherein a thickness of the ferromagnetic layer is in a range from 0.04 μm to 14 μm, a total diameter of the central conductor and the cover layer is in a range from 0.05 mm to 0.4 mm, and a cross-sectional area of the central conductor is in a range from 85% to 95% of a total cross-sectional area of the central conductor and the cover layer.

According to the aspect of the present invention, elative magnetic permeability of the ferromagnetic layer may be in a range from 5 to 10000.

According to the aspect of the present invention, the electric wire may further include an intermetallic compound layer formed between the central conductor and the cover layer and having larger volume resistivity than the cover layer, wherein the cover layer has a fiber-like texture in a longitudinal direction, and a cross-sectional area of the cover layer is 15% or less of an entire cross-sectional area including the central conductor, the intermetallic compound layer and the cover layer.

According to the aspect of the present invention, the electric wire may further include an intermetallic compound layer formed between the central conductor and the cover layer and having larger volume resistivity than the cover layer, wherein the intermetallic compound layer is formed in a manner such that the central conductor covered with the cover layer is subjected to wire drawing by use of dies with plural steps each having a cross-section reduction rate of 20% or higher.

Another aspect of the present invention provides a coil including an electric wire subjected to insulation covering, the electric wire including: a central conductor made of aluminum or an aluminum alloy; a cover layer made of copper and covering the central conductor; and a ferromagnetic layer covering the cover layer and blocking an external magnetic field, wherein a thickness of the ferromagnetic layer is in a range from 0.04 μm to 14 μm, a total diameter of the central conductor and the cover layer is in a range from 0.05 mm to 0.4 mm, and a cross-sectional area of the central conductor is in a range from 85% to 95% of a total cross-sectional area of the central conductor and the cover layer.

The present invention can provide an electric wire and a coil capable of preventing an external magnetic field from entering therethrough, reducing eddy currents caused by the entrance of the external magnetic field not completely prevented, and suppressing a loss due to a proximity effect.

BRIEF DESCRIPTION OF DRAWINGS

FIG. 10(a) is a graph showing the influence of the thickness of the ferromagnetic layer in each conductive wire having a diameter of 0.05 mm (theoretical values of loss due to a proximity effect). FIG. 10(b) is a table showing the thickness of the ferromagnetic layer by which the loss due to the proximity effect is minimized in each conductive wire having a diameter of 0.05 mm.

FIG. 12(a) to FIG. 12(d) are tables each showing the thickness of the ferromagnetic layer by which the loss due to the proximity effect is minimized in each of conductive wires having a diameter of 0.05 mm and different constitutions (No. 1).

FIG. 13(a) to FIG. 13(d) are tables each showing the thickness of the ferromagnetic layer by which the loss due to the proximity effect is minimized in each of conductive wires having a diameter of 0.05 mm and different constitutions (No. 2).

FIG. 23(a) to FIG. 23(d) are tables each showing the thickness of the ferromagnetic layer by which the loss due to the proximity effect is minimized in each of conductive wires having a diameter of 0.2 mm and different constitutions (No. 1).

FIG. 24(a) to FIG. 24(d) are tables each showing the thickness of the ferromagnetic layer by which the loss due to the proximity effect is minimized in each of conductive wires having a diameter of 0.2 mm and different constitutions (No. 2).

FIG. 34(a) to FIG. 34(d) are tables each showing the thickness of the ferromagnetic layer by which the loss due to the proximity effect is minimized in each of conductive wires having a diameter of 0.4 mm and different constitutions (No. 1).

FIG. 35(a) to FIG. 35(d) are tables each showing the thickness of the ferromagnetic layer by which the proximity effect is minimized in each of conductive wires having a diameter of 0.4 mm and different constitutions (No. 2).

FIG. 42(a) is a table showing the thickness of the ferromagnetic layer by which the loss due to the proximity effect is minimized in each 95%-FCA wire having a diameter of 0.05 mm. FIG. 42(b) is a table showing the thickness of the ferromagnetic layer by which the loss due to the proximity effect is minimized in each 95%-FCA wire having a diameter of 0.2 mm. FIG. 42(c) is a table showing the thickness of the ferromagnetic layer by which the loss due to the proximity effect is minimized in each 95%-FCA wire having a diameter of 0.4 mm.

FIG. 43(a) is a table showing the thickness of the ferromagnetic layer by which the loss due to the proximity effect is minimized in each 90%-FCA wire having a diameter of 0.05 mm. FIG. 43(b) is a table showing the thickness of the ferromagnetic layer by which the loss due to the proximity effect is minimized in each 90%-FCA wire having a diameter of 0.2 mm. FIG. 43(c) is a table showing the thickness of the ferromagnetic layer by which the loss due to the proximity effect is minimized in each 90%-FCA wire having a diameter of 0.4 mm.

FIG. 44(a) is a table showing the thickness of the ferromagnetic layer by which the loss due to the proximity effect is minimized in each 85%-FCA wire having a diameter of 0.05 mm. FIG. 44(*b*) is a table showing the thickness of the ferromagnetic layer by which the loss due to the proximity effect is minimized in each 85%-FCA wire having a diameter of 0.2 mm. FIG. 44(*c*) is a table showing the thickness of the ferromagnetic layer by which the loss due to the proximity effect is minimized in each 85%-FCA wire having a diameter of 0.4 mm.

FIG. 45(*b*) is a side view showing the winding wire according to the first example of the first embodiment of the present invention.

FIG. 58(*b*) is an optical micrograph showing a cross section of a processed texture of a Cu wire manufactured by a dip forming process.

FIG. 59(*b*) is an optical micrograph showing a cross section of a recrystallization texture of a Cu wire manufactured by a dip forming process.

DETAILED DESCRIPTION OF THE EMBODIMENT OF THE INVENTION

Figure 1:
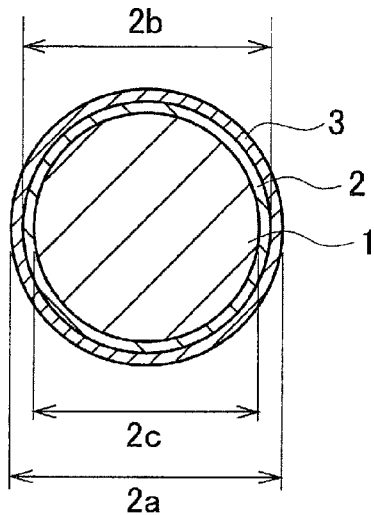
FIG. 1 is a cross-sectional view showing an example of an electric wire according to a first embodiment of the present invention.

Hereinafter, embodiments according to the present invention will be explained with reference to the drawings. In the following description of the drawings, the same or similar portions are indicated by the same or similar reference numerals. However, it should be noted that the drawings are schematic and that a relationship between thicknesses and planar dimensions, thickness ratios of layers, and the like are different from actual ratios. Therefore, specific thicknesses and dimensions should be determined with reference to the following description. In addition, there are of course some different dimensional relations and proportions between the drawings.

The following embodiments exemplify devices and methods to embody the technical ideas of the present invention. The technical ideas of the present invention do not limit the materials, shapes, structures, arrangements, and the like of the constituent components to those described below. The technical ideas of the present invention may be variously modified within the scope of claims.

First Embodiment

An electric wire according to a first embodiment of the present invention is a ferromagnetic-plated copper-covered Al wire (hereinafter, referred to as "FCA") including, as shown in FIG. 1, a central conductor 1 made of aluminum (Al) or an aluminum alloy, a cover layer 2 made of copper (Cu) and covering the central conductor 1, and a ferromagnetic layer (a magnetoplated layer) 3 covering the cover layer 2 and blocking an external magnetic field.

The cross-sectional area of the cover layer 2 is smaller than or equal to 15%, preferably approximately in the range from 3% to 15%, more preferably approximately in the range from 3% to 10%, still more preferably approximately in the range from 3% to 5%, of the total cross-sectional area of the central conductor 1 and the cover layer 2. As the ratio of the cross-sectional area of the cover layer 2 is smaller, the AC resistance decreases. The entire diameter of the electric wire is preferably approximately in the range from 0.05 mm to 0.6 mm, more preferably approximately in the range from 0.05 mm to 0.4 mm.

The central conductor 1 may be made of, for example, electrical aluminum (EC aluminum) or an aluminum alloy such as an Al—Mg—Si alloy (JIS6000s). The aluminum alloy is more preferable than the EC aluminum because the volume resistivity of the aluminum alloy is higher than that of the EC aluminum.

The material of the ferromagnetic layer 3 may be nickel (Ni), a Ni—Fe alloy, an iron alloy (such as electromagnetic soft iron and silicon steel), Permalloy (such as 78 Permalloy and Mumetal), a ferrite compound (such as Mn—Zr ferrite) or an amorphous ferromagnetic body. The ferromagnetic layer 3 preferably includes a material suitable for electroplating. The ferromagnetic layer 3 has relative magnetic permeability, for example, approximately in the range from 100 to 1000. The relative magnetic permeability of the ferromagnetic layer 3 may be approximately in the range from 1000 to 10000, may be approximately in the range from 5 to 10000, or may be 10000 or greater. The thickness of the ferromagnetic layer 3(a-b) may be approximately in the range from 0.5 µm to 10 µm, may be approximately in the range from 0.04 µm to 14 µm, or may be approximately in the range from 0.01 µm to 15 µm.

Figure 2:
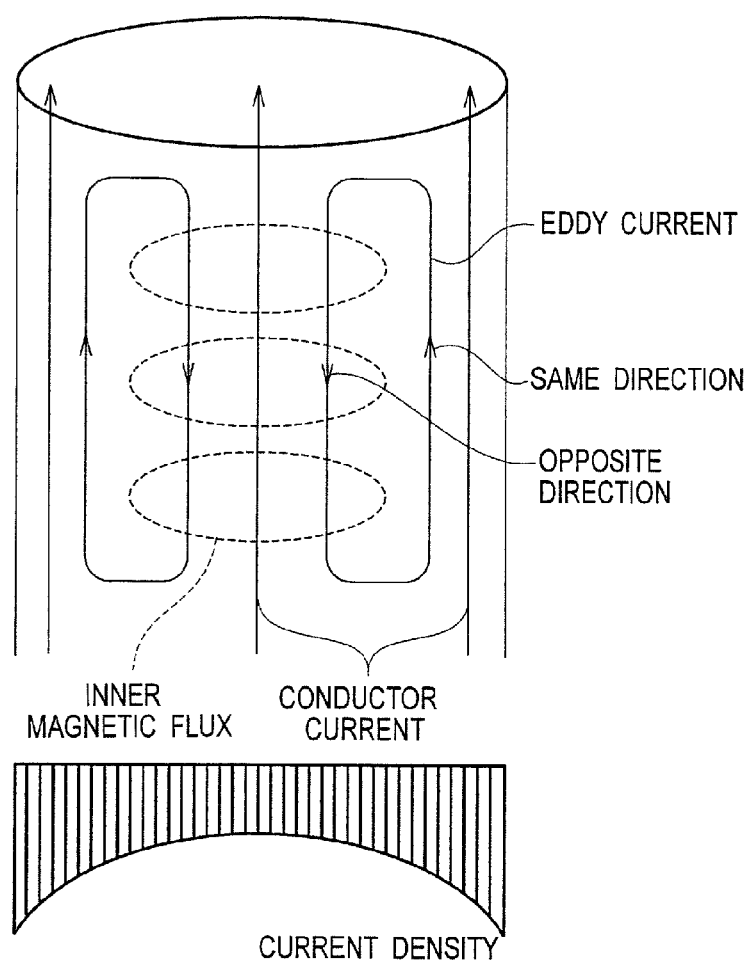
FIG. 2 is a schematic view for explaining a skin effect according to the first embodiment of the present invention.
Figure 3:
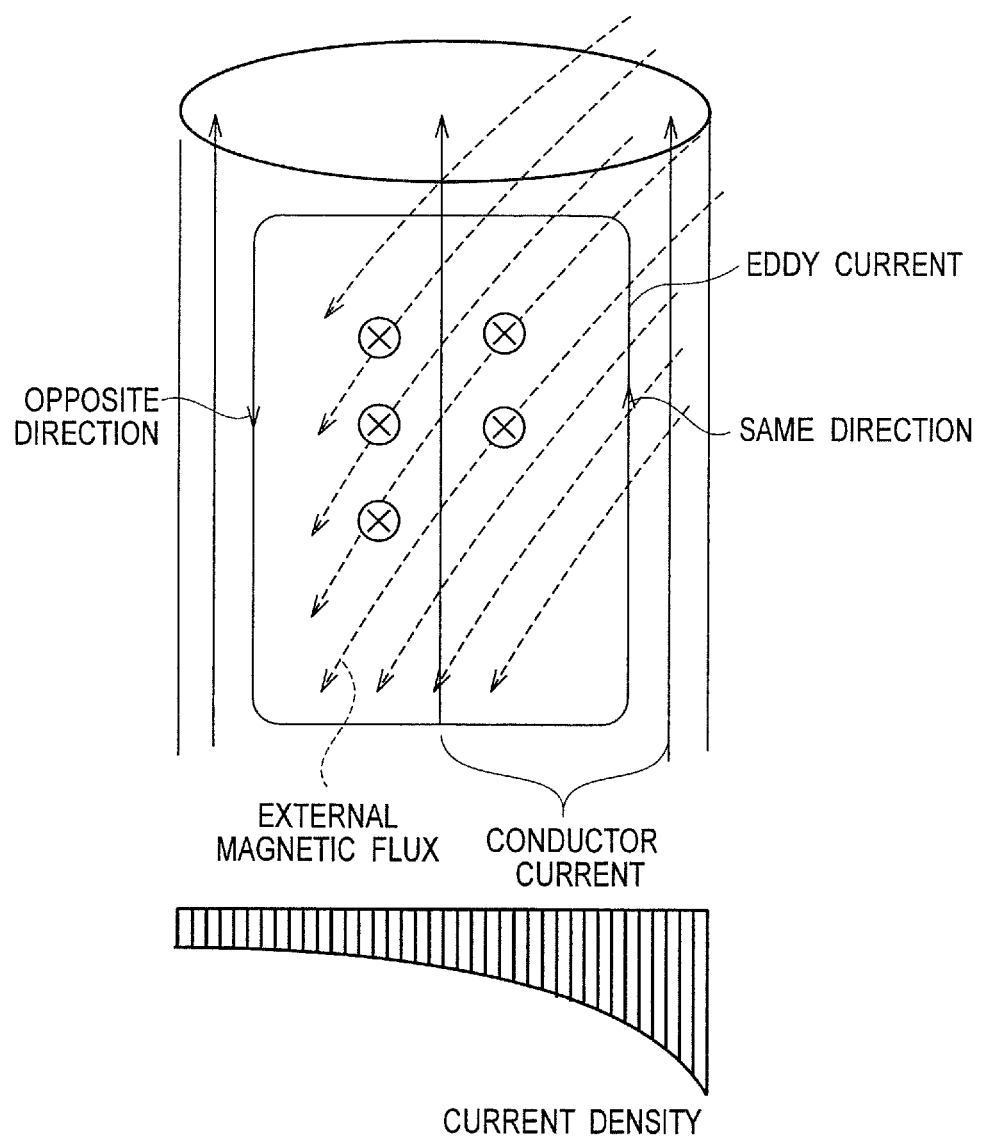
FIG. 3 is a schematic view for explaining a proximity effect according to the first embodiment of the present invention.
Figure 4:
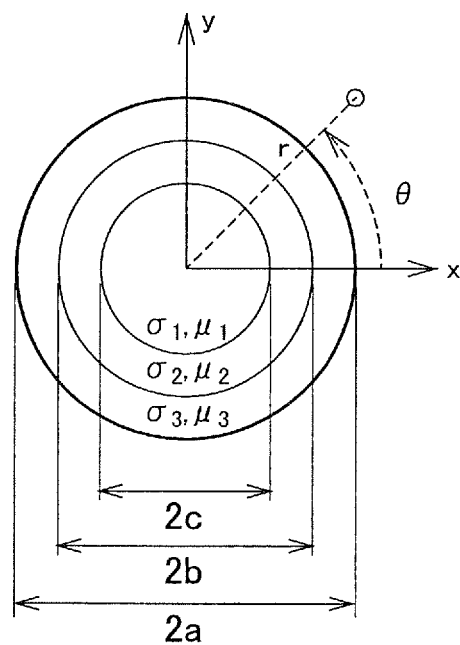
FIG. 4 is a cross-sectional view of a conductive wire having a triple-layer structure.

As shown in FIG. 2, in the electric wire (the conductor), eddy currents are generated within the conductor because of internal magnetic fluxes. The generated eddy currents increase the AC resistance as a skin effect. Moreover, as shown in FIG. 3, eddy currents are generated within the conductor because of external magnetic fluxes, and the generated eddy currents increase the AC resistance as a proximity effect.

AC resistance $R_{ac}$ is expressed by the following formula (1), where $R_{dc}$ is a DC resistance component, $R_s$ is AC resistance due to a skin effect, and $R_p$ is AC resistance (a proximity effect component) due to a proximity effect.

$$R_{ac} = (1 + k_s)R_{dc} + R_p \qquad (1)$$
$$= R_s + R_p$$

Herein, $k_s$ represents a skin effect coefficient.

Figure 5:
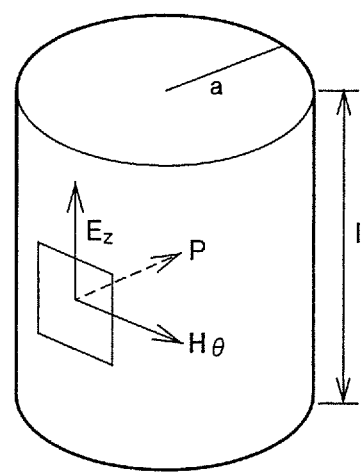
FIG. 5 is a schematic view showing an electromagnetic field on the surface of the conductive wire through which electric current flows.

First, an example of the method of calculating the AC resistance $R_s$ due to the skin effect in the first embodiment of the present invention is explained below. As shown in FIG. 5, consideration is given to a cylindrical conductive wire having a triple-layer structure uniformly distributed in the direction z. It is assumed that the conductivities and relative magnetic permeability of the inner, intermediate and outer layers of the conductive wire are $\sigma_1$, $\sigma_2$ and $\sigma_3$, and $\mu_1$, $\mu_2$ and $\mu_3$, respectively, and that a current flows through the conductive wire in the direction z.

In the following formulation, each electromagnetic field uses a complex representation, and the time factor is indicated by $e^{j\omega t}$. Herein, $\omega$ represents an angular frequency.

The flowing current generates a z-direction component Ez of an electric field, which satisfies the following wave equation (2).

[Math 1]

$$\frac{\partial^2 E_z}{\partial r^2} + \frac{1}{r}\frac{\partial E_z}{\partial r} - j\omega\mu_0\mu\sigma E_z = 0 \qquad (2)$$

Herein, $\mu_0$ represents relative magnetic permeability in vacuum. A magnetic field $H_\theta$ has only a θ-direction component and is given as follows.

[Math 2]

$$H_\theta = \frac{1}{j\omega\mu_0\mu}\frac{\partial E_z}{\partial r} \qquad (3)$$

Here, when

[Math 3]

$$k_1^2 = j\omega\mu_0\mu_1\sigma_1 \qquad (4)$$

$$k_2^2 = j\omega\mu_0\mu_2\sigma_2 \qquad (5)$$

$$k_3^2 = j\omega\mu_0\mu_3\sigma_3 \qquad (6)$$

then, the solution of the wave equation (2) can be as follows.

[Math 4]

$$E_{z1} = AJ_0(k_1 r), \; (r<c) \qquad (7)$$

$$E_{z2} = BJ_0(k_2 r) + CM_0(k_2 r), \; (c \le r \le b) \qquad (8)$$

$$E_{z3} = EJ_0(k_3 r) + FM_0(k_3 r), \; (b \le r \le a) \qquad (9)$$

Herein, $J_\nu(z)$ represents a Bessel function of the first kind, $$M_\nu(z) \equiv \frac{1}{2}\pi j H_\nu^{(1)}(z)$$

where $H_\nu^{(1)}$ represents a Hankel function of the first kind.

Under the boundary condition where $E_z$ and $H_\theta$ are continuous at r=b,

[Math 5]

$$B = B_1 A \qquad (10)$$

$$C = C_1 A \qquad (11)$$

$$E = E_1 A \qquad (12)$$

$$F = F_1 A \qquad (13)$$

Herein,

[Math 6]

$$B_1 = \frac{J_0(k_1 c)M_0'(k_2 c) - \frac{k_1\mu_2}{k_2\mu_1}J_0'(k_1 c)M_0(k_2 c)}{J_0(k_2 c)M_0'(k_2 c) - J_0'(k_2 c)M_0(k_2 c)} \qquad (14)$$

$$C_1 = \frac{\frac{k_1\mu_2}{k_2\mu_1}J_0'(k_1 c)J_0(k_2 c) - J_0(k_1 c)J_0'(k_2 c)}{J_0(k_2 c)M_0'(k_2 c) - J_0'(k_2 c)M_0(k_2 c)} \qquad (15)$$

$$E_1 = \frac{[B_1 J_0(k_2 b) + C_1 M_0(k_2 b)]M_0'(k_3 b) - \frac{k_2\mu_3}{k_3\mu_2}[B_1 J_0'(k_2 b) + C_1 M_0'(k_2 b)]M_0(k_3 b)}{J_0(k_3 b)M_0'(k_3 b) - J_0'(k_3 b)M_0(k_3 b)} \qquad (16)$$

$$F_1 = \frac{\frac{k_2\mu_3}{k_3\mu_2}[B_1 J_0'(k_2 b) + C_1 M_0'(k_2 b)]J_0(k_3 b) - [B_1 J_0(k_2 b) + C_1 M_0(k_2 b)]J_0'(k_3 b)}{J_0(k_3 b)M_0'(k_3 b) - J_0'(k_3 b)M_0(k_3 b)} \qquad (17)$$

Herein, $$J_0'(x) = dJ_0(x)/dx$$

and $$M_0'(x) = dM_0(x)/dx$$

From the formula (3), the following formula (18) is obtained.

[Math 7]

$$H_\theta = \frac{k_3}{j\omega\mu_0\mu_3}[EJ_0'(k_3 r) + FM_0'(k_3 r)], (b \le r \le a) \quad (18)$$

Total current I flowing through the conductive wire is obtained according to the Ampère's rule as follows.

[Math 8]

$$I = \oint H_\theta|_{r=a} dl = 2\pi a H_\theta|_{r=a} \quad (19)$$

$$= \frac{2\pi k_3 a}{j\omega\mu_0\mu_3}[EJ_0'(k_3 a) + FM_0'(k_3 a)]$$

Herein, $\oint$ represents a line integral along the outer circumference of the conductive wire in the transverse section. By substituting the formulas (12) and (13) into the formula (19), the following formula (20) is obtained.

[Math 9]

$$A = \frac{j\omega\mu_0\mu_3}{2\pi k_3 a} \cdot \frac{1}{E_1 J_0'(k_3 a) + F_1 M_0'(k_3 a)} \quad (20)$$

Figure 6:
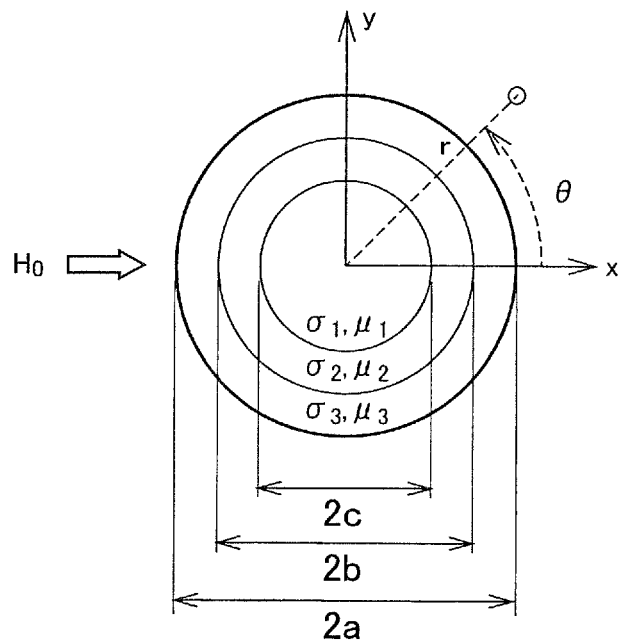
FIG. 6 is a cross-sectional view of the conductive wire having the triple-layer structure when an external magnetic field is applied thereto.

The power flow into the conductive wire shown in FIG. 6 is calculated from the Poynting vector according to the following formula (21).

[Math 10]

$$\overline{P_s} = -\oint P \cdot dS \quad (21)$$

$$= -\frac{1}{2}\oint E \times H^* \cdot dS$$

$$= -\frac{1}{2}\oint (-a_r)(E_z H_\theta^*)\Big|_{r=a} \cdot a_r dS$$

$$= \pi a \cdot l \cdot (E_z H_\theta^*)|_{r=a}$$

Herein, $\oint$ represents a surface integral over the cylindrical surface of the conductive wire in FIG. 6. dS represents a surface element vector in the normal direction. P is the Poynting vector, and $a_r$ is a unit vector in the direction r.

By substituting the formulas (9) and (18) into the formula (21), the following formula (22) is obtained.

[Math 11]

$$\overline{P_s} = \frac{j\omega\mu_0\mu_3 l|I|^2}{4\pi k_3 a} \cdot \frac{E_1 J_0(k_3 a) + F_1 M_0(k_3 a)}{E_1 J_0'(k_3 a) + F_1 M_0'(k_3 a)} \quad (22)$$

Herein, $$\overline{P_s} = \frac{1}{2}(R + j\omega L)|I|^2$$

Accordingly, the following formula (23) is obtained.

[Math 12]

$$R + j\omega L = \frac{j\omega\mu_0\mu_3 l}{2\pi k_3 a} \cdot \frac{E_1 J_0(k_3 a) + F_1 M_0(k_3 a)}{E_1 J_0'(k_3 a) + F_1 M_0'(k_3 a)} \quad (23)$$

The AC resistance per unit length due to the skin effect is therefore given as follows.

[Math 13]

$$R_s = \Re\left[\frac{j\omega\mu_0\mu_3}{2\pi k_3 a} \cdot \frac{E_1 J_0(k_3 a) + F_1 M_0(k_3 a)}{E_1 J_0'(k_3 a) + F_1 M_0'(k_3 a)}\right] \quad (24)$$

Herein, $\Re$ represents a real part, and a value when the frequency is 0 is DC resistance $R_{dc}$.

When the conductive wire has a double-layer structure, from $\sigma_1 = \sigma_2$, $\mu_1 = \mu_2$ and the formulas (14) and (15),

[Math 14]

$$B_1 = 1 \quad (25)$$

$$C_1 = 0 \quad (26)$$

and when the conductive wire has a single-layer structure, from $\sigma_1 = \sigma_2 = \sigma_3$, $\mu_1 = \mu_2 = \mu_3$ and the formulas (16) and (17),

[Math 15]

$$E_1 = 1 \quad (27)$$

$$F_1 = 0 \quad (28)$$

When a magnetic loss is caused in the respective layers because of magnetic hysteresis, the loss can be represented by introducing an imaginary part into magnetic permeability. For example,

[Math 16]

$$\mu_1 = \mu_{r1} + j\mu_{i1} \quad (29)$$

Figure 7:
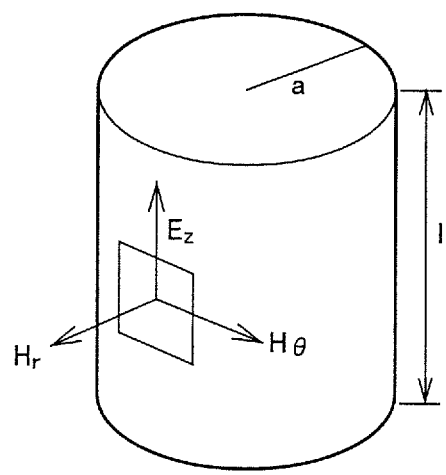
FIG. 7 is a schematic view showing an electromagnetic field on the surface of the conductive wire when the external magnetic field is applied thereto.

Next, an example of the method of calculating the proximity effect component $R_p$ according to the first embodiment of the present invention is explained. As shown in FIG. 7, a high frequency magnetic field $H_e$ in the direction x is conceived to be applied to the outside of the conductive wire as follows. Herein, $a_x$ is a unit vector in the direction x.

[Math 17]

$$H_e = a_x H_0 \quad (30)$$

Here, when the magnetic potential satisfying $H = \nabla \times A$ is introduced,

[Math 18]

$$A = a_z A_z(r, \theta) \quad (31)$$

then, the following external potential

[Math 19]

$$A_{ze} = H_0 r \sin\theta \quad (32)$$

gives a magnetic field expressed by the formula (30).

The magnetic potential satisfies the following wave equation (33).

[Math 20]

$$\frac{\partial^2 A_z}{\partial r^2} + \frac{1}{r}\frac{\partial A_z}{\partial r} + \frac{1}{r^2}\frac{\partial^2 A_z}{\partial \theta^2} - j\omega\mu_0\mu\sigma A_z = 0 \quad (33)$$

Herein, $\mu_0$ represents magnetic permeability in vacuum.

The solution of the equation (33) can be provided as follows.

[Math 21]

$$A_{z1} = GJ_1(k_1 r)\sin\theta, \ (r < c) \quad (34)$$

$$A_{z2} = [PJ_1(k_2 r) + QM_1(k_2 r)]\sin\theta, \ (c \le r \le b) \quad (35)$$

$$A_{z3} = (RJ_1(k_3 r) + SM_1(k_3 r))\sin\theta, \ (b \le r \le a) \quad (36)$$

$$A_{z4} = \left(Ur + \frac{V}{r}\right)\sin\theta, \ (a < r) \quad (37)$$

Under the boundary condition where the tangent component ($H_\theta$) of the magnetic field and the normal component ($\mu_0 H r$) of the magnetic flux density are continuous at each boundary,

[Math 22]

$$G = \frac{2aH_0}{(\mu_3 - 1)[R_1 J_1(k_3 a) + S_1 M_1(k_3 a)] + k_3 a[R_1 J_0(k_3 a) + S_1 M_0(k_3 a)]} \quad (38)$$

$$P = P_1 G \quad (39)$$

$$Q = Q_1 G \quad (40)$$

$$R = R_1 G \quad (41)$$

$$S = S_1 G \quad (42)$$

$$U = H_0 \quad (43)$$

$$V = a^2 H_0 \frac{(\mu_3 - 1)[R_1 J_1(k_3 a) + S_1 M_1(k_3 a)] + k_3 a[R_1 J_2(k_3 a) + S_1 M_2(k_3 a)]}{(\mu_3 - 1)[R_1 J_1(k_3 a) + S_1 M_1(k_3 a)] + k_3 a[R_1 J_0(k_3 a) + S_1 M_0(k_3 a)]} \quad (44)$$

Herein,

[Math 23]

$$P_1 = \frac{\frac{\mu_1}{\mu_2} J_1(k_1 c) M_1'(k_2 c) - \frac{k_1}{k_2} J_1'(k_1 c) M_1(k_2 c)}{J_1(k_2 c) M_1'(k_2 c) - J_1'(k_2 c) M_1(k_2 c)} \quad (45)$$

$$Q_1 = \frac{\frac{k_1}{k_2} J_1'(k_1 c) J_1(k_2 c) - \frac{\mu_1}{\mu_2} J_1(k_1 c) J_1'(k_2 c)}{J_1(k_2 c) M_1'(k_2 c) - J_1'(k_2 c) M_1(k_2 c)} \quad (46)$$

$$R_1 = \frac{\frac{\mu_2}{\mu_3}[P_1 J_1(k_2 b) + Q_1 M_1(k_2 b)]M_1'(k_3 b) - \frac{k_2}{k_3}[P_1 J_1'(k_2 b) + Q_1 M_1'(k_2 b)]M_1(k_3 b)}{J_1(k_3 b)M_1'(k_3 b) - J_1'(k_3 b)M_1(k_3 b)} \quad (47)$$

$$S_1 = \frac{\frac{k_2}{k_3}[P_1 J_1'(k_2 b) + Q_1 M_1'(k_2 b)]J_1(k_3 b) - \frac{\mu_2}{\mu_3}[P_1 J_1(k_2 b) + Q_1 M_1(k_2 b)]J_1'(k_3 b)}{J_1(k_3 b)M_1'(k_3 b) - J_1'(k_3 b)M_1(k_3 b)} \quad (48)$$

Herein, $$J_1'(x) = dJ_1(x)/dx$$

and $$M_1'(x) = dM_1(x)/dx$$

The magnetic field $H_\theta$ is obtained as follows.

[Math 24]

$$H_\theta = -k_3[RJ_1'(k_3 r) + SM_1'(k_3 r)]\sin\theta, \ (b \le r \le a) \quad (49)$$

The electric field $E_z$ is obtained as follows.

[Math 25]

$$E_z = \frac{k_3^2}{\sigma_3}[RJ_1(k_3 r) + SM_1(k_3 r)]\sin\theta, \ (b \le r \le a) \quad (50)$$

The power flow penetrating from the surface of the conductive wire to the inside thereof, which is shown in FIG. 7, is calculated according to the following formula (51).

[Math 26]

$$\bar{P}_P = -\oint P \cdot dS = \frac{1}{2}al\int_0^{2\pi} E_z H_\theta^* \bigg|_{r=a} d\theta \quad (51)$$

Herein, P represents the Poynting vector, and $\oint$ represents a surface integral over the surface of the conductive wire in FIG. 7.

By substituting the formulas (49) and (50) into the formula (51), the following formula (52) is obtained.

[Math 27]

$$\bar{P}_P = -\frac{2\pi l k_3 a |k_3 a|^2}{\sigma_3} \frac{XY^*}{|Z|^2}|H_0|^2 \quad (52)$$

Herein,

[Math 28]

$$X = R_1 J_1(k_3 a) + S_1 M_1(k_3 a) \quad (53)$$

$$Y = R_1 J_1'(k_3 a) + S_1 M_1'(k_3 a) \quad (54)$$

$$Z = (\mu_3 - 1)[R_1 J_1(k_3 a) + S_1 M_1(k_3 a)] + k_3 a[R_1 J_0(k_3 a) + S_1 M_0(k_3 a)] \quad (55)$$

The loss $P_L$ of the conductive wire is calculated as follows.

[Math 29]

$$P_L = \Re[\bar{P}_P] = -\frac{2\pi l |k_3 a|^2}{\sigma_3}|H_0|^2 \Re\left[k_3 a \frac{XY^*}{|Z|^2}\right] \quad (56)$$

When the conductive wire has a double-layer structure, from $\sigma_1=\sigma_2$, $\mu_1=\mu_2$ and the formulas (45) and (46),

[Math 30]

$$P_1=1 \quad (57)$$

$$Q_1=0 \quad (58)$$

and when the conductive wire has a single-layer structure, from $\sigma_1=\sigma_2=\sigma_3$, $\mu_1=\mu_2=\mu_3$ and the formulas (47) and (48),

[Math 31]

$$R_1=1 \quad (59)$$

$$S_1=0 \quad (60)$$

When a magnetic loss is caused in the respective layers because of magnetic hysteresis, the loss can be represented by introducing an imaginary part into magnetic permeability.

When a coil or the like is wound with one conductive wire, such as a transformer and a reactor, the external magnetic field is formed by a current flowing through the conductive wire. In that case, the strength $|H_0|$ of the external magnetic field is proportional to the magnitude $|I|$ of the current according to the following formula (61).

[Math 32]

$$|H_0|=\alpha|I| \quad (61)$$

Herein, $\alpha$ is a proportional coefficient and depends on how the conductive wire is wound. The proportional coefficient $\alpha$ increases when the conductive wire is wound thinly and densely. By substituting this formula into the formula (56), the resistance $R_p$ per unit length due to the proximity effect is given as follows.

[Math 33]

$$R_P = \frac{2P_L}{|I|^2 l} = -\frac{4\pi|k_3 a|^2}{\sigma_3}\alpha^2 \mathfrak{R}\left[k_3 a \frac{XY^*}{|Z|^2}\right] \quad (62)$$

Next, the calculation results with regard to the conductive wires having the diameters of 0.05 mm, 0.2 mm and 0.4 mm are explained with reference to FIG. 8 to FIG. 41 by use of the above-mentioned formulas (1) to (62). Al was calculated under the conditions of the resistivity $\rho=3.024\times10^{-5}\Omega\cdot$mm and the relative magnetic permeability $\mu_1=1$. Cu was calculated under the conditions of the resistivity $\rho=1.724\times10^{-5}\Omega\cdot$mm and the relative magnetic permeability $\mu_2=1$. The ferromagnetic layer 3 was calculated under the conditions of the resistivity $\rho=9.8\times10^{-5}\Omega\cdot$mm and the relative magnetic permeability $\mu_3=100$ to 10000.

In FIG. 8 to FIG. 41, "FCA 95%", "FCA 90%" and "FCA 85%" each represent an electric wire according to the first embodiment of the present invention having a triple-layer structure including the central conductor 1, the cover layer 2 and the ferromagnetic layer 3 as shown in FIG. 1, and each have a ratio of the cross-sectional area of Al to the total cross-sectional area of the central conductor 1 and the cover layer 2 which is 95%, 90% and 85%, respectively (hereinafter, referred to as "95%-FCA wire", "90%-FCA wire" and "85%-FCA wire" respectively). "CA 95%", "CA 90%" and "CA 85%" each represent an electric wire according to a comparative example having a double-layer structure including an Al layer and a Cu layer covering the Al layer, and each have a ratio of the cross-sectional area of Al to the total cross-sectional area of the Al layer and the Cu layer which is 95%, 90% and 85%, respectively (hereinafter, referred to as "95%-CA wire", "90%-CA wire" and "85%-CA wire" respectively). "FCu" represents an electric wire as a comparative example having a double-layer structure including a Cu layer and a ferromagnetic layer covering the Cu layer (hereinafter, referred to as "FCu wire"). "Cu" represents an electric wire as a comparative example which is a Cu wire.

As shown in FIG. 1, the diameter of the central conductor 1 is defined as $2c$, the total diameter of the central conductor 1 and the cover layer 2 is defined as $2b$, and the entire diameter of the electric wire is defined as $2a$. The thickness of the ferromagnetic layer 3 is (a-b).

Figure 8:
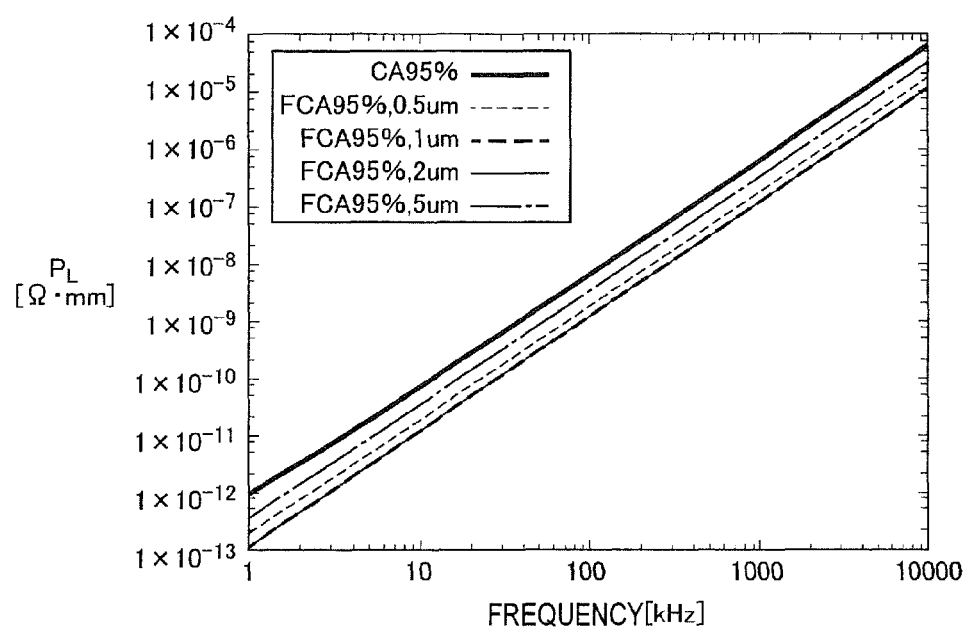
FIG. 8(a) is a graph showing an influence of a thickness of a ferromagnetic layer in each conductive wire having a diameter of 0.05 mm (theoretical values of loss due to a proximity effect).
FIG. 8(b) is a graph showing the influence of the thickness of the ferromagnetic layer in each conductive wire having a diameter of 0.05 mm (theoretical values of AC resistance due to a skin effect).
Figure 8:
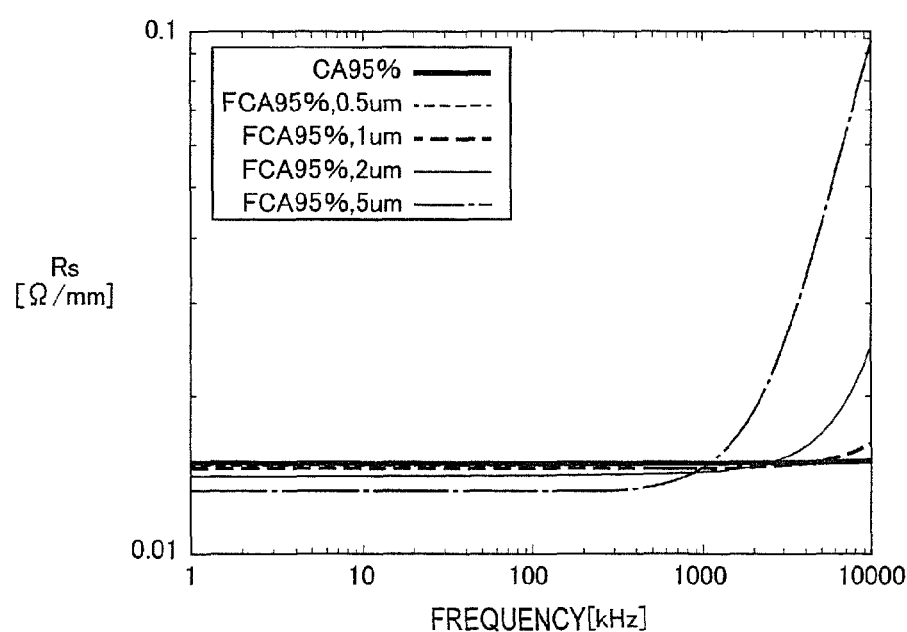

FIG. 8($a$) and FIG. 8($b$) show the calculation results of the loss $P_L$ due to the proximity effect and the AC resistance $R_s$ due to the skin effect, respectively, in each of the 95%-CA wire and the 95%-FCA wires having a common diameter of 0.05 mm and relative magnet permeability $\mu r$ of the ferromagnetic layer 3 which is 100 and having different thicknesses of the ferromagnetic layer 3 which are 0.5 μm, 1 μm, 2 μm and 5 μm. As is apparent from FIG. 8($a$), although the loss $P_L$ due to the proximity effect decreases when the ferromagnetic layer 3 is formed, the loss $P_L$ due to the proximity effect increases when the thickness of the ferromagnetic layer 3 excessively increases. In other words, an optimum thickness of the ferromagnetic layer 3 by which the loss $P_L$ due to the proximity effect is minimized was detected. As is apparent from FIG. 8($b$), the AC resistance $R_s$ due to the skin effect on the low frequency side is smaller but the AC resistance $R_s$ due to the skin effect on the high frequency side is higher as the thickness of the ferromagnetic layer 3 increases.

Figure 9:
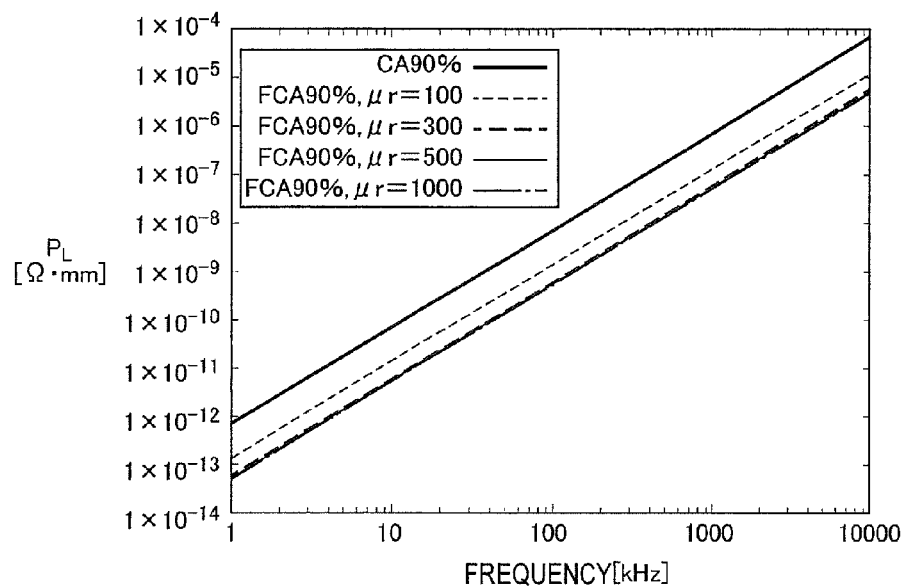
FIG. 9(a) is a graph showing an influence of magnetic permeability of the ferromagnetic layer in each conductive wire having a diameter of 0.05 mm (theoretical values of loss due to a proximity effect).
FIG. 9(b) is a graph showing the influence of the magnetic permeability of the ferromagnetic layer in each conductive wire having a diameter of 0.05 mm (theoretical values of AC resistance due to a skin effect).
Figure 9:
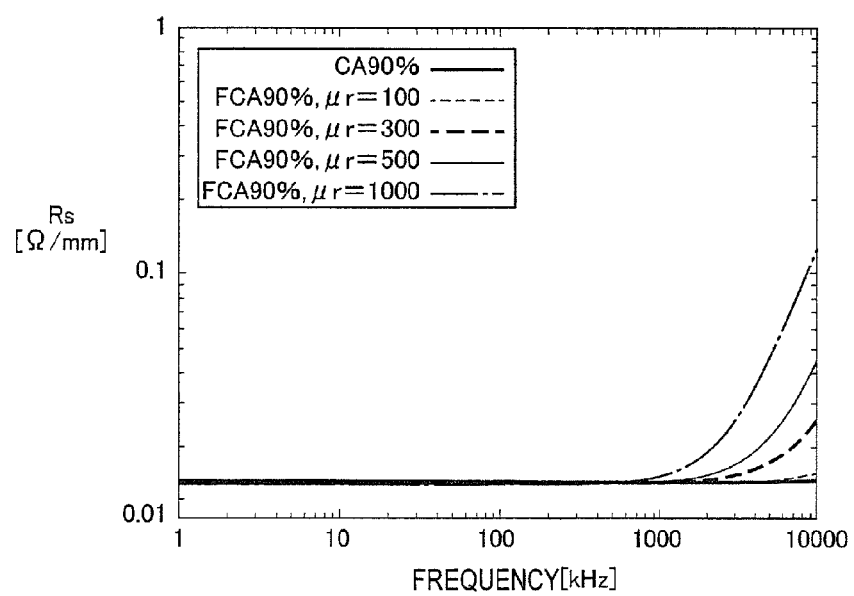

FIG. 9($a$) and FIG. 9($b$) show the calculation results of the loss $P_L$ due to the proximity effect and the AC resistance $R_s$ due to the skin effect, respectively, in each of the 90%-CA wire and the 90%-FCA wires having a common diameter of 0.05 mm and thickness of the ferromagnetic layer 3 which is 1 μm and having different relative magnet permeability $\mu r$ of the ferromagnetic layer 3 which are 100, 300, 500 and 1000. As is apparent from FIG. 9($a$), the loss $P_L$ due to the proximity effect is lower as the relative magnet permeability $\mu r$ of the ferromagnetic layer 3 is higher; however, the difference of the loss among the wires decreases when the relative magnet permeability gr increases to a certain extent. It is apparent from FIG. 9($b$) that the AC resistance $R_s$ due to the skin effect on the high frequency side is higher as the relative magnet permeability $\mu r$ of the ferromagnetic layer 3 is higher.

Figures 10, 11:
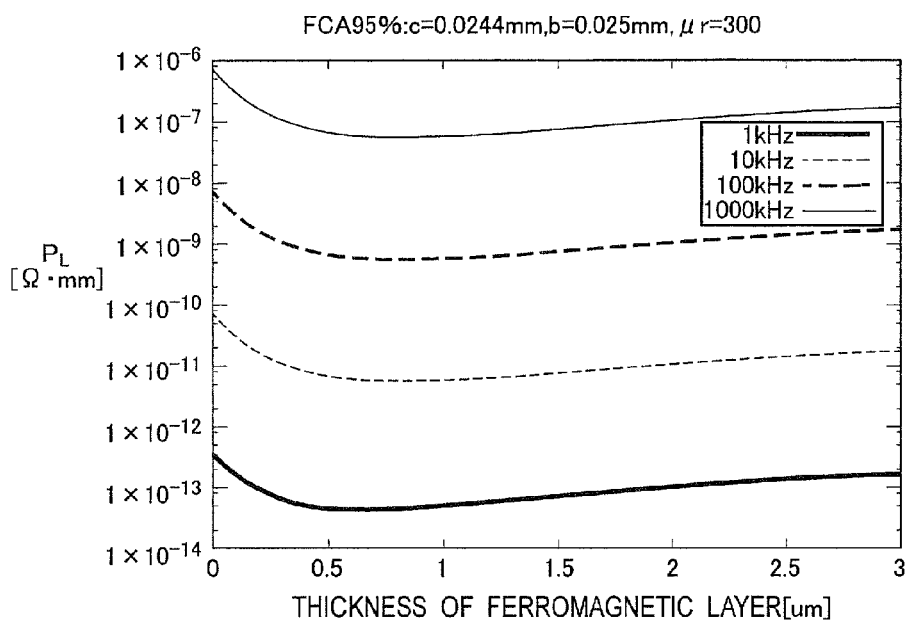
FIG. 11 is a table showing the thickness of the ferromagnetic layer by which the loss due to the proximity effect is minimized in each of conductive wires having a diameter of 0.05 mm and different constitutions.
Figure 14:
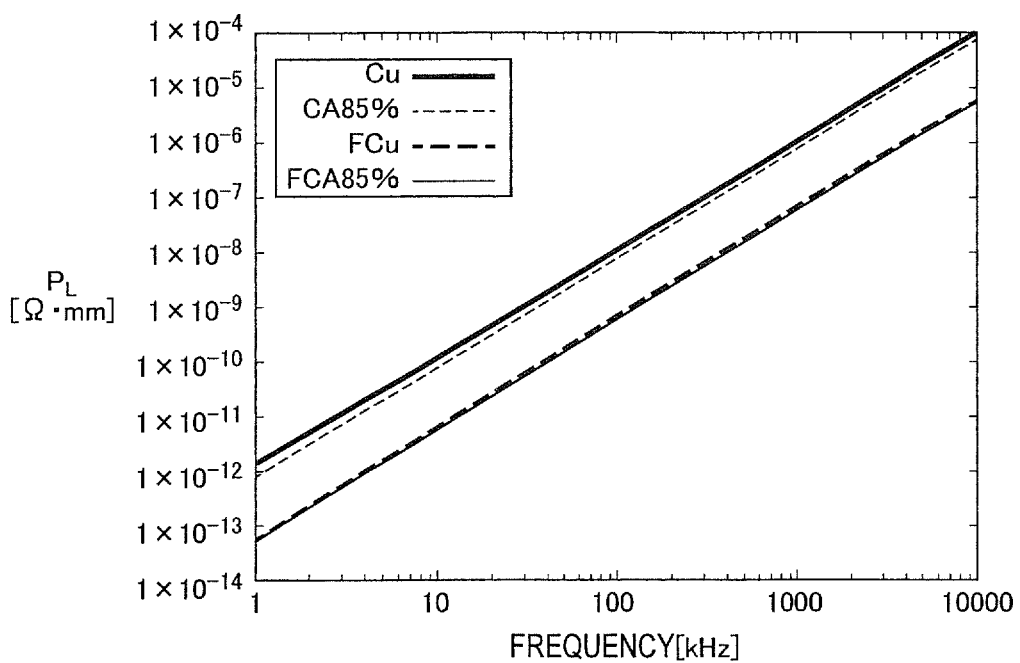
FIG. 14(a) is a graph showing a relationship between frequency and loss due to a proximity effect (theoretical values) in each of conductive wires having a diameter of 0.05 mm and different constitutions.
FIG. 14(b) is a graph showing a relationship between frequency and AC resistance due to a skin effect (theoretical values) in each of the conductive wires having a diameter of 0.05 mm and different constitutions.
Figure 14:
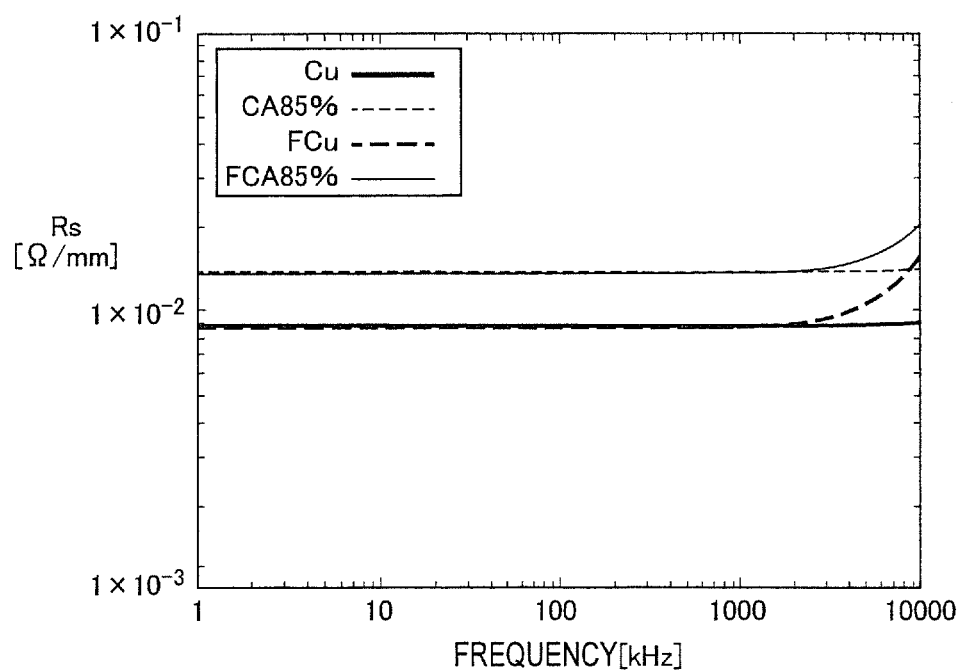
Figure 15:
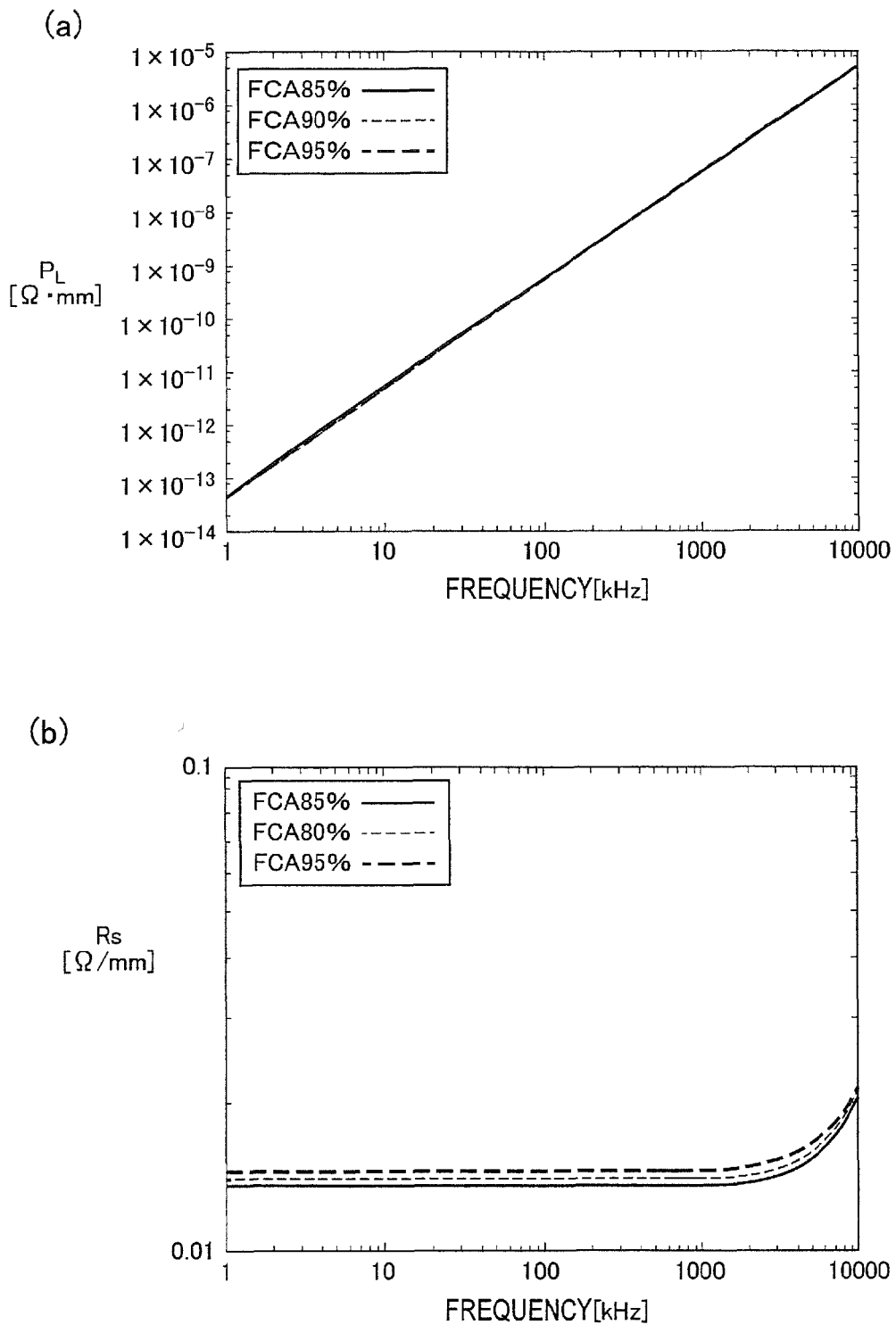
FIG. 15(a) is a graph showing a relationship between frequency and loss due to a proximity effect (theoretical values) in each of conductive wires having a diameter of 0.05 mm and different constitutions.
FIG. 15(b) is a graph showing a relationship between frequency and AC resistance due to a skin effect (theoretical values) in each of the conductive wires having a diameter of 0.05 mm and different constitutions.
Figure 16:
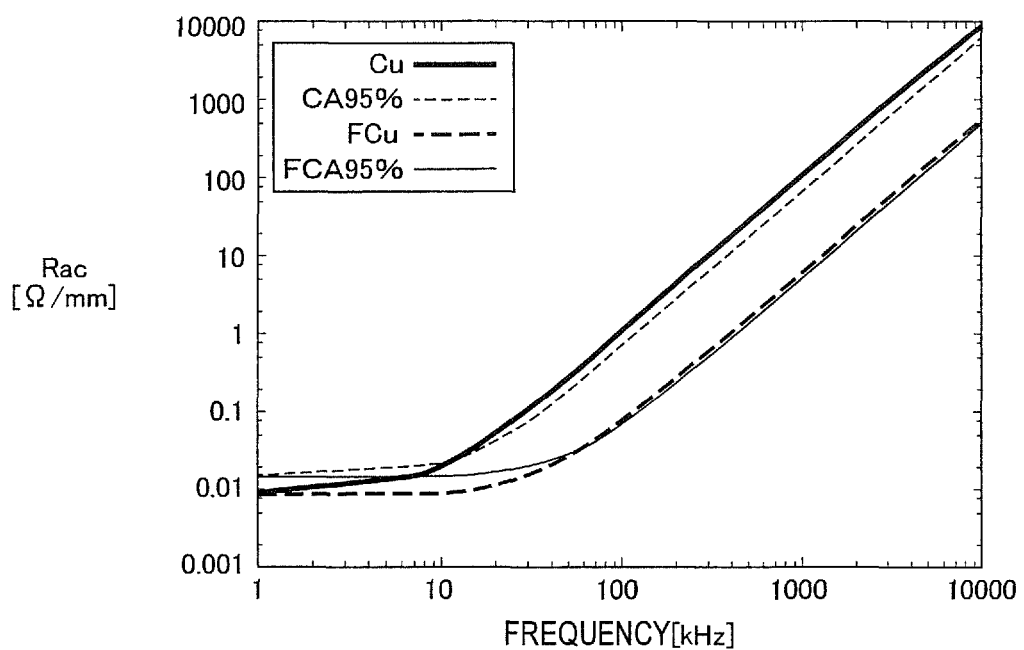
FIG. 16(a) is a graph showing a relationship between frequency and AC resistance (theoretical values) in a coil using each of conductive wires having a diameter of 0.05 mm and different constitutions.
FIG. 16(b) is a table showing the AC resistance (theoretical values) at specific frequencies in the coil using each of the conductive wires having a diameter of 0.05 mm and different constitutions.
Figure 17:
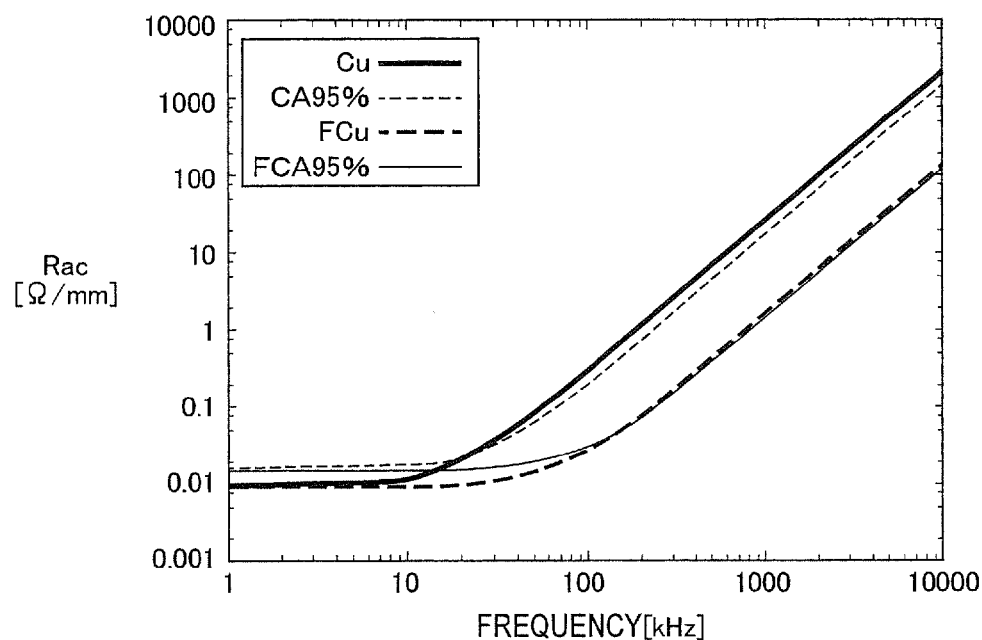
FIG. 17(a) is a graph showing a relationship between frequency and AC resistance (theoretical values) in a coil using each of conductive wires having a diameter of 0.05 mm and different constitutions.
FIG. 17(b) is a table showing the AC resistance (theoretical values) at specific frequencies in the coil using each of the conductive wires having a diameter of 0.05 mm and different constitutions.
Figure 18:
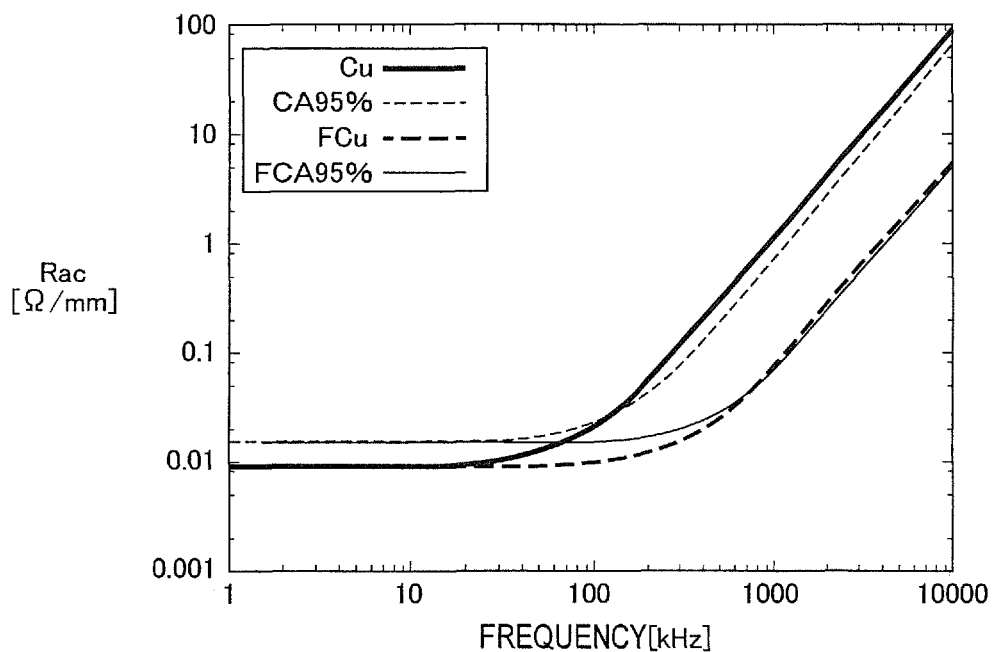
FIG. 18(a) is a graph showing a relationship between frequency and AC resistance (theoretical values) in a coil using each of conductive wires having a diameter of 0.05 mm and different constitutions.
FIG. 18(b) is a table showing the AC resistance (theoretical values) at specific frequencies in the coil using each of the conductive wires having a diameter of 0.05 mm and different constitutions.
Figure 19:
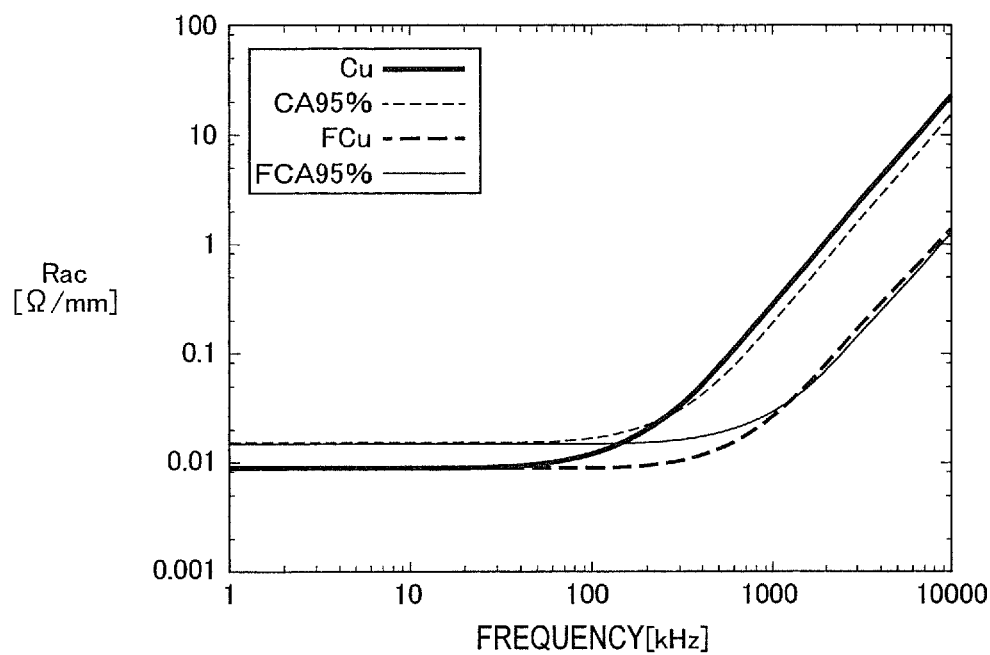
FIG. 19(a) is a graph showing a relationship between frequency and AC resistance (theoretical values) in a coil using each of conductive wires having a diameter of 0.05 mm and different constitutions.
FIG. 19(b) is a table showing the AC resistance at specific frequencies in the coil using each of the conductive wires having a diameter of 0.05 mm and different constitutions.
Figure 20:
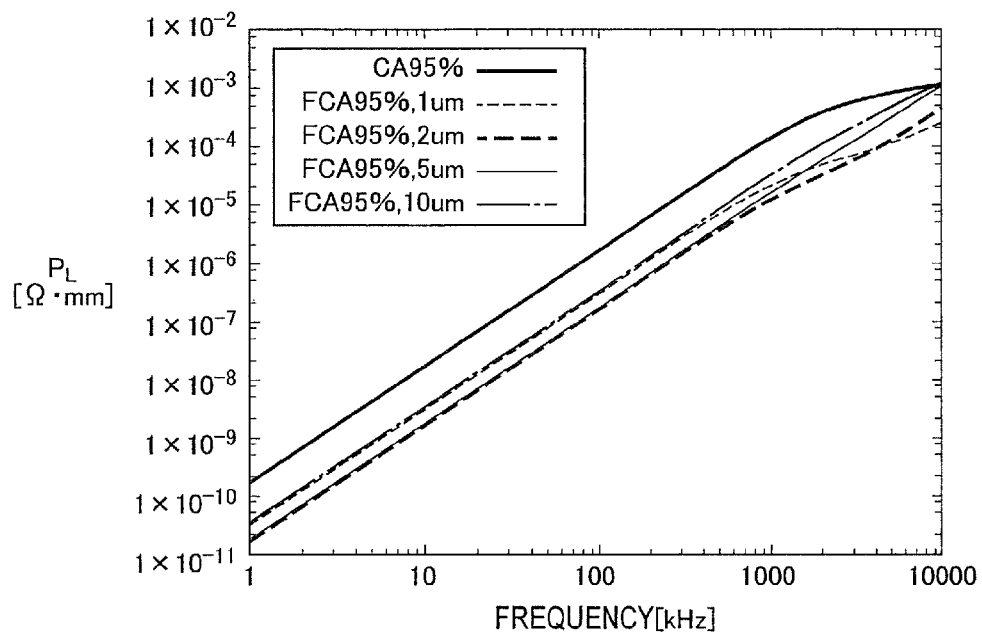
FIG. 20(a) is a graph showing an influence of a thickness of a ferromagnetic layer in each conductive wire having a diameter of 0.2 mm (theoretical values of loss due to a proximity effect).
FIG. 20(b) is a graph showing the influence of the thickness of the ferromagnetic layer in each conductive wire having a diameter of 0.2 mm (theoretical values of AC resistance due to a skin effect).
Figure 20:
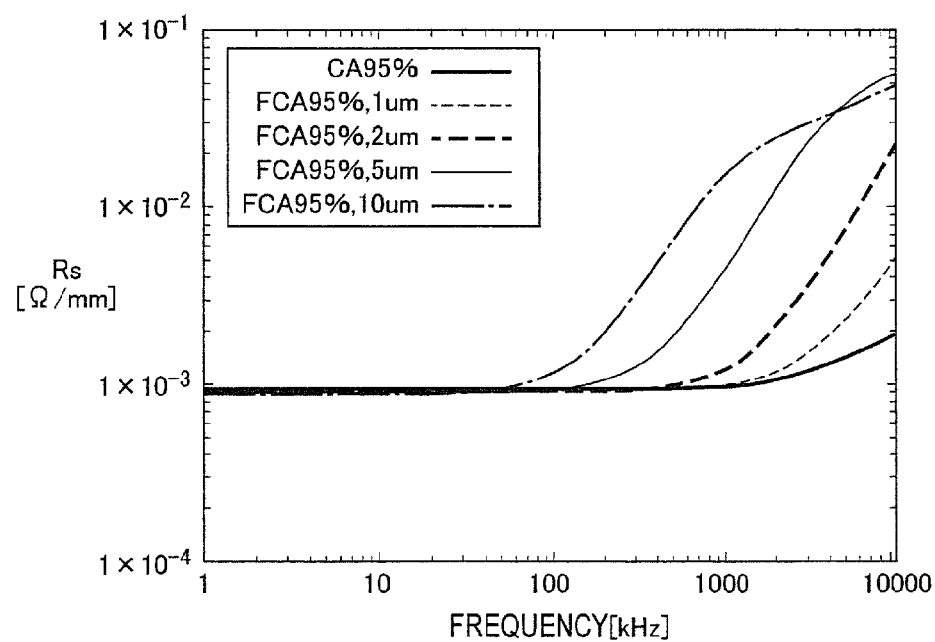
Figure 21:
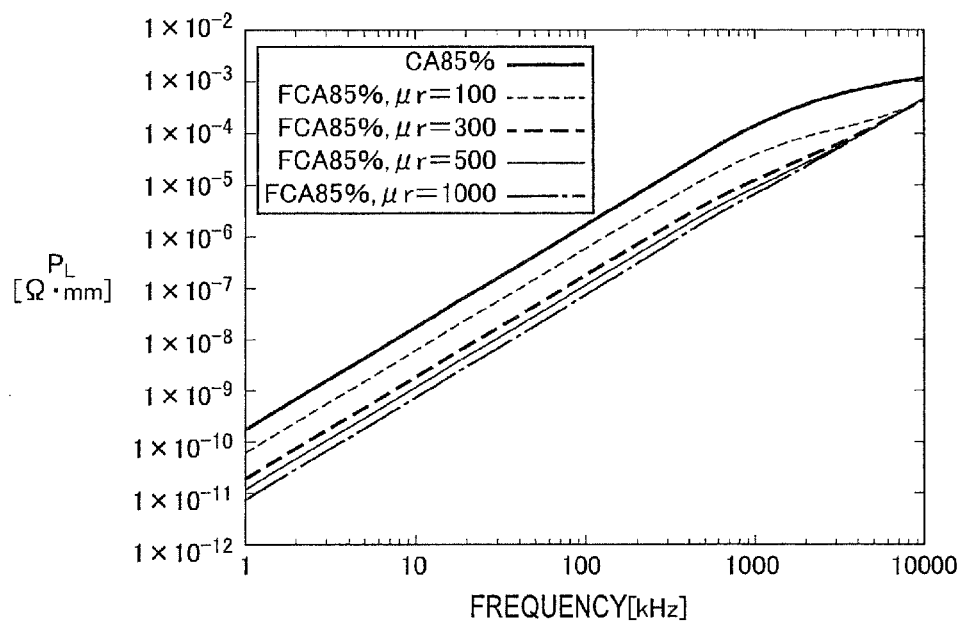
FIG. 21(a) is a graph showing an influence of magnetic permeability of the ferromagnetic layer in each conductive wire having a diameter of 0.2 mm (theoretical values of loss due to a proximity effect).
FIG. 21(b) is a graph showing the influence of the magnetic permeability of the ferromagnetic layer in each conductive wire having a diameter of 0.2 mm (theoretical values of AC resistance due to a skin effect).
Figure 21:
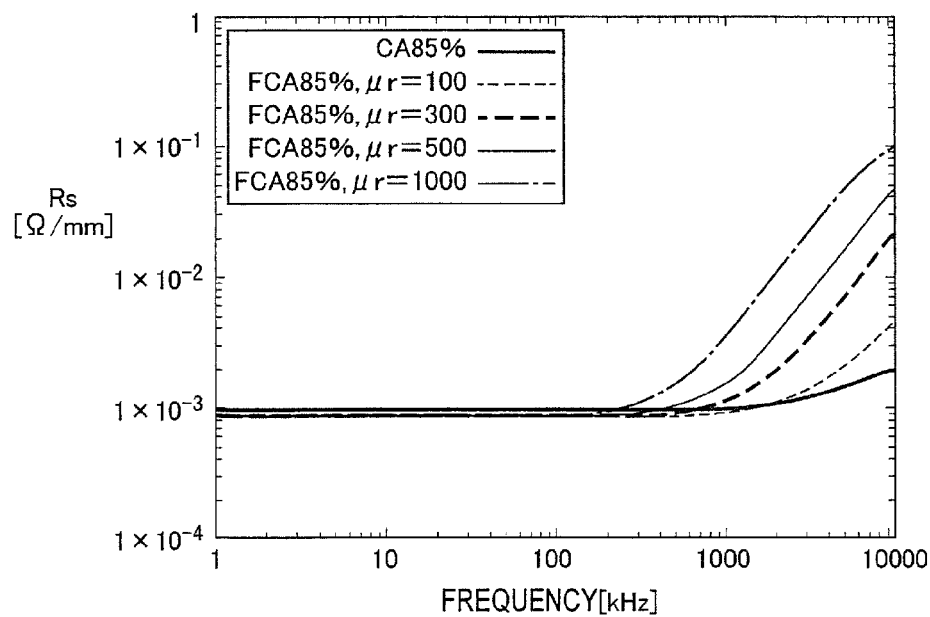
Figure 22:
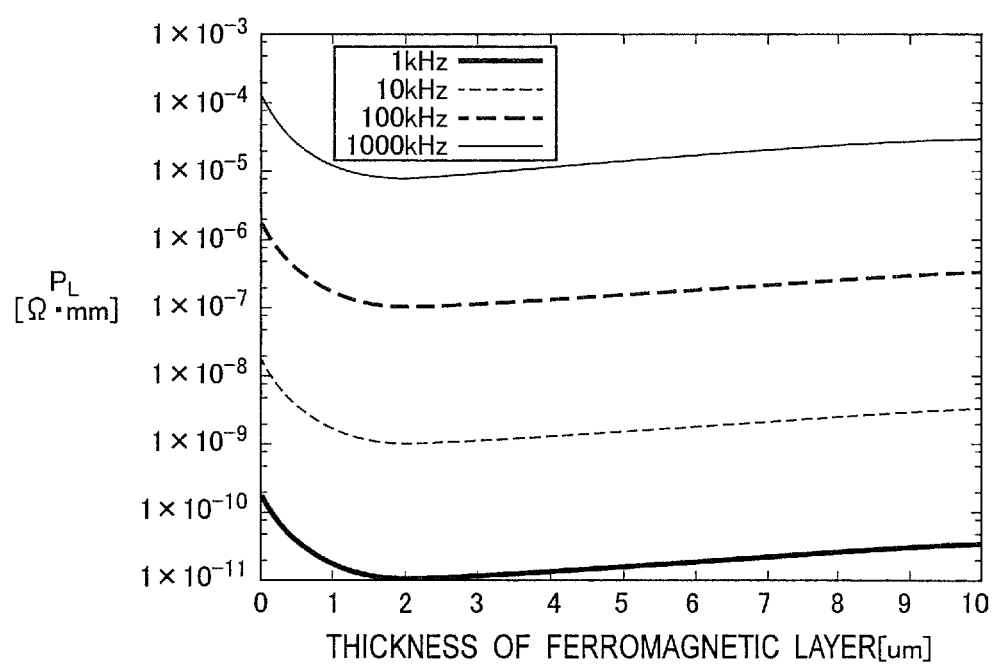
FIG. 22(a) is a graph showing the influence of the thickness of the ferromagnetic layer in each conductive wire having a diameter of 0.2 mm (theoretical values of loss due to a proximity effect).
FIG. 22(b) is a table showing the thickness of the ferromagnetic layer by which the loss due to the proximity effect is minimized in each conductive wire having a diameter of 0.2 mm.

FIG. 10($a$) shows the calculation result of the loss $P_L$ due to the proximity effect in each of the 95%-FCA wires having a common diameter of 0.05 mm, relative magnet permeability $\mu r$ of the ferromagnetic layer 3 which is 300, b=0.025 mm and c=0.0244 mm and having different a in the range from 0.025 mm to 0.028 mm. It is apparent from FIG. 10($a$) that the loss $P_L$ due to the proximity effect depends on the thickness of the ferromagnetic layer 3. In addition, an optimum thickness of the ferromagnetic layer 3 by which the loss $P_L$ due to the proximity effect is minimized was detected. FIG. 10($b$) shows the optimum thickness (the unit is μm) of the ferromagnetic layer 3 by which the loss $P_L$ due to the proximity effect is minimized in each of the same conductive wires as those shown in FIG. 10($a$).

FIG. 11 shows the optimum thickness (the unit is μm) of the ferromagnetic layer 3 by which the loss $P_L$ due to the proximity effect is minimized in each of the 95%-FCA wires having a common diameter of 0.05 mm, b=0.025 mm and c=0.0244 mm and having different relative magnet permeability $\mu r$ and frequencies. It is apparent from FIG. 11 that the optimum thickness of the ferromagnetic layer 3 also depends on the relative magnet permeability $\mu r$ of the ferromagnetic layer 3. In addition, the optimum thickness of the ferromagnetic layer 3 decreases as the relative magnet permeability μr increases.

FIG. 12(a) to FIG. 12(d) and FIG. 13(a) to FIG. 13(d) each show the calculation result of the optimum thickness (the unit is μm) of the ferromagnetic layer 3 by which the loss $P_L$ due to the proximity effect is minimized in each of the conductive wires having a diameter of 0.05 mm with different constitutions and having different relative magnet permeability μr and frequencies. According to FIG. 12(a) to FIG. 12(d) and FIG. 13(a) to FIG. 13(d), the optimum thickness of the ferromagnetic layer 3 is in the range from 0.09 μm to 1.45 μm. As is apparent from FIG. 12(a) to FIG. 12(d) and FIG. 13(a) to FIG. 13(d), the optimum thickness of the ferromagnetic layer 3 by which the loss $P_L$ due to the proximity effect is minimized decreases as the proportion of the central conductor 1 increases.

FIG. 14(a) and FIG. 14(b) show the calculation results of the loss $P_L$ due to the proximity effect and the AC resistance $R_s$ due to the skin effect in each of the Cu wire, the 85%-CA wire, the FCu wire and the 85%-FCA wire having a common diameter of 0.05 mm, relative magnet permeability μr of the ferromagnetic layer 3 which is 300 and thickness of the ferromagnetic layer 3 which is 0.82 μm. It is apparent from FIG. 14(a) that the loss $P_L$ due to the proximity effect of the FCA wire is approximately 1/10 of the Cu wire or the CA wire. As is apparent from FIG. 14(b), the AC resistance $R_s$ due to the skin effect of the FCA wire is higher than that of the FCu wire; however, the loss $P_L$ due to the proximity effect of the FCA wire is smaller than that of the FCu wire as shown in FIG. 14(a).

FIG. 15(a) and FIG. 15(b) show the calculation results of the loss $P_L$ due to the proximity effect and the AC resistance $R_s$ due to the skin effect, respectively, in each of the FCA wires having a common diameter of 0.05 mm, relative magnet permeability μr of the ferromagnetic layer 3 which is 300 and thickness of the ferromagnetic layer 3 which is 0.82 μm and having different proportions of the central conductor 1. With regard to the loss $P_L$ due to the proximity effect shown in FIG. 15(a), the maximum ratio of the 85%-FCA wire to the 95%-FCA wire is 1.05 to 1, and the maximum ratio of the 90%-FCA wire to the 95%-FCA wire is 1.03 to 1. It is apparent from FIG. 15(b) that the AC resistance $R_s$ due to the skin effect is higher as the proportion of the central conductor 1 is higher.

FIG. 16(a) and FIG. 16(b) each show the calculation result of the AC resistance $R_{ac}$ in a coil using each of conductive wires having a common diameter of 0.05 mm, relative magnet permeability μr=300, thickness of the ferromagnetic layer 3 which is 0.82 μm, and α=10000 mm$^{-1}$. As shown in 16(a), the AC resistance $R_{ac}$ of the FCA wire is smaller than that of the CA wire when the frequency is 1 kHz or higher. The AC resistance $R_{ac}$ of the FCA wire is smaller than that of the Cu wire when the frequency is 6 kHz or higher. The AC resistance $R_{ac}$ of the FCA wire is smaller than that of the FCu wire when the frequency is 70 kHz or higher.

FIG. 17(a) and FIG. 17(b) each show the calculation result of the AC resistance $R_{ac}$ under the same conditions as FIG. 16(a) and FIG. 16(b) other than α which is 5000 mm$^{-1}$. As shown in FIG. 17(a), the AC resistance $R_{ac}$ of the FCA wire is smaller than that of the CA wire when the frequency is 1 kHz or higher. The AC resistance $R_{ac}$ of the FCA wire is smaller than that of the Cu wire when the frequency is 15 kHz or higher. The AC resistance $R_{ac}$ of the FCA wire is smaller than that of the FCu wire when the frequency is 150 kHz or higher.

FIG. 18(a) and FIG. 18(b) each show the calculation result of the AC resistance $R_{ac}$ under the same conditions as FIG. 16(a) and FIG. 16(b) other than α which is 1000 mm$^{-1}$. As shown in FIG. 18(a), the AC resistance $R_{ac}$ of the FCA wire is smaller than that of the CA wire when the frequency is 1 kHz or higher. The AC resistance $R_{ac}$ of the FCA wire is smaller than that of the Cu wire when the frequency is 74 kHz or higher. The AC resistance $R_{ac}$ of the FCA wire is smaller than that of the FCu wire when the frequency is 700 kHz or higher.

FIG. 19(a) and FIG. 19(b) each show the calculation result of the AC resistance $R_{ac}$ under the same conditions as FIG. 16(a) and FIG. 16(b) other than α which is 500 mm$^{-1}$. As shown in FIG. 19(a), the AC resistance $R_{ac}$ of the FCA wire is smaller than that of the CA wire when the frequency is 1 kHz or higher. The AC resistance $R_{ac}$ of the FCA wire is smaller than that of the Cu wire when the frequency is 150 kHz or higher. The AC resistance $R_{ac}$ of the FCA wire is smaller than that of the FCu wire when the frequency is 1390 kHz or higher.

FIG. 20(a) and FIG. 20(b) show the calculation results of the loss $P_L$ due to the proximity effect and the AC resistance $R_s$ due to the skin effect, respectively, in each of the conductive wires having a diameter of 0.2 mm including the CA wire and the FCA wires that have common relative magnet permeability μr of the ferromagnetic layer 3 which is 300 and have different thicknesses of the ferromagnetic layer 3 which are 1 μm, 2 μm, 5 μm and 10 μm. As apparent from FIG. 20(a), although the loss $P_L$ due to the proximity effect decreases when the ferromagnetic layer 3 is formed, the loss $P_L$ due to the proximity effect increases when the thickness of the ferromagnetic layer 3 excessively increases. In other words, an optimum thickness of the ferromagnetic layer 3 by which the loss $P_L$ due to the proximity effect is minimized was detected. As is apparent from FIG. 20(b), the AC resistance $R_s$ due to the skin effect on the low frequency side is smaller but the AC resistance $R_s$ due to the skin effect on the high frequency side is higher as the thickness of the ferromagnetic layer 3 increases.

FIG. 21(a) and FIG. 21(b) show the calculation results of the loss $P_L$ due to the proximity effect and the AC resistance $R_s$ due to the skin effect, respectively, in each of the CA wire and the FCA wires having a common diameter of 0.2 mm and thickness of the ferromagnetic layer 3 which is 2 μm and having different relative magnet permeability μr of the ferromagnetic layer 3 which are 100, 300, 500 and 1000. As is apparent from FIG. 21(a), the loss $P_L$ due to the proximity effect is lower as the relative magnet permeability μr of the ferromagnetic layer 3 is higher; however, the difference of the loss among the wires decreases when the relative magnet permeability μr increases to a certain extent. It is apparent from FIG. 21(b) that the AC resistance $R_s$ due to the skin effect on the high frequency side is higher as the relative magnet permeability μr of the ferromagnetic layer 3 is higher.

FIG. 22(a) shows the calculation result of the loss $P_L$ due to the proximity effect in each of the FCA wires having a common diameter of 0.2 mm, relative magnet permeability μr of the ferromagnetic layer 3 which is 500, b=0.100 mm and c=0.095 mm and having different a in the range from 0.100 mm to 0.110 mm. It is apparent from FIG. 22(a) that the loss $P_L$ due to the proximity effect depends on the thickness of the ferromagnetic layer 3 and the frequency. In addition, an optimum thickness of the ferromagnetic layer 3 by which the loss $P_L$ due to the proximity effect is minimized was detected. FIG. 22(b) shows the optimum thickness (the unit is μm) of the ferromagnetic layer 3 by which the loss $P_L$ due to the proximity effect is minimized in each of the same conductive wires as those shown in FIG. 22(a).

FIG. 23(a) to FIG. 23(d) and FIG. 24(a) to FIG. 24(d) each show the optimum thickness (the unit is μm) of the ferromagnetic layer 3 by which the loss $P_L$ due to the proximity effect is minimized in each of the conductive wires having a diameter of 0.2 mm and having different relative magnet permeability μr and frequencies. According to FIG. 23(*a*) to FIG. 23(*d*) and FIG. 24(*a*) to FIG. 24(*d*), the optimum thickness of the ferromagnetic layer 3 is in the range from 0.30 μm to 5.79 μm. As is apparent from FIG. 23(*a*) to FIG. 23(*d*) and FIG. 24(*a*) to FIG. 24(*d*), the optimum thickness of the ferromagnetic layer 3 by which the loss $P_L$ due to the proximity effect is minimized decreases as the proportion of the central conductor 1 increases. In addition, the optimum thickness of the ferromagnetic layer 3 decreases as the relative magnet permeability μr increases, and the optimum thickness of the ferromagnetic layer 3 generally decreases as the frequency is higher.

Figure 25:
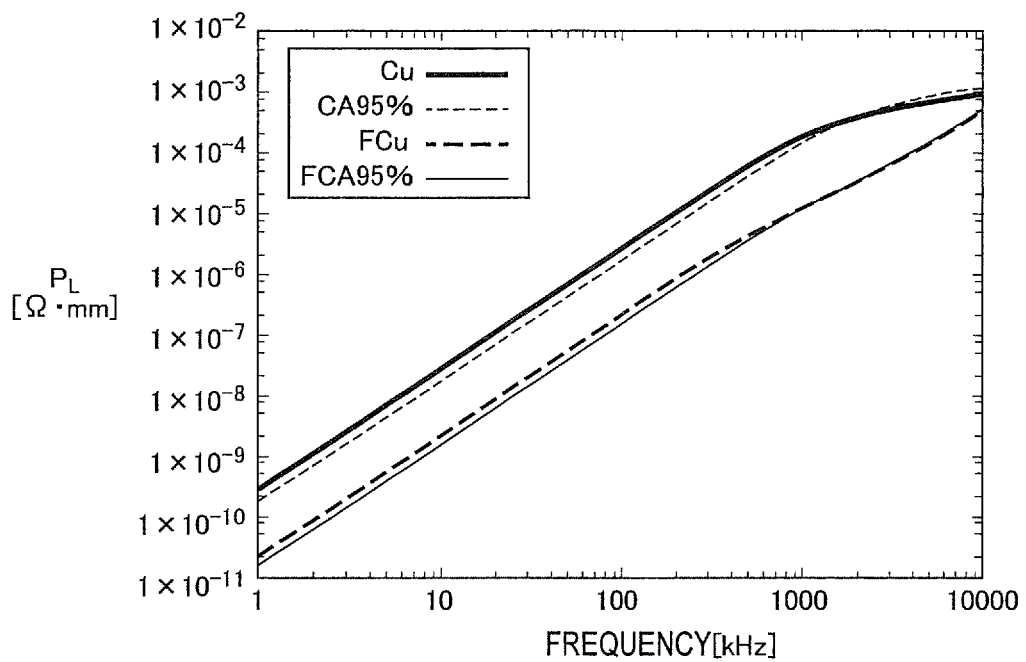
FIG. 25(a) is a graph showing a relationship between frequency and loss due to a proximity effect (theoretical values) in each of conductive wires having a diameter of 0.2 mm and different constitutions.
FIG. 25(b) is a graph showing a relationship between frequency and AC resistance due to a skin effect (theoretical values) in each of the conductive wires having a diameter of 0.2 mm and different constitutions.
Figure 25:
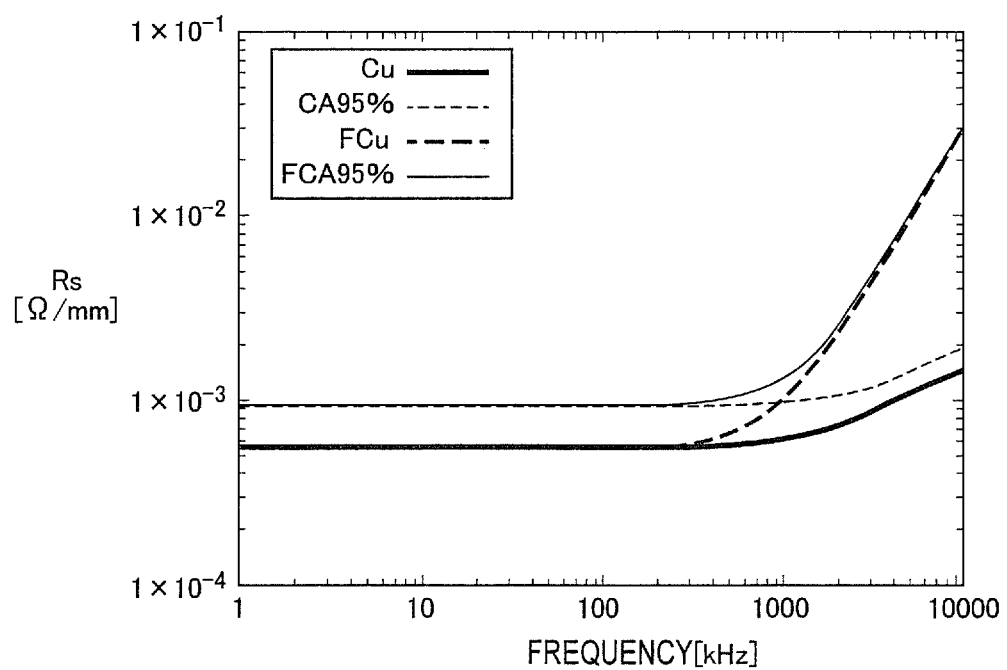

FIG. 25(*a*) and FIG. 25(*b*) show the calculation results of the loss $P_L$ due to the proximity effect and the AC resistance $R_s$ due to the skin effect, respectively, in each of the Cu wire, the 95%-CA wire, the FCu wire and the 95%-FCA wire having a common diameter of 0.2 mm, relative magnet permeability μr of the ferromagnetic layer 3 which is 300 and thickness of the ferromagnetic layer 3 which is 2.3 μm. It is apparent from FIG. 25(*a*) that the loss $P_L$ due to the proximity effect of the FCA wire is approximately 1/10 of the Cu wire or the CA wire. As is apparent from FIG. 25(*b*), the AC resistance $R_s$ due to the skin effect of the FCA wire is higher than that of the FCu wire; however, the loss $P_L$ due to the proximity effect of the FCA wire is smaller than that of the FCu wire as shown in FIG. 25(*a*).

Figure 26:
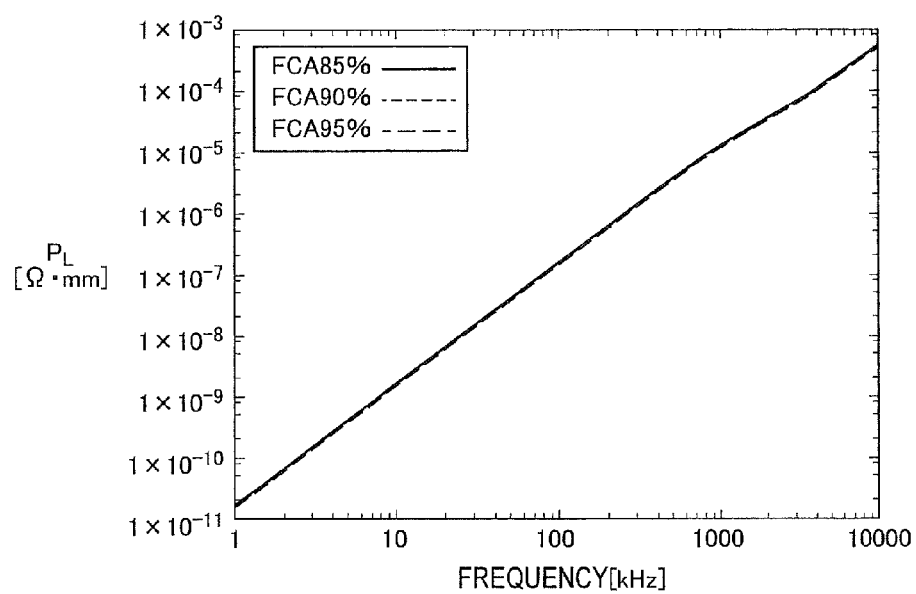
FIG. 26(a) is a graph showing a relationship between frequency and loss due to a proximity effect (theoretical values) in each of conductive wires having a diameter of 0.2 mm and different constitutions.
FIG. 26(b) is a graph showing a relationship between frequency and AC resistance due to a skin effect (theoretical values) in each of the conductive wires having a diameter of 0.2 mm and different constitutions.
Figure 26:
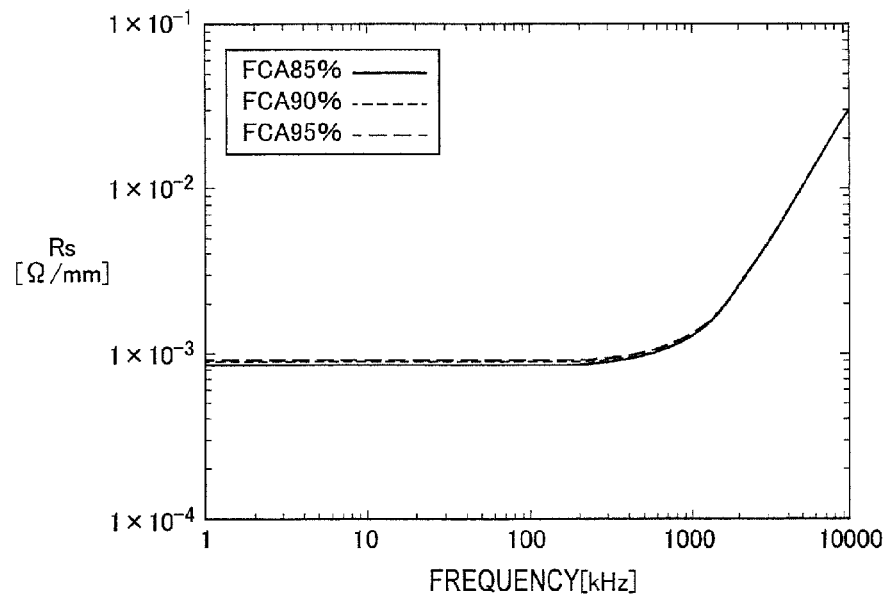

FIG. 26(*a*) and FIG. 26(*b*) show the calculation results of the loss $P_L$ due to the proximity effect and the AC resistance $R_s$ due to the skin effect, respectively, in each of the FCA wires having a common diameter of 0.2 mm, relative magnet permeability μr of the ferromagnetic layer 3 which is 300 and thickness of the ferromagnetic layer 3 which is 2.3 μm and having different proportions of the central conductor 1. With regard to the loss $P_L$ due to the proximity effect shown in FIG. 26(*a*), the maximum ratio of the 85%-FCA wire to the 95%-FCA wire is 1.07 to 1, and the maximum ratio of the 90%-FCA wire to the 95%-FCA wire is 1.03 to 1. It is apparent from FIG. 26(*a*) that the loss $P_L$ due to the proximity effect is lower as the proportion of the central conductor 1 is higher. It is apparent from FIG. 26(*b*) that the AC resistance $R_s$ due to the skin effect is higher as the proportion of the central conductor 1 is higher.

Figure 27:
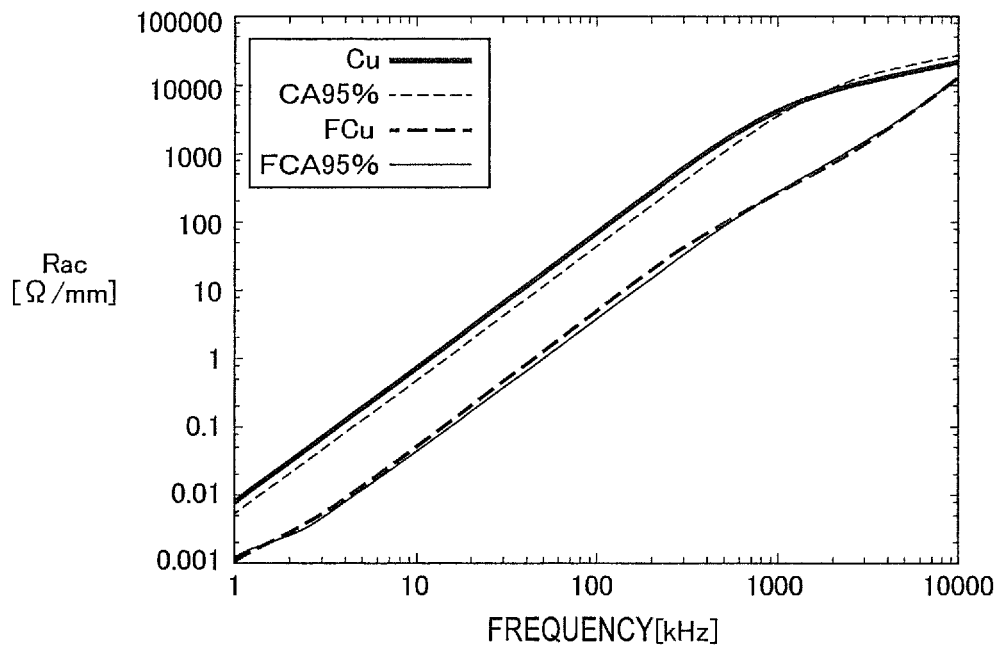
FIG. 27(a) is a graph showing a relationship between frequency and AC resistance (theoretical values) in a coil using each of conductive wires having a diameter of 0.2 mm and different constitutions.
FIG. 27(b) is a table showing the AC resistance (theoretical values) at specific frequencies in the coil using each of the conductive wires having a diameter of 0.2 mm and different constitutions.

FIG. 27(*a*) and FIG. 27(*b*) each show the calculation result of the AC resistance $R_{ac}$ in a coil using each of conductive wires having a common diameter of 0.2 mm, relative magnet permeability μr=300, thickness of the ferromagnetic layer 3 which is 2.3 μm and α=5000 mm$^{-1}$. As shown in 27(*a*), the AC resistance $R_{ac}$ of the FCA wire is smaller than that of the CA wire or the Cu wire when the frequency is 1 kHz or higher. The AC resistance $R_{ac}$ of the FCA wire is smaller than that of the FCu wire when the frequency is 2 kHz or higher.

Figure 28:
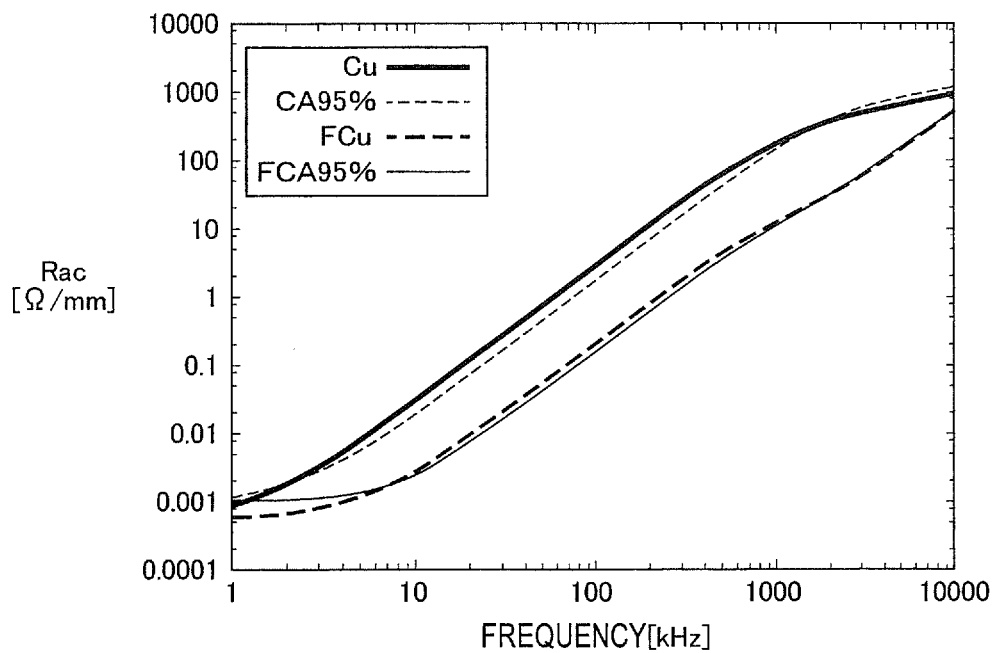
FIG. 28(a) is a graph showing a relationship between frequency and AC resistance (theoretical values) in a coil using each of conductive wires having a diameter of 0.2 mm and different constitutions.
FIG. 28(b) is a table showing the AC resistance (theoretical values) at specific frequencies in the coil using each of the conductive wires having a diameter of 0.2 mm and different constitutions.

FIG. 28(*a*) and FIG. 28(*b*) each show the calculation result of the AC resistance $R_{ac}$ under the same conditions as FIG. 27(*a*) and FIG. 27(*b*) other than α which is 1000 mm$^{-1}$. As shown in FIG. 28(*a*), the AC resistance $R_{ac}$ of the FCA wire is smaller than that of the CA wire when the frequency is 1 kHz or higher. The AC resistance $R_{ac}$ of the FCA wire is smaller than that of the Cu wire when the frequency is 1.1 kHz or higher. The AC resistance $R_{ac}$ of the FCA wire is smaller than that of the FCu wire when the frequency is 9 kHz or higher.

Figure 29:
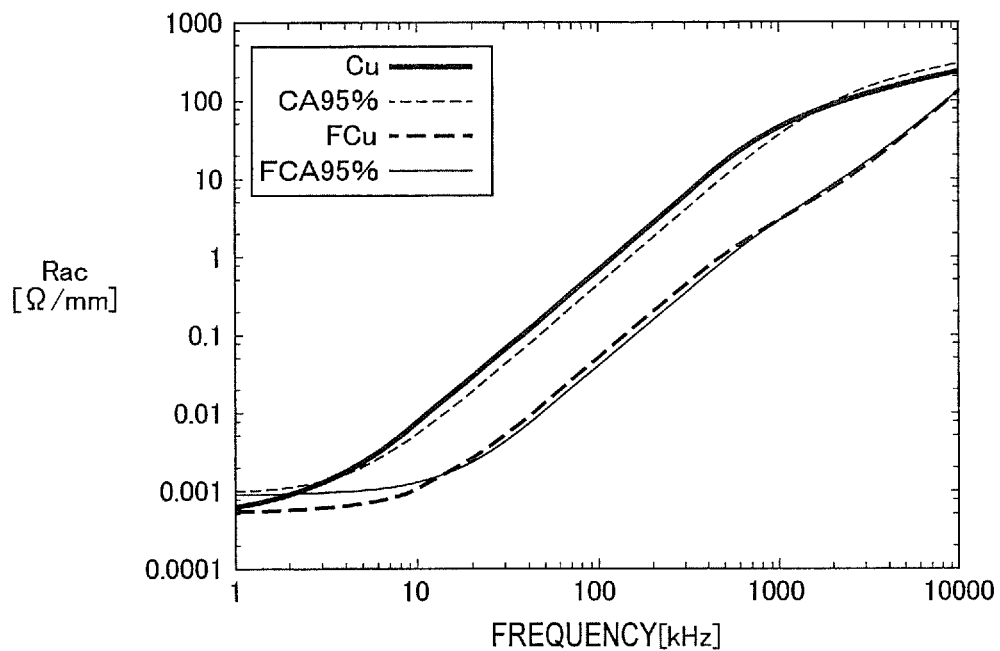
FIG. 29(a) is a graph showing a relationship between frequency and AC resistance (theoretical values) in a coil using each of conductive wires having a diameter of 0.2 mm and different constitutions.
FIG. 29(b) is a table showing the AC resistance (theoretical values) at specific frequencies in the coil using each of the conductive wires having a diameter of 0.2 mm and different constitutions.

FIG. 29(*a*) and FIG. 29(*b*) each show the calculation result of the AC resistance $R_{ac}$ under the same conditions as FIG. 27(*a*) and FIG. 27(*b*) other than α which is 500 mm$^{-1}$. As shown in FIG. 29(*a*), the AC resistance $R_{ac}$ of the FCA wire is smaller than that of the CA wire when the frequency is 1 kHz or higher. The AC resistance $R_{ac}$ of the FCA wire is smaller than that of the Cu wire when the frequency is 2.2 kHz or higher. The AC resistance $R_{ac}$ of the FCA wire is smaller than that of the FCu wire when the frequency is 17 kHz or higher.

Figure 30:
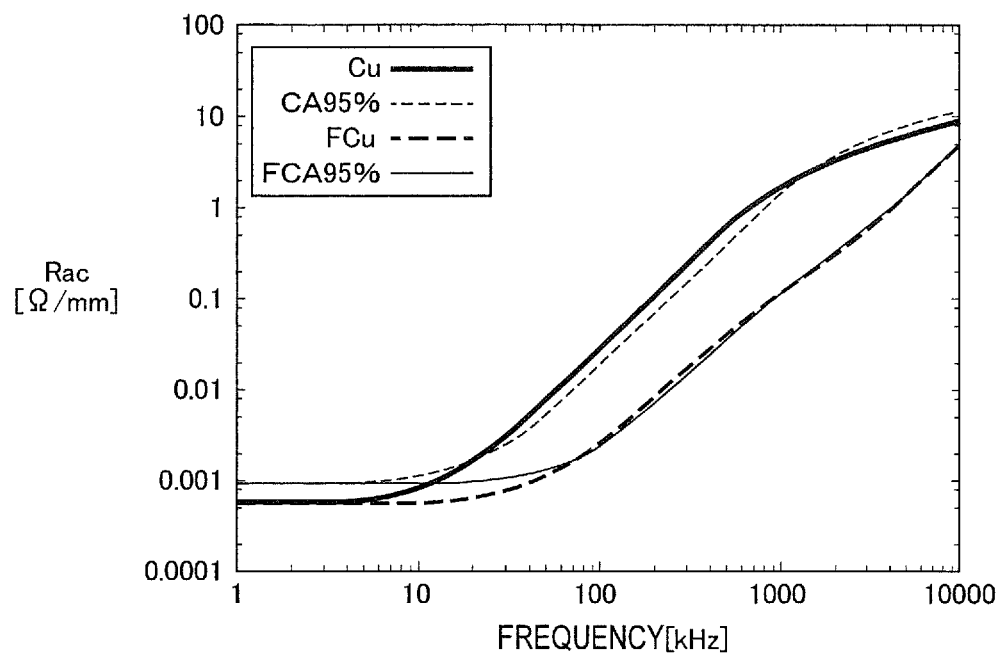
FIG. 30(a) is a graph showing a relationship between frequency and AC resistance (theoretical values) in a coil using each of conductive wires having a diameter of 0.2 mm and different constitutions.
FIG. 30(b) is a table showing the AC resistance (theoretical values) at specific frequencies in the coil using each of the conductive wires having a diameter of 0.2 mm and different constitutions.

FIG. 30(*a*) and FIG. 30(*b*) each show the calculation result of the AC resistance $R_{ac}$ under the same conditions as FIG. 27(*a*) and FIG. 27(*b*) other than α which is 100 mm$^{-1}$. As shown in FIG. 30(*a*), the AC resistance $R_{ac}$ of the FCA wire is smaller than that of the CA wire when the frequency is 1 kHz or higher. The AC resistance $R_{ac}$ of the FCA wire is smaller than that of the Cu wire when the frequency is 12 kHz or higher. The AC resistance $R_{ac}$ of the FCA wire is smaller than that of the FCu wire when the frequency is 85 kHz or higher.

Figure 31:
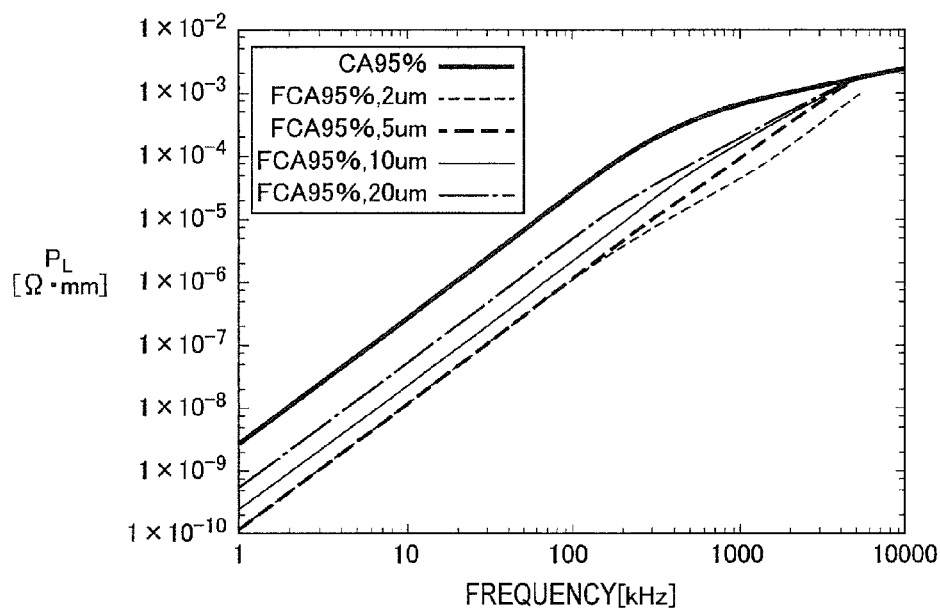
FIG. 31(a) is a graph showing an influence of a thickness of a ferromagnetic layer in each conductive wire having a diameter of 0.4 mm (theoretical values of loss due to a proximity effect).
FIG. 31(b) is a graph showing the influence of the thickness of the ferromagnetic layer in each conductive wire having a diameter of 0.4 mm (theoretical values of AC resistance due to a skin effect).
Figure 31:
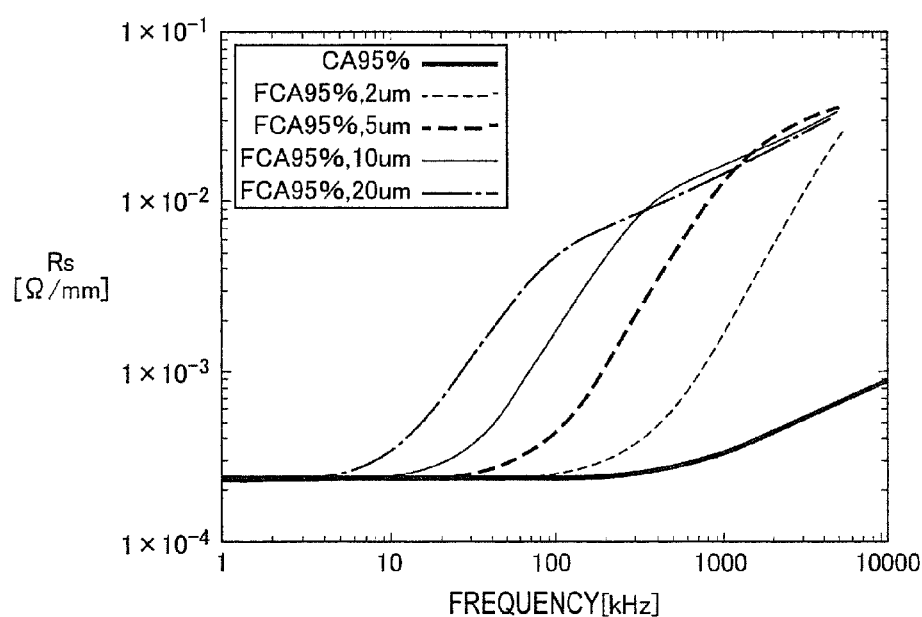

FIG. 31(*a*) and FIG. 31(*b*) show the calculation results of the loss $P_L$ due to the proximity effect and the AC resistance $R_s$ due to the skin effect, respectively, in each of the CA wire and the FCA wires having a common diameter of 0.4 mm and relative magnet permeability μr of the ferromagnetic layer 3 which is 100 and having different thicknesses of the ferromagnetic layer 3 which are 2 μm, 5 μm, 10 μm and 20 μm. As is apparent from FIG. 31(*a*), although the loss $P_L$ due to the proximity effect decreases when the ferromagnetic layer 3 is formed, the loss $P_L$ due to the proximity effect increases when the thickness of the ferromagnetic layer 3 excessively increases. In other words, an optimum thickness of the ferromagnetic layer 3 by which the loss $P_L$ due to the proximity effect is minimized was detected. As is apparent from FIG. 31(*b*), the AC resistance $R_s$ due to the skin effect on the low frequency side is smaller but the AC resistance $R_s$ due to the skin effect on the high frequency side is higher as the thickness of the ferromagnetic layer 3 increases.

Figure 32:
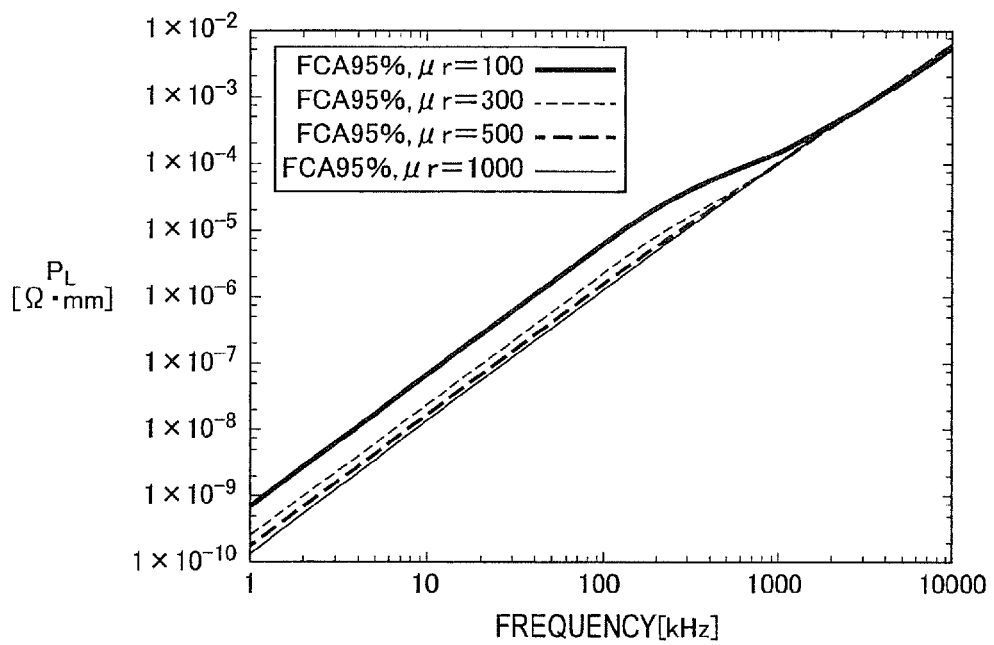
FIG. 32(a) is a graph showing an influence of magnetic permeability of the ferromagnetic layer in each conductive wire having a diameter of 0.4 mm (theoretical values of loss due to a proximity effect).
FIG. 32(b) is a graph showing the influence of the magnetic permeability of the ferromagnetic layer in each conductive wire having a diameter of 0.4 mm (theoretical values of AC resistance due to a skin effect).
Figure 32:
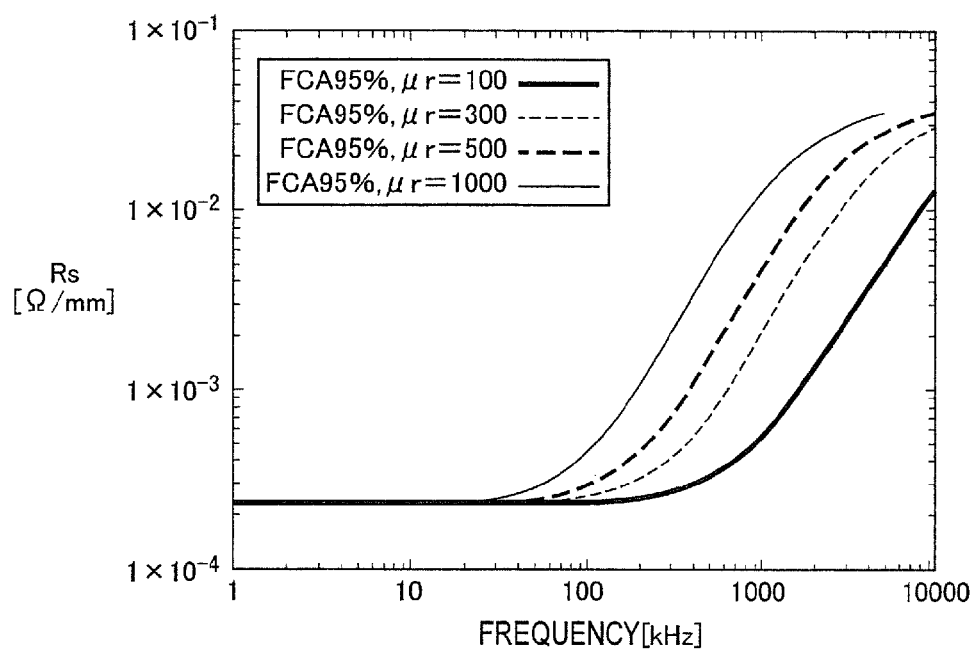

FIG. 32(*a*) and FIG. 32(*b*) show the calculation results of the loss $P_L$ due to the proximity effect and the AC resistance $R_s$ due to the skin effect, respectively, in each of the FCA wires having a common diameter of 0.4 mm and thickness of the ferromagnetic layer 3 which is 5 μm and having different relative magnet permeability μr of the ferromagnetic layer 3 which are 100, 300, 500 and 1000. As is apparent from FIG. 32(*a*), the loss $P_L$ due to the proximity effect is lower as the relative magnet permeability μr of the ferromagnetic layer 3 is higher; however, the difference of the loss among the wires decreases when the relative magnet permeability μr increases to a certain extent. It is apparent from FIG. 32(*b*) that the AC resistance $R_s$ due to the skin effect on the high frequency side is higher as the relative magnet permeability μr of the ferromagnetic layer 3 is higher.

Figure 33:
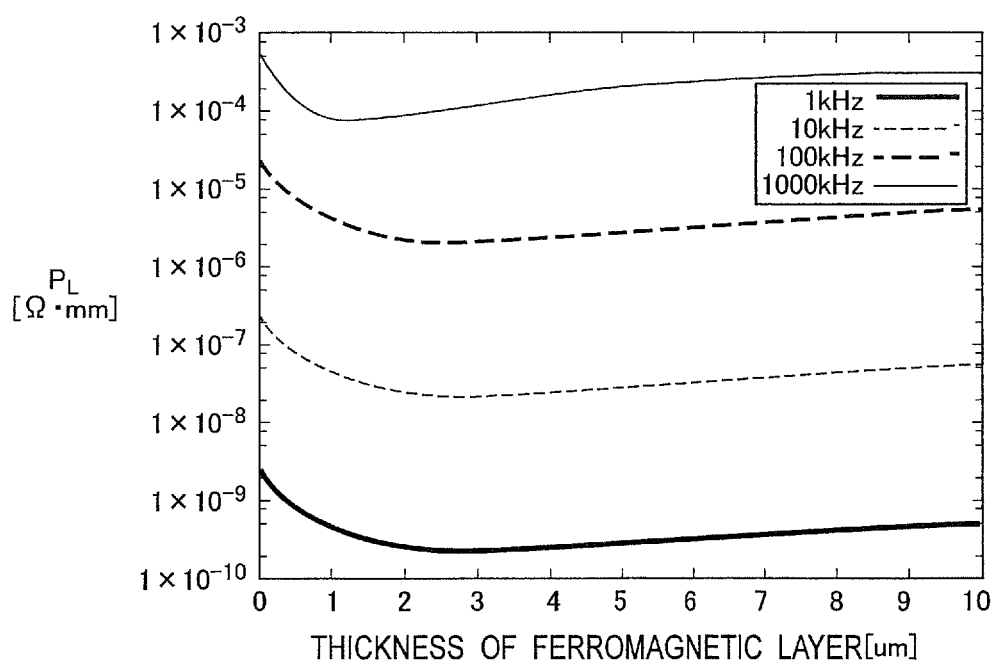
FIG. 33(a) is a graph showing an influence of a thickness of the ferromagnetic layer in each conductive wire having a diameter of 0.4 mm (theoretical values of loss due to a proximity effect).
FIG. 33(b) is a table showing the thickness of the ferromagnetic layer by which the loss due to the proximity effect is minimized in each conductive wire having a diameter of 0.4 mm.
Figure 36:
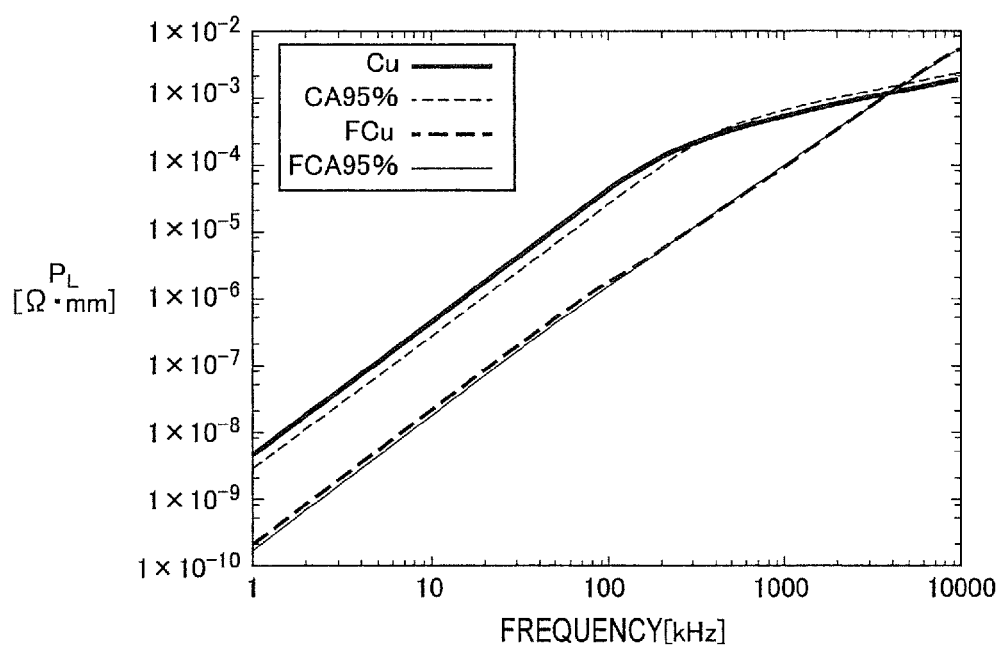
FIG. 36(a) is a graph showing a relationship between frequency and loss due to a proximity effect (theoretical values) in each of conductive wires having a diameter of 0.4 mm and different constitutions.
FIG. 36(b) is a graph showing a relationship between frequency and AC resistance due to a skin effect (theoretical values) in each of the conductive wires having a diameter of 0.4 mm and different constitutions.
Figure 36:
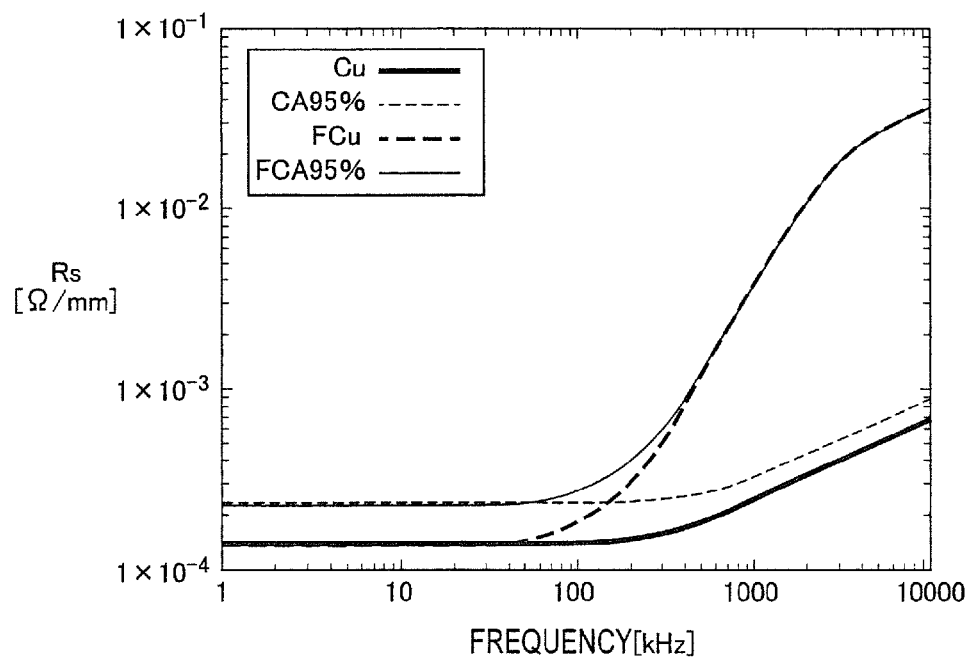
Figure 37:
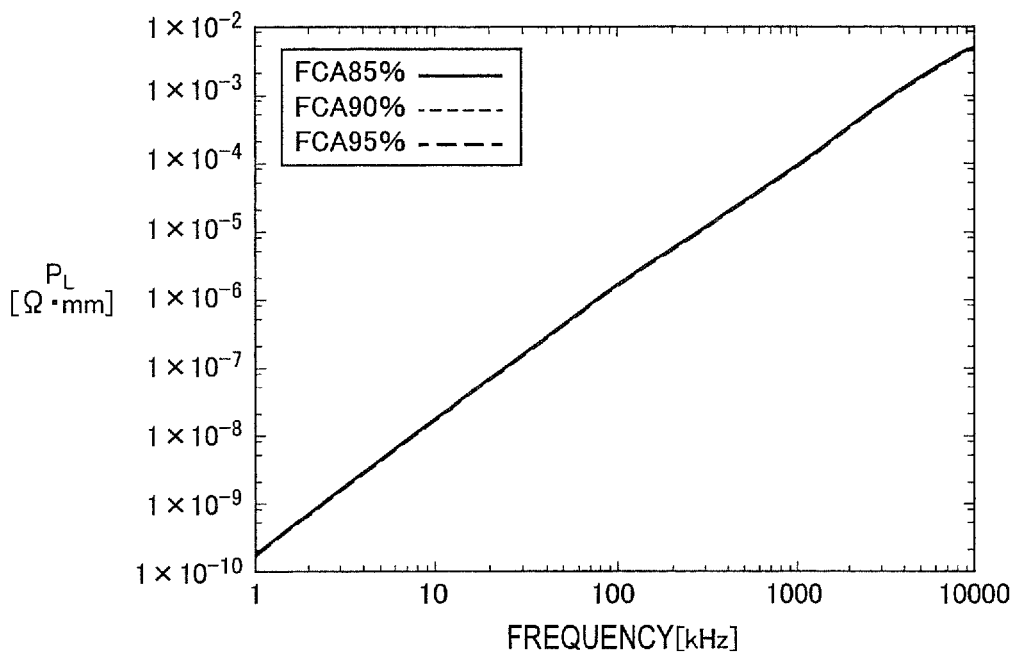
FIG. 37(a) is a graph showing a relationship between frequency and loss due to a proximity effect (theoretical values) in each of conductive wires having a diameter of 0.4 mm and different constitutions.
FIG. 37(b) is a graph showing a relationship between frequency and AC resistance due to a skin effect (theoretical values) in each of the conductive wires having a diameter of 0.4 mm and different constitutions.
Figure 37:
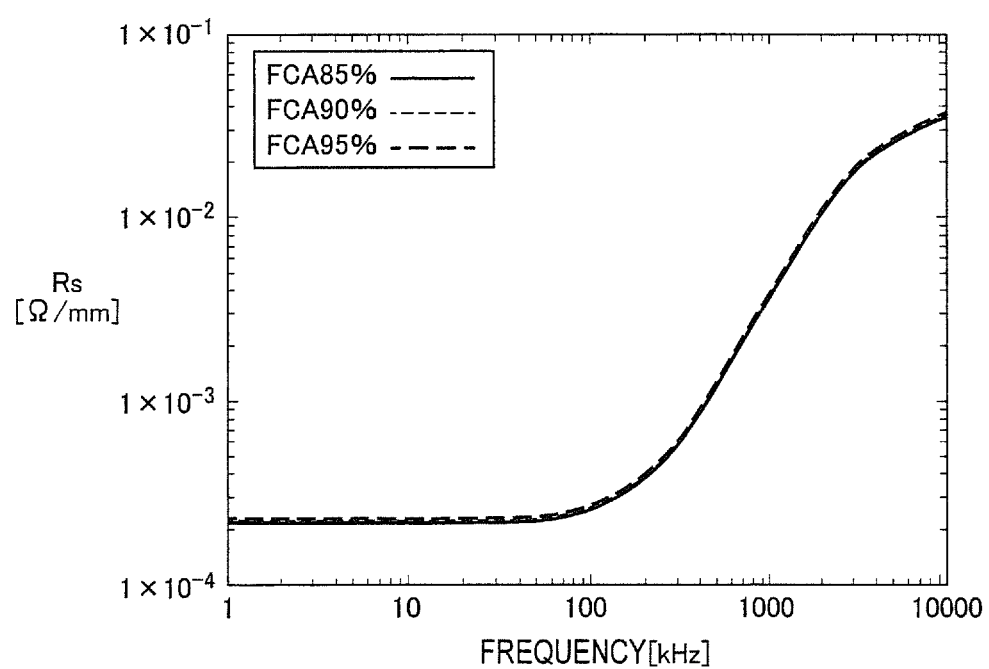
Figure 38:
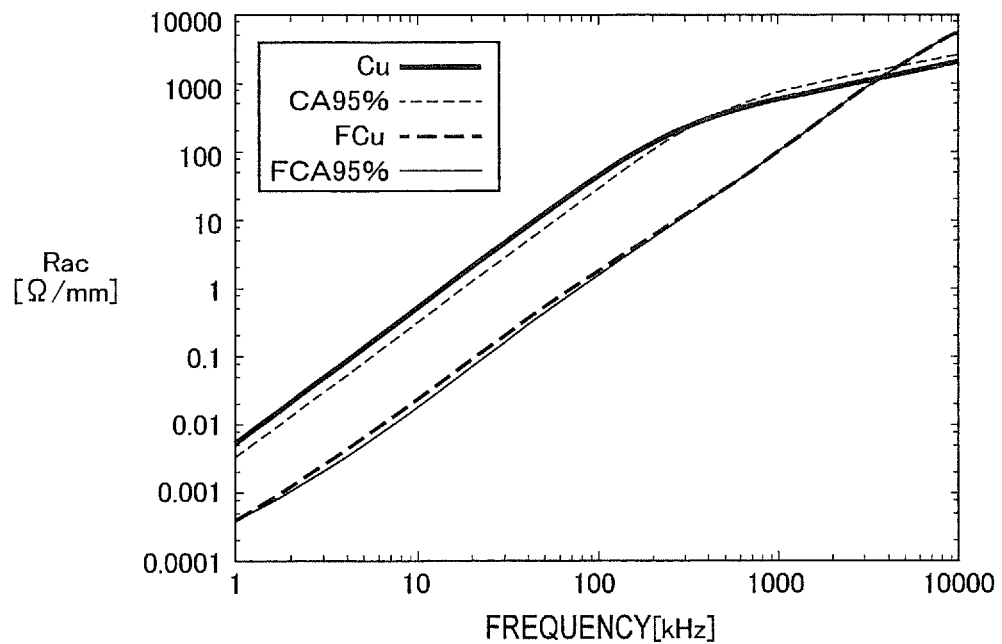
FIG. 38(a) is a graph showing a relationship between frequency and AC resistance (theoretical values) in a coil using each of conductive wires having a diameter of 0.4 mm and different constitutions.
FIG. 38(b) is a table showing the AC resistance (theoretical values) at specific frequencies in the coil using each of the conductive wires having a diameter of 0.4 mm and different constitutions.
Figure 39:
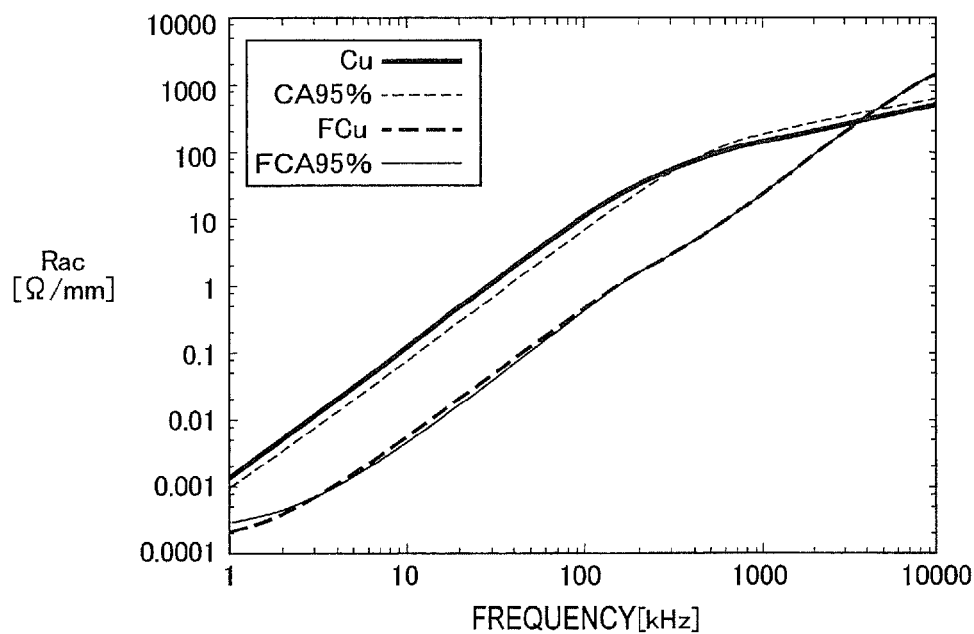
FIG. 39(a) is a graph showing a relationship between frequency and AC resistance (theoretical values) in a coil using each of conductive wires having a diameter of 0.4 mm and different constitutions.
FIG. 39(b) is a table showing the AC resistance (theoretical values) at specific frequencies in the coil using each of the conductive wires having a diameter of 0.4 mm and different constitutions.
Figure 40:
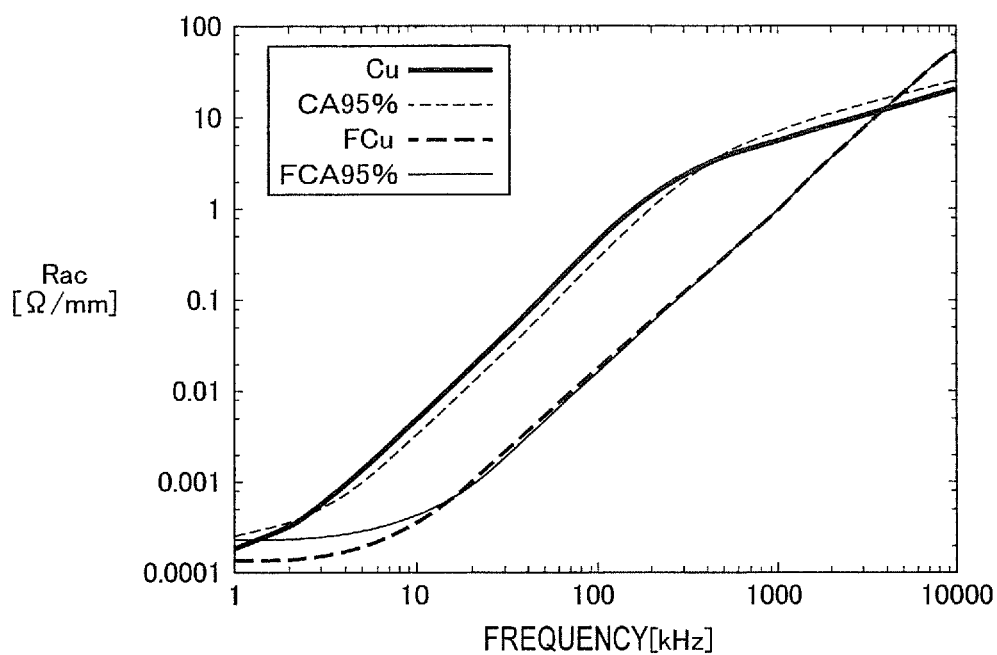
FIG. 40(a) is a graph showing a relationship between frequency and AC resistance (theoretical values) in a coil using each of conductive wires having a diameter of 0.4 mm and different constitutions.
FIG. 40(b) is a table showing the AC resistance (theoretical values) at specific frequencies in the coil using each of the conductive wires having a diameter of 0.4 mm and different constitutions.
Figure 41:
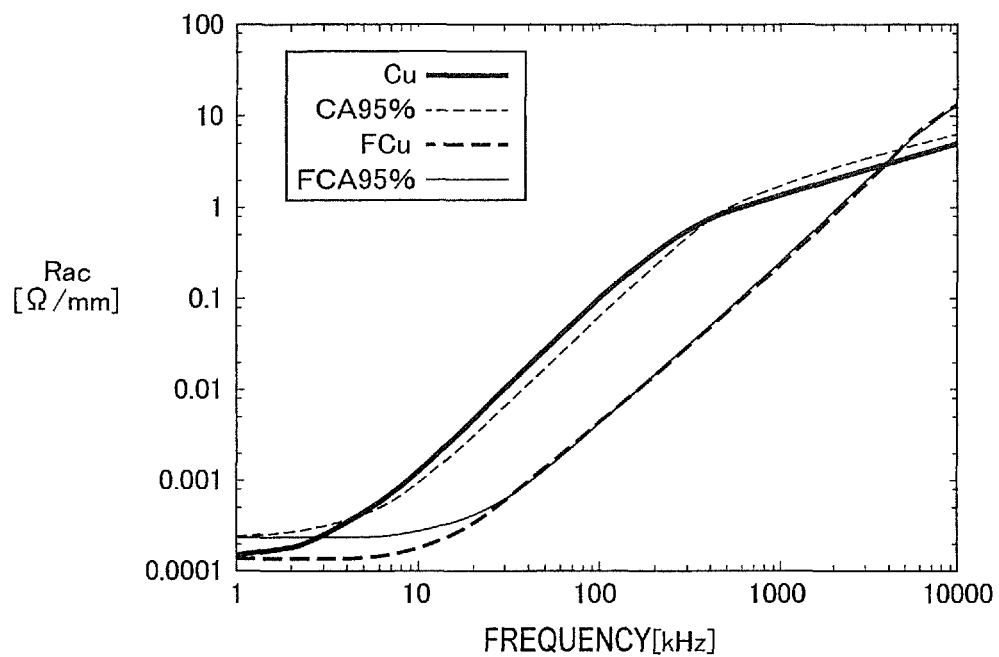
FIG. 41(a) is a graph showing a relationship between frequency and AC resistance (theoretical values) in a coil using each of conductive wires having a diameter of 0.4 mm and different constitutions.
FIG. 41(b) is a table showing the AC resistance (theoretical values) at specific frequencies in the coil using each of the conductive wires having a diameter of 0.4 mm and different constitutions.

FIG. 33(*a*) shows the calculation result of the loss $P_L$ due to the proximity effect in each of the FCA wires having a common diameter of 0.4 mm, relative magnet permeability μr of the ferromagnetic layer 3 which is 300, b=0.200 mm and c=0.195 mm and having different a in the range from 0.200 mm to 0.210 mm. It is apparent from FIG. 33(*a*) that the loss $P_L$ due to the proximity effect depends on the thickness of the ferromagnetic layer 3 and the frequency. In addition, an optimum thickness of the ferromagnetic layer 3 by which the loss $P_L$ due to the proximity effect is minimized was detected. FIG. 33(*b*) shows the optimum thickness (the unit is μm) of the ferromagnetic layer 3 by which the loss $P_L$ due to the proximity effect is minimized in each of the same conductive wires as those shown in FIG. 33(*a*).

FIG. 34(*a*) to FIG. 34(*d*) and FIG. 35(*a*) to FIG. 35(*d*) each show the optimum thickness (the unit is μm) of the ferromagnetic layer 3 by which the loss $P_L$ due to the proximity effect is minimized in each of the FCA wires having a diameter of 0.4 mm and having different relative magnet permeability μr and frequencies. According to FIG. 34(*a*) to FIG. 34(*d*) and FIG. 35(a) to FIG. 35(d), the optimum thickness of the ferromagnetic layer 3 is in the range from 0.31 μm to 11.58 μm. As is apparent from FIG. 34(a) to FIG. 34(d) and FIG. 35(a) to FIG. 35(d), the optimum thickness of the ferromagnetic layer 3 by which the loss $P_L$ due to the proximity effect is minimized decreases as the proportion of the central conductor 1 increases. In addition, the optimum thickness of the ferromagnetic layer 3 decreases as the relative magnet permeability μr increases, and the optimum thickness of the ferromagnetic layer 3 generally decreases as the frequency is higher.

FIG. 36(a) and FIG. 36(b) show the calculation results of the loss $P_L$ due to the proximity effect and the AC resistance $R_s$ due to the skin effect, respectively, in each of the Cu wire, the 95%-CA wire, the FCu wire and the 95%-FCA wire having a common diameter of 0.4 mm, relative magnet permeability μr of the ferromagnetic layer 3 which is 500 and thickness of the ferromagnetic layer 3 which is 4.5 μm. It is apparent from FIG. 36(a) that the loss $P_L$ due to the proximity effect of the FCA wire is approximately 1/10 of the Cu wire or the CA wire. As is apparent from FIG. 36(b), the AC resistance $R_s$ due to the skin effect of the FCA wire is higher than that of the FCu wire; however, the loss $P_L$ due to the proximity effect of the FCA wire is smaller than that of the FCu wire as shown in FIG. 36(a).

FIG. 37(a) and FIG. 37(b) show the calculation results of the loss $P_L$ due to the proximity effect and the AC resistance $R_s$ due to the skin effect, respectively, in each of the FCA wires having a common diameter of 0.4 mm, relative magnet permeability μr of the ferromagnetic layer 3 which is 500 and thickness of the ferromagnetic layer 3 which is 4.5 μm and having different proportions of the central conductor 1. With regard to the loss $P_L$ due to the proximity effect shown in FIG. 37(a), the maximum ratio of the 85%-FCA wire to the 95%-FCA wire is 1.05 to 1, and the maximum ratio of the 90%-FCA wire to the 95%-FCA wire is 1.03 to 1. It is apparent from FIG. 37(b) that the AC resistance $R_s$ due to the skin effect is higher as the proportion of the central conductor 1 is higher.

FIG. 38(a) and FIG. 38(b) each show the calculation result of the AC resistance $R_{ac}$ in a coil using each of conductive wires having a common diameter of 0.4 mm, relative magnet permeability μr=500, thickness of the ferromagnetic layer 3 which is 4.5 μm and α=1000 mm$^{-1}$. As shown in 38(a), the AC resistance $R_{ac}$ of the FCA wire is smaller than that of the CA wire or the Cu wire when the frequency is 1 kHz or higher. The AC resistance $R_{ac}$ of the FCA wire is smaller than that of the FCu wire when the frequency is 1.8 kHz or higher.

FIG. 39(a) and FIG. 39(b) each show the calculation result of the AC resistance $R_{ac}$ under the same conditions as FIG. 38(a) and FIG. 38(b) other than α which is 500 mm$^{-1}$. As shown in FIG. 39(a), the AC resistance $R_{ac}$ of the FCA wire is smaller than that of the CA wire or the Cu wire when the frequency is 1 kHz or higher. The AC resistance $R_{ac}$ of the FCA wire is smaller than that of the FCu wire when the frequency is 3.1 kHz or higher.

FIG. 40(a) and FIG. 40(b) each show the calculation result of the AC resistance $R_{ac}$ under the same conditions as FIG. 38(a) and FIG. 38(b) other than α which is 100 mm$^{-1}$. As shown in FIG. 40(a), the AC resistance $R_{ac}$ of the FCA wire is smaller than that of the CA wire when the frequency is 1 kHz or higher. The AC resistance $R_{ac}$ of the FCA wire is smaller than that of the Cu wire when the frequency is 1.4 kHz or higher. The AC resistance $R_{ac}$ of the FCA wire is smaller than that of the FCu wire when the frequency is 15 kHz or higher.

FIG. 41(a) and FIG. 41(b) each show the calculation result of the AC resistance $R_{ac}$ under the same conditions as FIG. 38(a) and FIG. 38(b) other than α which is 50 mm$^{-1}$. As shown in FIG. 41(a), the AC resistance $R_{ac}$ of the FCA wire is smaller than that of the CA wire when the frequency is 1 kHz or higher. The AC resistance $R_{ac}$ of the FCA wire is smaller than that of the Cu wire when the frequency is 3 kHz or higher. The AC resistance $R_{ac}$ of the FCA wire is smaller than that of the FCu wire when the frequency is 31 kHz or higher.

FIG. 42(a) to FIG. 42(c) each show the calculation result of the optimum thickness (the unit is μm) of the ferromagnetic layer 3 by which the loss $P_L$ due to the proximity effect is minimized in each of the 95%-FCA wires having different diameters of 0.05 mm, 0.2 mm and 0.4 mm and having different relative magnet permeability μr and frequencies. As is apparent from FIG. 42(a) to FIG. 42(c), the optimum thickness of the ferromagnetic layer 3 generally decreases as the relative magnet permeability μr increases, and the optimum thickness of the ferromagnetic layer 3 generally decreases as the frequency is higher.

FIG. 43(a) to FIG. 43(c) each show the calculation result of the optimum thickness (the unit is μm) of the ferromagnetic layer 3 by which the loss $P_L$ due to the proximity effect is minimized in each of the 90%-FCA wires having different diameters of 0.05 mm, 0.2 mm and 0.4 mm and having different relative magnet permeability μr and frequencies. As is apparent from FIG. 43(a) to FIG. 43(c), the optimum thickness of the ferromagnetic layer 3 generally decreases as the relative magnet permeability μr increases, and the optimum thickness of the ferromagnetic layer 3 generally decreases as the frequency is higher.

FIG. 44(a) to FIG. 44(c) each show the calculation result of the optimum thickness (the unit is μm) of the ferromagnetic layer 3 by which the loss $P_L$ due to the proximity effect is minimized in each of the 85%-FCA wires having different diameters of 0.05 mm, 0.2 mm and 0.4 mm and having different relative magnet permeability μr and frequencies. As is apparent from FIG. 44(a) to FIG. 44(c), the optimum thickness of the ferromagnetic layer 3 generally decreases as the relative magnet permeability μr increases, and the optimum thickness of the ferromagnetic layer 3 generally decreases as the frequency is higher.

When examining each calculation result shown in FIG. 42(a) to FIG. 42(c), FIG. 43(a) to FIG. 43(c) and FIG. 44(a) to FIG. 44(c), it is apparent that the optimum thickness of the ferromagnetic layer 3 by which the loss $P_L$ due to the proximity effect is minimized generally decreases as the proportion of the central conductor 1 is higher.

As described above, the electric wire and the coil using the electric wire according to the first embodiment of the present invention can prevent the external magnetic field from entering therethrough due to the ferromagnetic layer 3, and reduce the eddy currents caused by the entrance of the unavoidable external magnetic field more surely than the FCu wire having the same diameter. This is because the volume resistivity of Al is higher than that of Cu and therefore the eddy current loss decreases even if an equivalent magnetic field enters.

Further, since the optimum thickness of the ferromagnetic layer 3 by which the eddy current loss is minimized was detected, the eddy current loss can be minimized by controlling the thickness of the ferromagnetic layer 3 according to the diameter of the electric wire, the ratio of the cross-sectional area of the central conductor 1 to the total cross-sectional area of the central conductor 1 and the cover layer 2, the frequency to be used and the relative magnetic permeability μr.

Further, the thickness of the ferromagnetic layer 3 by which the eddy current loss is minimized decreases compared with the FCu wire having the same diameter, so as to shorten the time required for the process of plating the ferromagnetic layer 3.

Next, a method for manufacturing the electric wire according to the first embodiment of the present invention is explained. It should be noted that the following manufacturing method is an example and the present invention is not limited thereto. The electric wire according to the first embodiment of the present invention may be manufactured by various manufacturing methods.

i) The central conductor 1 made of aluminum or an aluminum alloy having a diameter approximately in the range from 9.5 mm to 12.0 mm is prepared. The surface of the central conductor 1 is covered with the cover layer 2 in such a manner as to perform TIG welding, plasma welding, or the like while longitudinally attaching a copper tape having a thickness approximately in the range from 0.1 mm to 0.4 mm to the surface of the central conductor 1. Next, the central conductor 1 covered with the cover layer 2 is subjected to skin pass to have a diameter approximately in the range from 9.3 mm to 12.3 mm, so as to prepare a base material composed of the central conductor 1 covered with the cover layer 2.

ii) Next, the base material is drawn through drawing dies with multiple stages having approximately 25 to 26 passes. By allowing the base material to pass through the drawing dies with plural stages, the total diameter of the central conductor 1 and the cover layer 2 is set to approximately 0.6 mm or smaller. Here, the cover layer 2 may be formed on the surface of the central conductor 1 by electroplating.

iii) Subsequently, the ferromagnetic layer 3 including Ni or the like having a thickness approximately in the range from 0.5 μm to 10 μm is formed on the surface of the cover layer 2 by, for example, electroplating.

According to the method for manufacturing the electric wire of the first embodiment of the present invention, the electric wire can be manufactured capable of preventing an external magnetic field from entering therethrough due to the ferromagnetic layer 3 and reducing eddy currents caused by the entrance of the external magnetic field not completely prevented, so as to avoid a loss due to the proximity effect. Further, the thickness of the ferromagnetic layer 3 by which the eddy current loss is minimized decreases compared with the FCu wire having the same diameter so as to shorten the time required for the process of plating the ferromagnetic layer 3.

FIRST EXAMPLE

Figure 45:
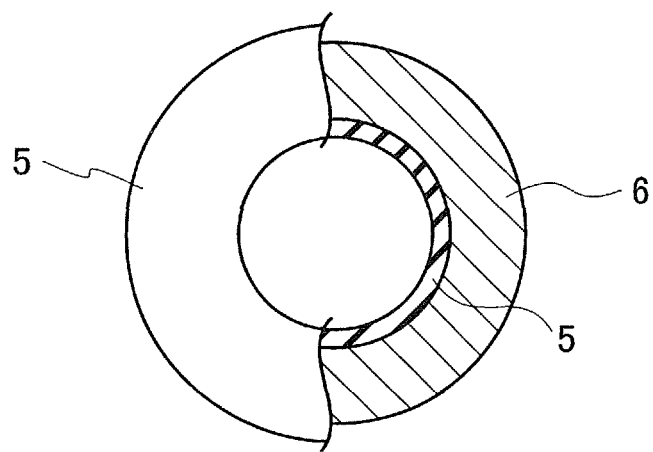
FIG. 45(*a*) is an upper view showing a winding wire according to a first example of the first embodiment of the present invention.
Figure 45:
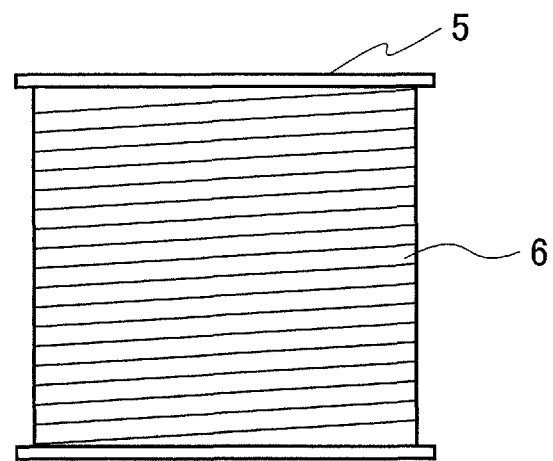

A winding wire according to a first example of the first embodiment of the present invention is exclaimed below. First, as a comparative example shown in FIG. 45(a) and FIG. 45(b), a Cu wire having a length of 7.3 m and including a bundle of 14 strands subjected to wire drawing to have a diameter of 0.4 mm, was covered with polyurethane and wound 80 turns around a bobbin 5, so as to manufacture a winding wire (Cu winding wire) 6. Next, a winding wire of a 95%-CA wire (a 95%-CA winding wire) was manufactured under the same conditions as the Cu winding wire 6. A reactor was prepared including the Cu winding wire 6 and the 95%-CA winding wire thus obtained. The DC resistance and the AC resistance were measured by use of the reactor, and the proportional coefficient α in the formula (61) described above was calculated.

Next, the resistance of a 95%-FCA wire manufactured as a winding wire (a 95%-FCA winding wire) according to the first example, was calculated according to the formula (62) described above by use of the actually measured proportional coefficient α, the 95%-FCA winding wire being formed into the same configuration under the same conditions as the Cu winding wire 6.

Figures 46, 47:
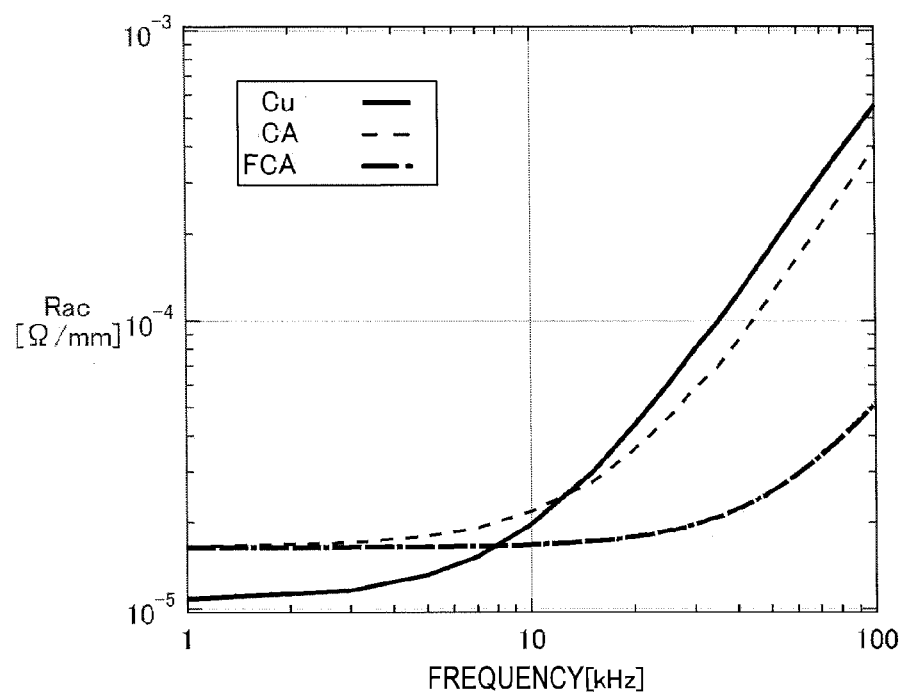
FIG. 46 is a graph showing a relationship between frequency and AC resistance (Cu and CA show observed values and FCA shows theoretical values) according to the first example of the first embodiment of the present invention.
FIG. 47 is a table showing conditions of a winding wire according to a second example of the first embodiment of the present invention.

FIG. 46 shows characteristics of the 95%-FCA winding wire according to the first example while comparing with the Cu winding wire or the CA winding wire manufactured as a comparative example. In comparison between the Cu winding wire and the 95%-FCA winding wire used in the reactors having the same inductance, it is apparent that the AC resistance is reduced by approximately 9.3% at 100 kHz although the DC resistance is 1.56 times.

SECOND EXAMPLE

A magnetic field generating coil for an IH cooker according to a second example of the first embodiment of the present invention is explained below. As shown in FIG. 47, magnetic field generating coils for an IH cooker were manufactured in a manner such that, as a Cu wire according to a comparative example, 55 strands each having a diameter of 0.4 mm and a length of 6.6 m were formed into a litz wire structure and wound 17 turns. The manufactured coils were subjected to the characteristic confirmation test so as to calculate the proportional coefficient α in the formula (58) described above.

Figure 48:
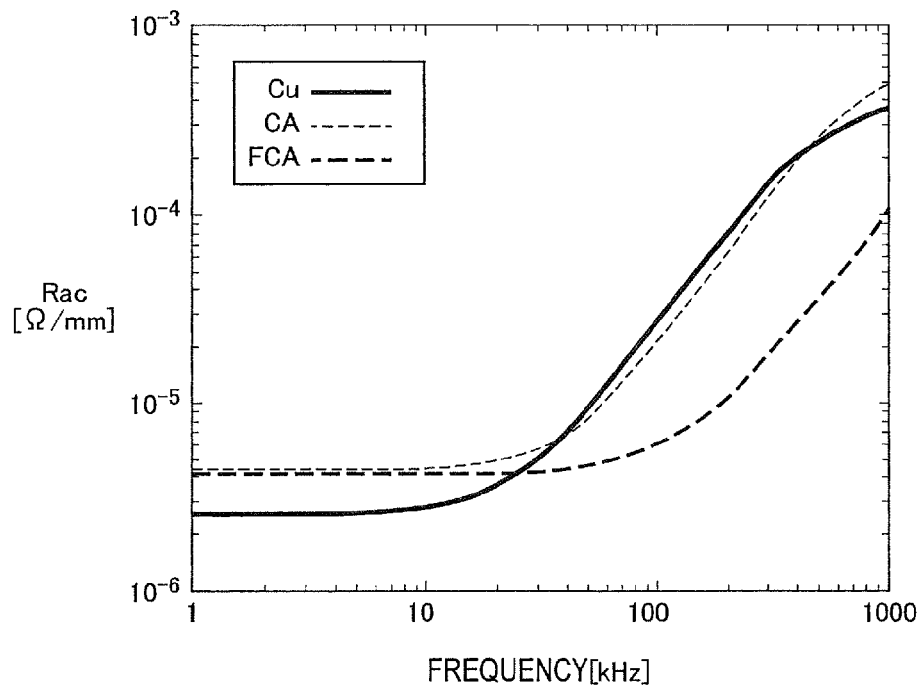
FIG. 48 is a graph showing a relationship between frequency and AC resistance (Cu and CA show observed values and FCA show theoretical values) according to the second example of the first embodiment of the present invention.

Next, the resistance of a 95%-FCA winding wire according to the second example was calculated according to the formula (59) described above by use of the actually measured proportional coefficient α, the 95%-FCA winding wire having a diameter of 0.4 mm being formed into the same configuration as the Cu winding wire. FIG. 48 shows the test results and the calculation results. In general, IH cookers use high frequency current approximately in the range from 20 kHz to 100 kHz. The results revealed that the AC resistance of the 95%-FCA winding wire is lower than that of the Cu winding wire. In comparison between the Cu winding wire and the 95%-FCA winding wire, it is also apparent that, although the resistance of the Cu winding wire is lower in the region from the DC resistance to 26 kHz, the resistance of the 95%-FCA winding wire is lower in the region above 26 kHz and reduced by approximately 21% at 100 kHz.

THIRD EXAMPLE

Figure 49:
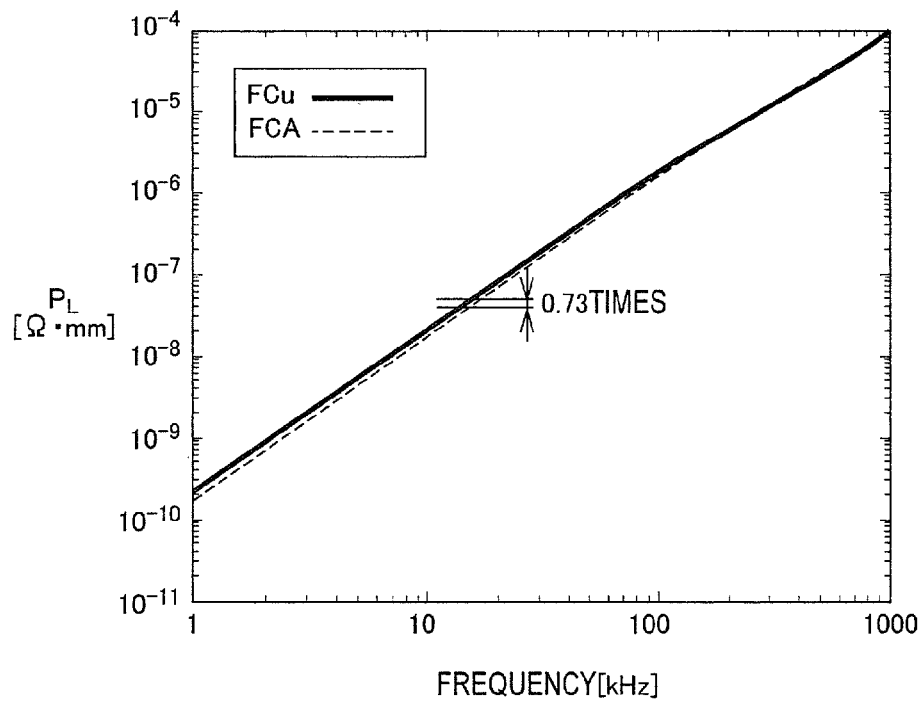
FIG. 49 is a graph showing a relationship between frequency and loss due to a proximity effect (theoretical values) according to a third example of the first embodiment of the present invention.

As a third example of the embodiment of the present invention, a calculation result of the loss $P_L$ due to the proximity effect is shown in FIG. 49 in each of a 95%-FCA wire and an FCu wire each having a diameter of 0.2 mm and having a common thickness and relative magnetic permeability of the ferromagnetic layer which are 2.3 μm and 300, respectively. It is apparent from FIG. 49 that the loss $P_L$ due to the proximity effect of the FCA wire is 0.73 times lower than that of the FCu wire.

Second Embodiment

Figure 50:
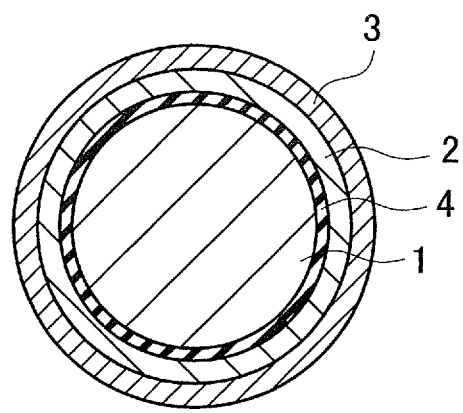
FIG. 50 is a cross-sectional view showing an example of an electric wire according to a second embodiment of the present invention.

An electric wire according to a second embodiment of the present invention includes, as shown in FIG. 50, a central conductor 1 made of aluminum (Al) or an aluminum alloy, a cover layer 2 made of Cu and covering the central conductor 1, a ferromagnetic layer 3 covering the cover layer 2 and blocking an external magnetic field, and an intermetallic compound layer (an alloy layer) 4 having larger volume resistivity than the cover layer 2 and interposed between the central conductor 1 and the cover layer 2 in a manner such that the composition thereof obliquely changes from the central conductor 1 to the cover layer 2.

The cross-sectional area of the cover layer 2 is smaller than or equal to 15%, preferably approximately in the range from 3% to 15%, more preferably approximately in the range from 3% to 10%, still more preferably approximately in the range from 3% to 5%, of the total cross-sectional area of the central conductor 1, the intermetallic compound layer 4 and the cover layer 2. As the ratio of the cross-sectional area of the cover layer 2 is smaller, the AC resistance decreases. The entire diameter of the electric wire is preferably approximately in the range from 0.05 mm to 0.6 mm, more preferably approximately in the range from 0.05 mm to 0.4 mm.

The central conductor 1 may be made of, for example, electrical aluminum (EC aluminum) or an aluminum alloy such as an Al—Mg—Si alloy (JIS6000s). The aluminum alloy is more preferable than the EC aluminum because the volume resistivity of the aluminum alloy is higher than that of the EC aluminum.

The material of the ferromagnetic layer 3 may be nickel (Ni), a Ni—Fe alloy, an iron alloy (such as electromagnetic soft iron and silicon steel), Permalloy (such as 78 Permalloy and Mumetal), a ferrite compound (such as Mn—Zr ferrite) or an amorphous ferromagnetic body. The material of the ferromagnetic layer 3 preferably includes a material suitable for electroplating. The ferromagnetic layer 3 has relative magnetic permeability, for example, approximately in the range from 100 to 1000. The relative magnetic permeability of the ferromagnetic layer 3 may be approximately in the range from 1000 to 10000, or may be 10000 or greater. The thickness of the ferromagnetic layer 3 is approximately in the range from 0.5 μm to 10 μm.

The intermetallic compound layer 4 is produced in a manner such that the central conductor 1 covered with the cover layer 2 is subjected to wire drawing by use of drawing dies with multiple stages each having a cross-section reduction rate of 20% or higher in the drawing process of the electric wire. The thickness of the intermetallic compound layer 4 is approximately in the range from 10 nm to 1 μm. The intermetallic compound layer 4 includes, for example, $Cu_9Al_4$ and $CuAl_2$. The volume resistivity of the intermetallic compound layer 4 is larger than that of the cover layer 2, and is, for example, approximately in the range from 10 μΩcm to 40 μΩcm.

In general, a winding wire used for a transformer, a reactor, or the like is composed of a Cu wire subjected to insulation coating with polyurethane, polyester, polyesterimide, polyamide-imide, or polyimide. In a coaxial cable, for example, a copper-clad Al wire (a CA wire) in which the periphery of an Al wire is covered with a thin Cu layer is used in the light of the skin effect characteristics because of high frequency current signals.

In recent years, devices to which high frequency current of several kHz (for example, 1 kHz) to several hundreds kHz (for example, 300 kHz) is applied are widely used, including a high frequency transformer, a high-speed motor, a reactor, an induction heater, a magnetic head device and a non-contact power supply. In electric wires used in such devices, wires having reduced diameters or litz wires are generally used for the purpose of a decrease in alternating-current loss. However, there is a limit of the reduction in diameter of the wires because of difficulty of the process of removing insulation films of the wires during a solder treatment for wire connection and because of an increase in the number of strands. The electric wire according to the second embodiment of the present invention, however, can achieve the reduction in diameter and further ensure the effect of preventing an increase in AC resistance without using litz wires.

Figure 51:
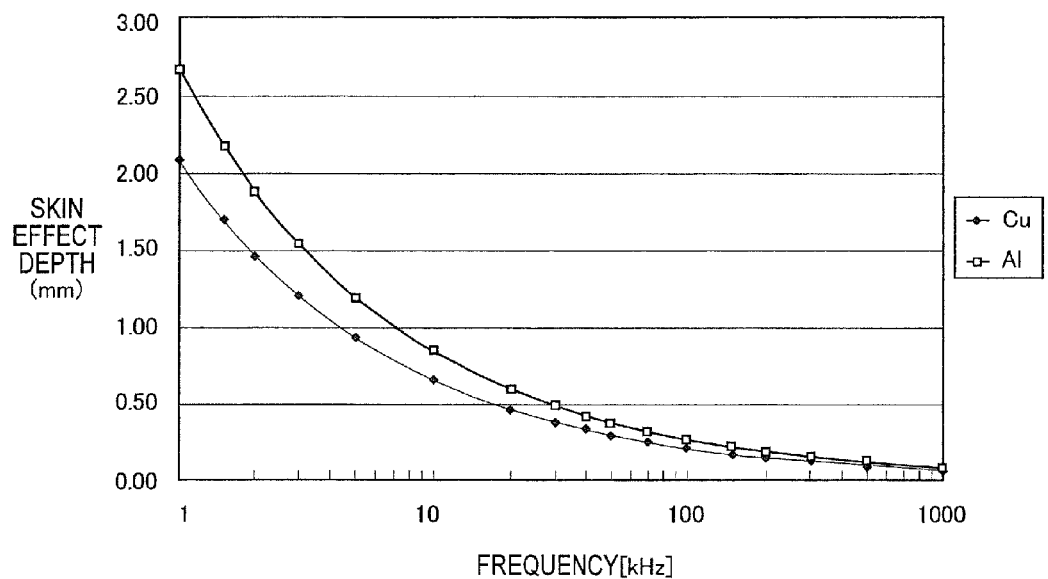
FIG. 51 is a graph showing a relationship between a skin depth and frequency (theoretical values in a solid wire model of a single electric wire) according to the second embodiment of the present invention.

FIG. 51 shows a relationship between frequency and skin depth in a solid wire model of a single electric wire. The skin depth represents a depth from the surface of the wire at which a current density is 1/e (approximately 0.37) of the surface. It is apparent from FIG. 51 that the influence of the skin effect is small in the strand diameter of 0.5 mm (equivalent to twice the skin depth of 0.25 mm) when the applied frequency is approximately 100 kHz or lower.

Figure 52:
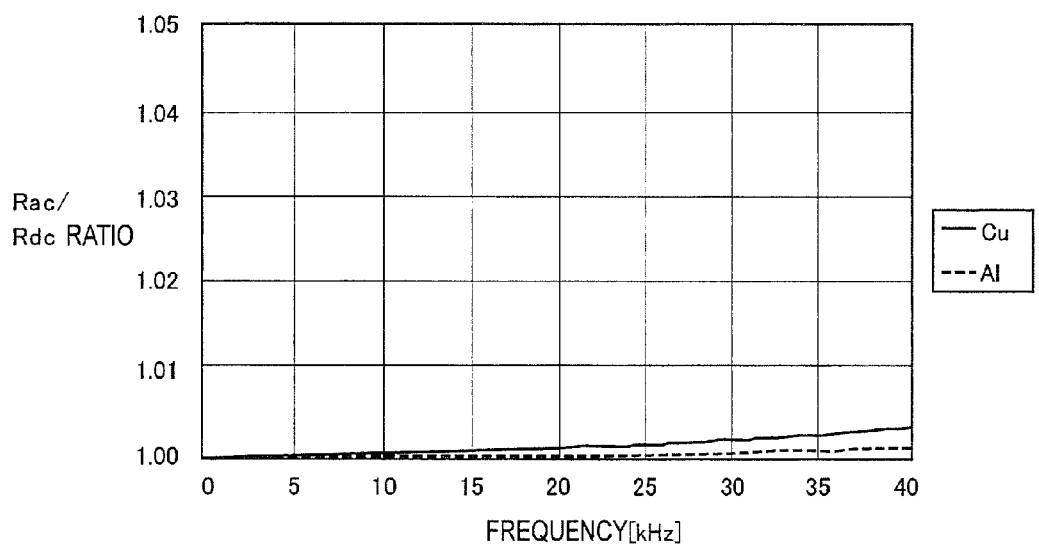
FIG. 52 is a graph showing a relationship between a skin effect and frequency (theoretical values in a solid wire model of a single electric wire) of each of a Cu wire and an Al wire according to the second embodiment of the present invention.
Figure 53:
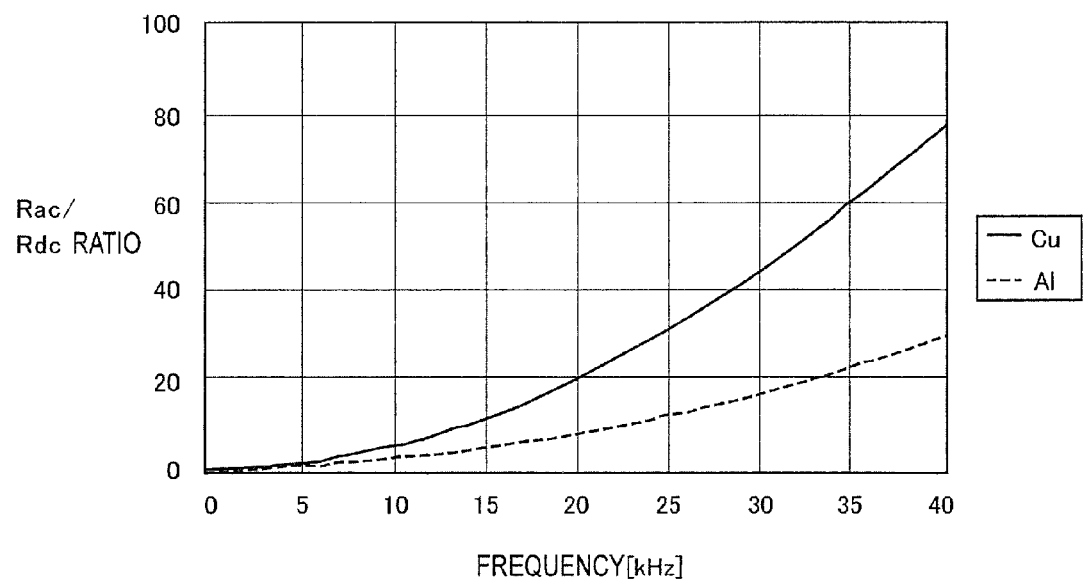
FIG. 53 is a graph showing a relationship between a proximity effect and frequency (theoretical values in a solid wire model of a single electric wire) of each of the Cu wire and the Al wire according to the second embodiment of the present invention.

FIG. 52 and FIG. 53 each show AC resistance-frequency characteristics according to the skin effect and the proximity effect indicated by the ratio of AC resistance Rac to DC resistance Rdc (Rac/Rdc) in a solid wire model of a single electric wire having a diameter of 0.4 mm. In FIG. 53, an external magnetic field H was set to 37.8 A/mm. The increase of Rac/Rdc according to the skin effect in FIG. 52 tends to be smaller than that according to the proximity effect in FIG. 53. In the case of the proximity effect in FIG. 53, Rac/Rdc significantly increases as the frequency is higher. The increase tendency depends on the intensity of the external magnetic field. Namely, with regard to the AC loss due to high frequency current in the winding wire having a reduced diameter, the proximity effect is dominant. According to the theoretical calculation results, it is apparent that the Al wire has smaller proximity effect characteristics than the Cu wire. The results revealed that the increase in volume resistivity of the conductor is an effective measure against the proximity effect in addition to the decrease in diameter of the conductor to the extent possible. However, since there is a limit of the increase in volume resistivity, a conductor material is preferably selected from commonly-used materials. In comparison between copper and Al which are general-purpose conductor materials, Al having conductivity which is approximately 61% of copper has superior proximity effect reduction characteristics. However, the surface of Al is covered with an oxide film, and the removal thereof from a thin wire particularly used as a measure against the proximity effect is extremely difficult. In view of this, a CA wire obtained in a manner such that the periphery of an Al wire is covered with thin copper was brought into focus.

In the case of the CA wire, however, since the volume resistivity of copper is smaller than that of Al, eddy currents caused by an external magnetic field are gathered on the copper side and are likely to flow in the longitudinal direction of the wire. As a result, the fundamental characteristics are spoiled even if Al having the proximity effect smaller than copper is used in the central conductor.

Figure 54:
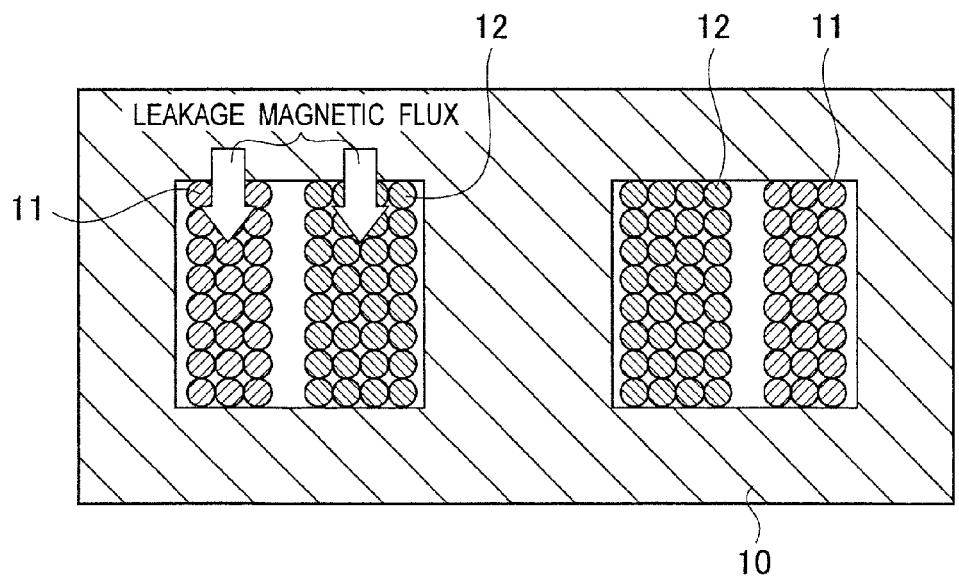
FIG. 54 is a schematic view of magnetic fluxes caused by currents of a magnetic core and leakage magnetic fluxes in a transformer model in which an integrated conductor is wound around an iron core according to the second embodiment of the present invention.

FIG. 54 shows a high frequency transformer model as an actual example of high frequency power devices. The high frequency transformer model includes a magnetic core 10, and first winding wires 11 and second winding wires 12 which are wound around the magnetic core 10. In addition to magnetic fluxes due to currents flowing in the neighboring first and second winding wires 11 and 12, leakage magnetic fluxes from the magnetic core 10 also flow in the first and second winding wires 11 and 12, so that eddy current losses occur due to such external magnetic fluxes. Therefore, in the high frequency transformer model, the increase in AC resistance is greater than that in the solid wire model of the single electric wire.

Figure 55:
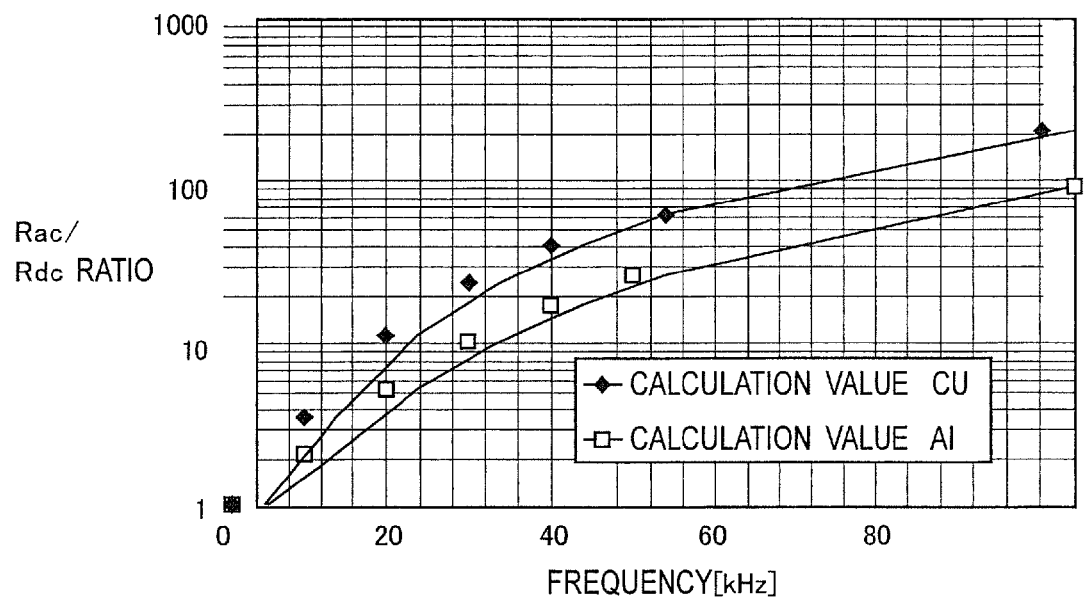
FIG. 55 is a graph showing characteristics (theoretical values) of a high frequency transformer according to the second embodiment of the present invention.

FIG. 55 shows theoretical calculation values of AC resistance-frequency characteristics indicated by Rac/Rdc in the high frequency transformer model shown in FIG. 54. It is also apparent in this actual model that the AC resistance is reduced in the Al wire more greatly than the Cu wire. The above-mentioned superiority of the Al wire is derived from the fact that Al has greater volume resistivity than Cu. On the contrary, Al has difficulty in soldering. Therefore, a CA wire may be appropriate as it can cover the defects of Al in practice. However, since the copper layer is provided on the outer side, eddy currents flow in the copper layer, which causes deterioration in the fundamental characteristics of the Al wire.

Figure 56:
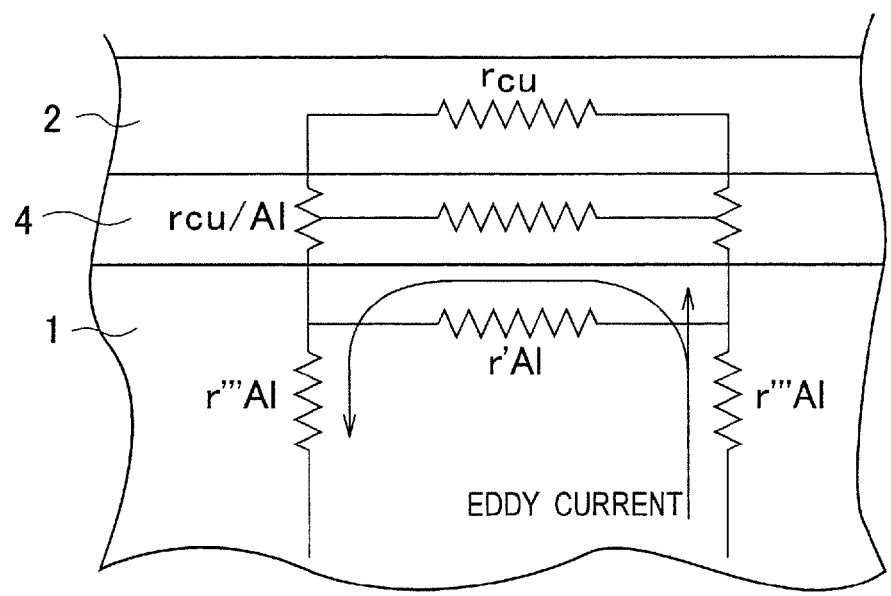
FIG. 56 is a view showing a segment model of eddy currents and an equivalent circuit thereof according to the second embodiment of the present invention.

The electric wire according to the second embodiment of the present invention, however, can suppress the eddy currents flowing from the central conductor 1 toward the cover layer 2 as shown in FIG. 56 due to the intermetallic compound layer 4 shown in FIG. 50 having higher volume resistivity than the cover layer 2. As a result, the skin effect and the proximity effect can be suppressed. Further, the production of the intermetallic compound layer 4 in the interface between the central conductor 1 and the cover layer 2 provides a wire diameter which is equivalently reduced by the thickness of the cover layer 2 so as to decrease the proximity effect. Accordingly, the AC resistance can be suppressed without using twisted wires (litz wires), and heat generation and power consumption can be decreased.

Further, a magnetic field can be prevented from entering due to the ferromagnetic layer 3, and eddy currents caused by the entrance of the unavoidable external magnetic field can be reduced more surely than the FCu wire. This is because the volume resistivity of Al is higher than that of Cu and therefore the eddy current loss decreases even if an equivalent magnetic field enters. As a result, the resistance in the high frequency region can be decreased.

Further, the thickness of the ferromagnetic layer 3 by which the eddy current loss is minimized decreases compared with the FCu wire having the same diameter, so as to shorten the time required for the process of plating the ferromagnetic layer 3.

Figure 57:
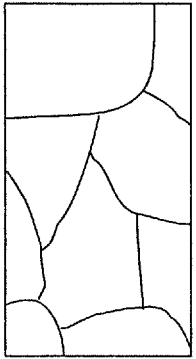
FIG. 57 is a table showing a structure and characteristics (observed values) in each of an electric wire according to the second embodiment of the present invention and an electric wire according to a comparative example.
Figure 58:
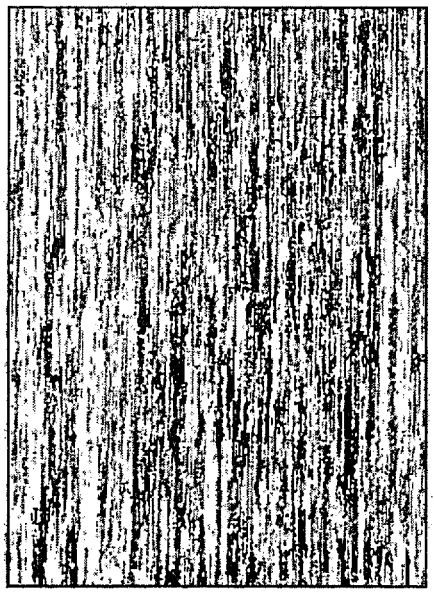
FIG. 58(*a*) is an optical micrograph showing a cross section of a processed texture of tough pitch copper (TPC) manufactured by an SCR process.
Figure 58:
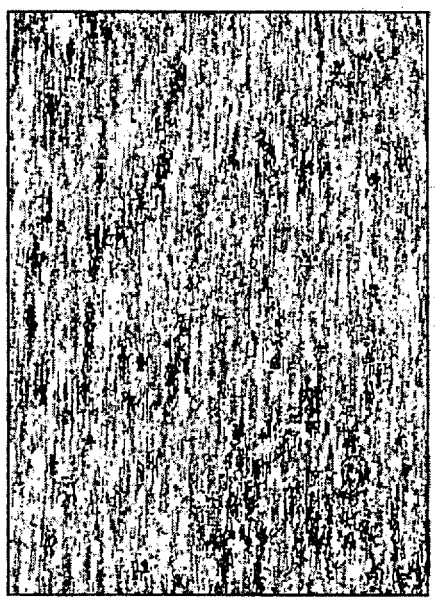

Next, the electric wire according to the second embodiment of the present invention is explained in more detail in comparison with an electric wire, as a comparative example, which is recrystallized through a thermal treatment at a recrystallizing temperature or higher. Since the electric wire according to the second embodiment of the present invention is produced in a manner such that the central conductor 1 covered with the covering layer 2 is subjected to wire drawing by use of dies with multiple stages, the central conductor 1 and the covering layer 2 each have a processed texture and have a fiber-like texture in the longitudinal direction as schematically shown in FIG. 57. Here, the processed texture means a cold-processed texture. Cold processing means processing conducted at a recrystallizing temperature or lower. Further, the fiber-like texture means a texture in which crystal grains are stretched in a drawing direction by wire drawing processing. As examples of such processed textures, FIG. 58(a) shows a cross section of a processed texture of tough pitch copper (TPC) having a diameter of 0.9 mm manufactured by a southwire continuous rod (SCR) process, and FIG. 58(b) shows a cross section of a processed texture of oxygen-free copper (OFC) having a diameter of 0.9 mm manufactured by a dip forming process.

Figure 59:
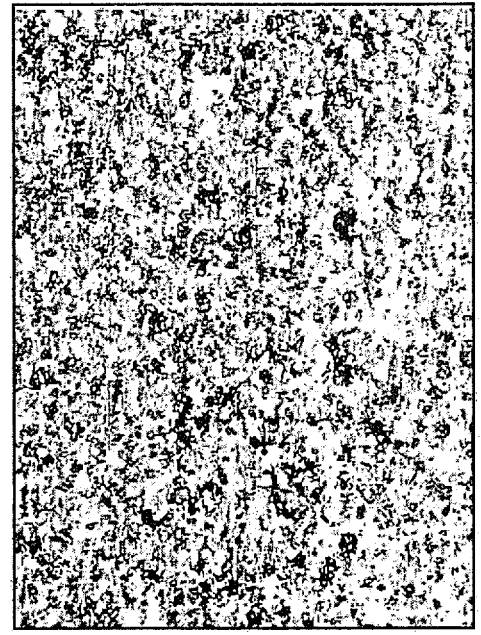
FIG. 59(*a*) is an optical micrograph showing a cross section of a recrystallization texture of tough pitch copper (TPC) manufactured by an SCR process.
Figure 59:
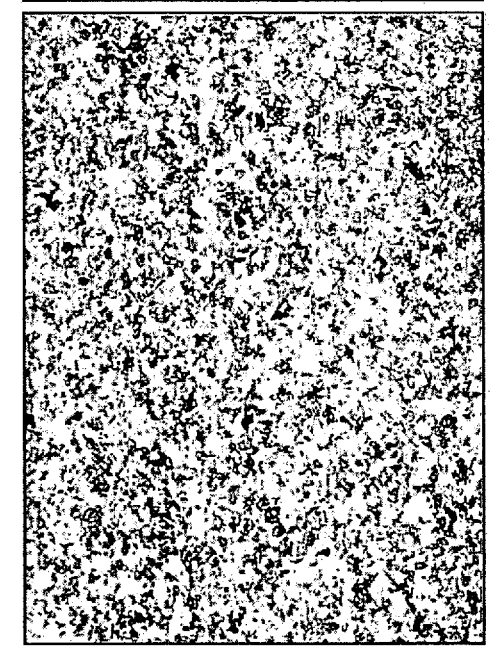

In contrast, as schematically shown in FIG. 57, the electric wire according to the comparative example has a recrystallized texture recrystallized by conducting a thermal treatment at a recrystallizing temperature or higher. Here, the recrystallized texture means a texture in which crystal grains having strains caused by cold processing are replaced by crystals having no strain through recrystallization. As examples of the recrystallized textures, FIG. 59(a) shows a cross section of a recrystallized texture of tough pitch copper (TPC) having a diameter of 0.9 mm manufactured by the SCR process, and FIG. 59(b) shows a cross section of a recrystallized texture of oxygen-free copper (OFC) having a diameter of 0.9 mm manufactured by the dip forming process.

In addition, as shown in FIG. 57, the electric wire according to the second embodiment of the present invention can further suppress the proximity effect since the specific resistance value thereof is higher than that of the electric wire according to the comparative example. Further, the electric wire according to the second embodiment of the present invention has higher Vickers hardness than the electric wire according to the comparative example and therefore, has higher resistance to damages and deformation at the time of manufacture and has more stable characteristics as a coil.

Figure 60:
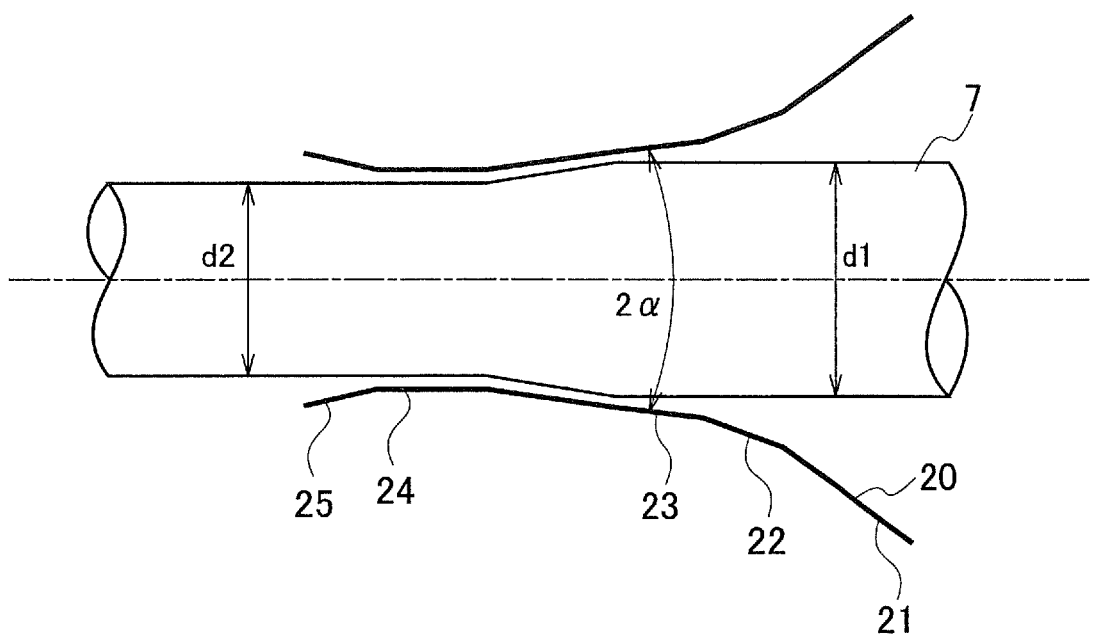
FIG. 60 is a schematic view showing an example of wire drawing dies according to the second embodiment of the present invention.
Figure 61:
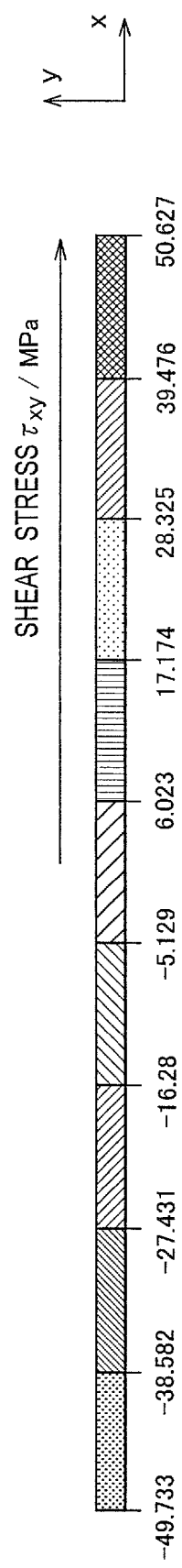
FIG. 61 is a schematic view showing a shear stress classification at the time of wire drawing according to the second embodiment of the present invention.
Figure 62:
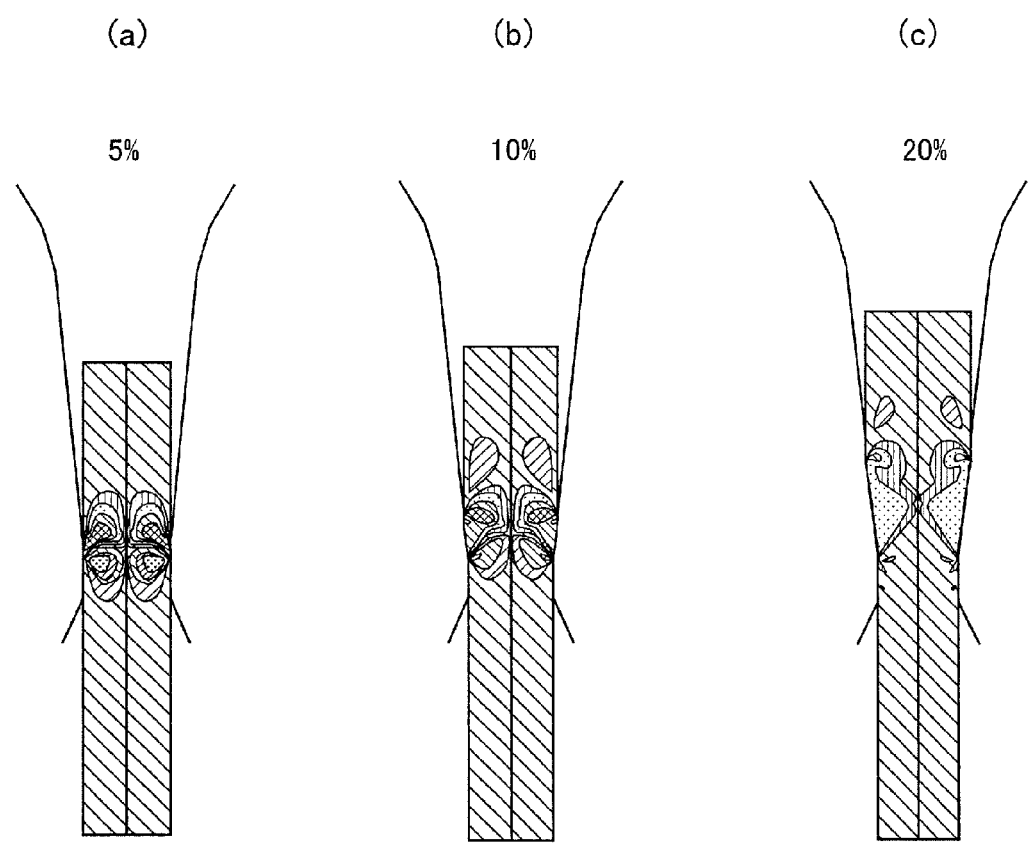
FIGS. 62(*a*) to 62(*c*) are schematic views each showing an analysis result of stress distribution at the time of wire drawing according to the second embodiment of the present invention.

Next, a method for manufacturing the electric wire according to the second embodiment of the present invention is explained. It should be noted that the following manufacturing method is an example and the present invention is not limited thereto. The electric wire according to the second embodiment of the present invention may be manufactured by various manufacturing methods.

i) The central conductor 1 made of aluminum or an aluminum alloy having a diameter approximately in the range from 9.5 mm to 12.0 mm is prepared. The surface of the central conductor 1 is covered with the cover layer 2 in such a manner as to perform TIG welding, plasma welding, or the like while longitudinally attaching a copper tape having a thickness approximately in the range from 0.1 mm to 0.4 mm to the surface of the central conductor 1. Next, the central conductor 1 covered with the cover layer 2 is subjected to skin pass to have a diameter approximately in the range from 9.3 mm to 12.3 mm, so as to prepare a base material composed of the central conductor 1 covered with the cover layer 2.

ii) Next, the base material is drawn through drawing dies with multiple stages having approximately 25 to 26 passes. As shown in FIG. 60, the wire drawing dies 20 include an entrance section 21, an approach section 22, a reduction section 23, a bearing section 24, and a back relief section 25. The base material 7 is processed at the reduction section 23 to have a diameter d2 which is smaller than a diameter d1 before wire drawing. In the second embodiment of the present invention, in each of the wire drawing dies, a reduction angle α shown in FIG. 60 is set to approximately 8 degrees (the entire angle 2α=16 degrees), and a cross-section reduction rate is set to approximately 20% or higher per pass (wire drawing die), preferably approximately in the range from 20% to 29%. By setting the cross-section reduction rate of the wire drawing dies to approximately 20% or higher, preferably approximately in the range from 20% to 29%, large shearing stress can be generated continually in the same direction. Due to the shearing heat generation, the intermetallic compound layer 4 made from the materials of the central conductor 1 and the cover layer 2 is formed in the interface between the central conductor 1 and the cover layer 2. Since the base material passes through the wire drawing dies with multiple stages, the diameter of the electric wire thus obtained is approximately 0.6 mm or smaller.

iii) Subsequently, the ferromagnetic layer 3 including Ni or the like having a thickness approximately in the range from 0.5 μm to 10 μm is formed on the surface of the cover layer 2 by, for example, electroplating.

According to the method for manufacturing the electric wire of the second embodiment of the present invention, the electric wire shown in FIG. 50 can be manufactured in which the intermetallic compound layer 4 is formed between the central conductor 1 and the cover layer 2 without performing a thermal treatment after wire drawing in a manner such that the cross-section reduction rate of the dies multiple stages in the wire drawing process is set to 20% or higher.

FIG. 61 and FIG. 62(a) to FIG. 62(c) show finite element method (FEM) analysis of longitudinal section stress distributions at the time of wire drawing. On the basis of the shearing stress classification shown in FIG. 61, FIG. 62(a) to FIG. 62(c) show the longitudinal section stress distributions at the time of wire drawing when the cross-section reduction rates of the wire drawing dies are 5%, 10% and 20%. As is apparent from FIG. 62(a) to FIG. 62(c), large shearing stress is generated when the cross-section reduction rate of the wire drawing dies is 20%, compared to the case where the cross-section reduction rate of the wire drawing dies is 5% or 10%. In the embodiment of the present invention, wire drawing is gradually performed by using the plural wire drawing dies each having the cross-section reduction rate of 20% or higher, so as to continuously and periodically generate relatively high shearing heat. Accordingly, the intermetallic compound layer 4 can be produced in a fine bonding state in a manner such that the composition thereof changes obliquely between the central conductor 1 and the cover layer 2.

Example

As an example of the second embodiment of the present invention, an electric wire was prepared, in which the intermetallic compound layer 4 was formed between the central conductor 1 and the cover layer 2 as shown in FIG. 50 by using a plurality of wire drawing dies each having a cross-section reduction rate of 20% or higher, and the cross-sectional area of the cover layer 2 was 5% of the entire cross-sectional area of the electric wire (hereinafter, referred to as "5%-CA wire"). First, a base material was prepared in a manner such that a copper tape having a thickness of 0.15 mm was longitudinally applied and welded by TIG welding onto the central conductor 1 made of Al with a diameter of 9.5 mm and subjected to skin pass so as to have a diameter of 9.25 mm. The base material thus obtained was allowed to pass through wire drawing dies with multiple stages (26 passes) to reduce the diameter from 9.25 mm to 0.4 mm. The reduction angle α of each of the wire drawing dies was uniformly set to 8 degrees (the entire angle 2α=16 degrees), the cross-section reduction rates from the first pass through the third pass were set to between 29% and 24%, the cross-section reduction rates from the fourth pass through the tenth pass were set to between 23% and 21%, and the cross-section reduction rates from the eleventh pass through the twenty-sixth pass were set to between 21% and 20%.

The copper/aluminum interface of the 5%-CA wire according to the example of the second embodiment of the present invention was observed with a transmission electron microscope (TEM). The TEM observation revealed that an intermetallic compound having a thickness of 10 nm or greater was produced in a fine bonding condition when the diameter was 1.6 mm after the fourteenth pass. Similarly, an intermetallic compound having a thickness of 10 nm or greater was confirmed when the diameter was 0.4 mm after the twenty-sixth pass.

Figure 63:
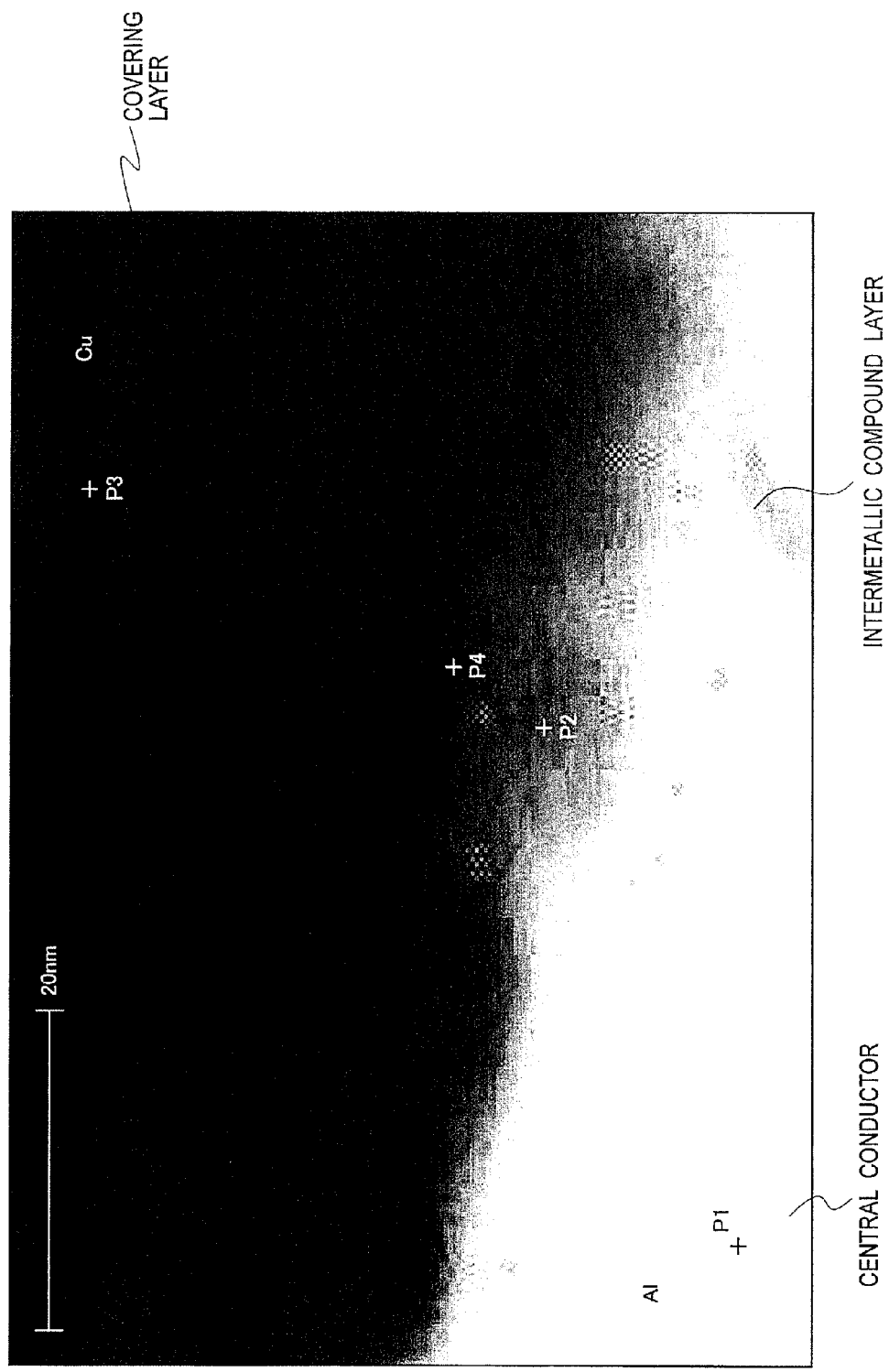
FIG. 63 is a photograph showing an observation result of an interface between a cover layer and a central conductor observed with a transmission electron microscope according to the second embodiment of the present invention.
Figure 64:
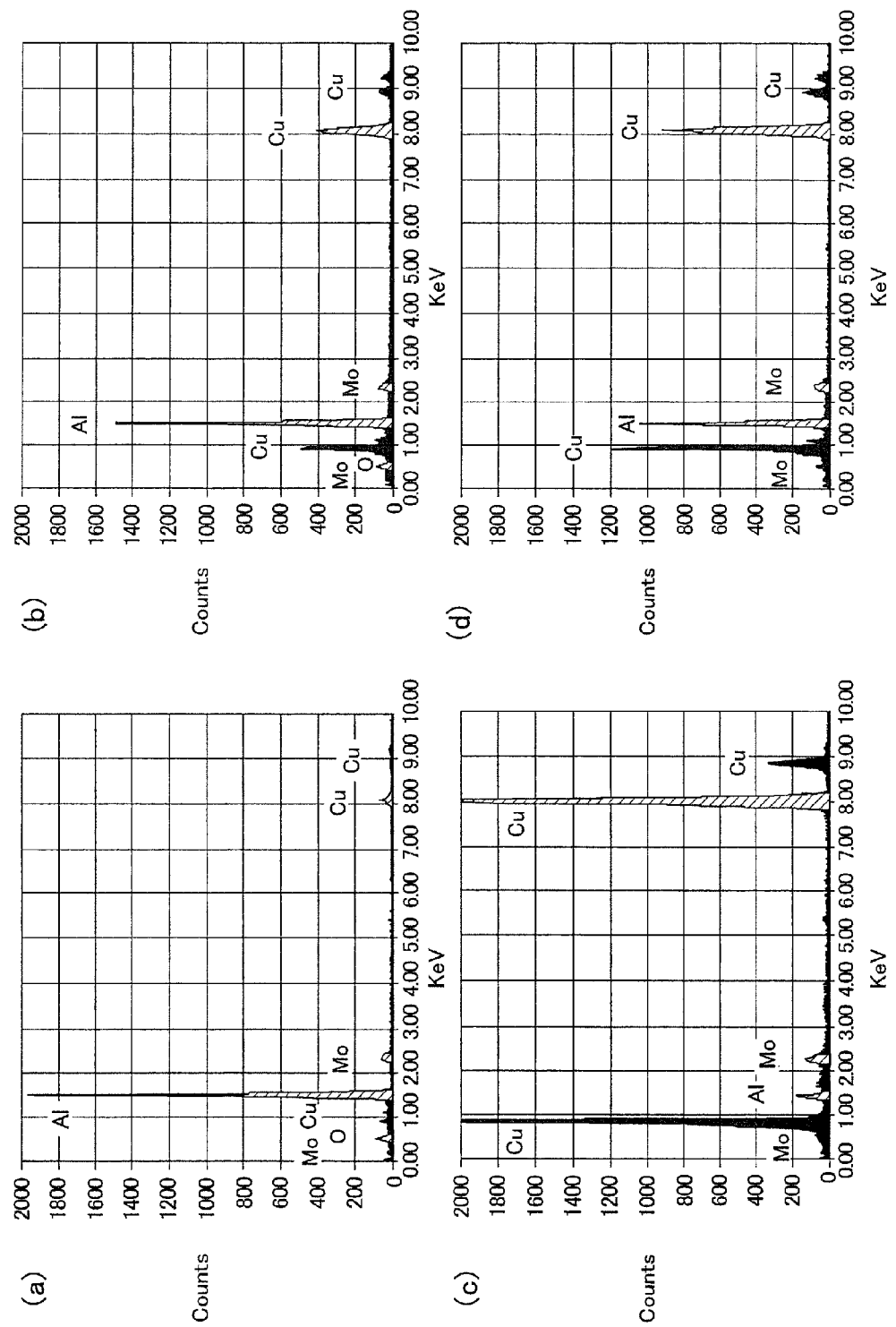
FIGS. 64(*a*) to 64(*d*) are graphs each showing a result of energy dispersive X-ray spectrometry (EDS) according to an example of the second embodiment of the present invention.

FIG. 63 shows a TEM photograph of the 5%-CA wire. In FIG. 63, the black area represents copper, the white area represents Al, and the gray area represents the intermetallic compound layer. It is apparent from FIG. 63 that the intermetallic compound layer 4 is produced in a fine bonding condition in a manner such that the composition thereof obliquely changes from the central conductor 1 to the cover layer 2. FIG. 64(a) to FIG. 64(d) each show the result of point analysis by energy dispersive X-ray spectrometry (EDS) concerning point P1 in the central conductor 1, point P2 in the intermetallic compound layer 4 on the central conductor 1 side, point P3 in the cover layer 2, and P4 in the intermetallic compound layer 4 on the cover layer 2 side shown in FIG. 63. As shown in FIG. 64(b), it was confirmed that Al atoms were rich in the intermetallic compound layer 4 on the central conductor 1 side, and, as shown in FIG. 64(d), it was confirmed that copper atoms were rich in the intermetallic compound layer 3 on the cover layer 2 side. As is apparent from FIGS. 64(a) to 64(d), the metallic materials which constitute the intermetallic compound layer 4 are distributed obliquely from the central conductor 1 to the cover layer 2. In addition, $Cu_9Al_4$ and $CuAl_2$ are main compositions of the intermetallic compound layer 4, and the specific resistivity of each of thin and flat $Cu_9Al_4$ and $CuAl_2$ is approximately 10 μΩcm or higher. Since the specific resistivity of copper is 1.724 μΩcm, the specific resistivity of the intermetallic compound layer is at least 5 times larger than copper, which is a sufficiently large value.

Other Embodiment

Although the present invention has been described based on the foregoing embodiments, it should be understood that the description and drawings that are part of this disclosure do not limit the present invention. Various alternative embodiments, examples, and operation techniques will be obvious to those skilled in the art according to this disclosure.

Although the strand (solid wire) was explained as the electric wire according to the first and second embodiments of the present invention, the plural strands may be bundled into an integrated cable or stranded as a litz wire. The integrated cable or the litz wire can also suppress the AC resistance effectively.

When the high frequency electric wire is deformed, for example, in the case where the electric wire according to the second embodiment of the present invention is formed into a coil or used as a litz wire, the electric wire is deformed without performing a thermal treatment in order to keep the processed texture thereof (fiber-like texture in the longitudinal direction). The thermal treatment may be carried out to the extent of not impairing the processed texture if the thermal treatment is required in order to improve flexibility. Further, the thermal treatment may be carried out to the extent of not impairing the processed texture if the thermal treatment is required in order to increase the resistance value of each of the central conductor 1 and the cover layer 2. In the case where the thermal treatment is carried out, the high frequency electric wire may be deformed during the thermal treatment, or may be deformed before the thermal treatment. Further, the thermal treatment may be performed on the high frequency electric wire entirely or locally.

Further, the electric wire according to the first and second embodiments of the present invention and the coil using the electric wire may be used at the frequency approximately in the range from 200 Hz to 30 MHz or approximately in the range from 1 kHz to 30 MHz, and may be applicable to reactors used approximately at 40 kHz, IH cookers used approximately at 60 kHz, high frequency transformers for a switching power supply used approximately at 230 kHz, and magnetic resonance non-contact power supplies used in the industrial, scientific and medical (ISM) band at 13.56 MHz.

In the first and second embodiments of the present invention, "the high frequency" represents a frequency of, for example, approximately 200 Hz or higher. Note that the electric wire according to the first and second embodiments of the present invention and the coil using the electric wire may also be applicable to products used at a frequency of lower than 200 Hz, and may also be applicable to products used at a frequency of higher than 30 MHz.

In addition, the surface of the FCA wire used for the coil according to the first and second embodiments of the present invention is subjected to insulation covering with an insulator such as enamel.

The present invention, of course, includes various embodiments not described in this description. Therefore, the scope of the present invention is defined only by the appropriate features according to the claims in view of the explanations made above.

INDUSTRIAL APPLICABILITY

The electric wire and the coil according to the present invention may be applicable to electronic device industries including manufacturing of various devices such as a high frequency transformer, a motor, a reactor, a choke coil, induction heating equipment, a magnetic head, a high frequency feed cable, a DC power supply unit, a switching power supply, an AC adapter, a displacement detecting sensor/a flaw detecting sensor for an eddy current detection system or the like, an IH cooking heater, a non-contact power supply device such as a coil and a feed cable, or a high frequency current generator.

What is claimed is:

1. An electric wire comprising:
    a central conductor made of aluminum or an aluminum alloy;
    a cover layer made of copper and covering the central conductor; and
    a ferromagnetic layer covering the cover layer and blocking an external magnetic field,
    wherein a thickness of the ferromagnetic layer is in a range from 0.04 μm to 14 μm, a total diameter of the central conductor and the cover layer is in a range from 0.05 mm to 0.4 mm, a cross-sectional area of the central conductor is in a range from 85% to 95% of a total cross-sectional area of the central conductor and the cover layer, relative magnetic permeability of the ferromagnetic layer is in a range from 5 to 10000, and a frequency used is in a range from 200 Hz to 30 MHz.

2. A coil comprising an electric wire subjected to insulation covering, the electric wire comprising:
    a central conductor made of aluminum or an aluminum alloy;
    a cover layer made of copper and covering the central conductor; and
    a ferromagnetic layer covering the cover layer and blocking an external magnetic field,
    wherein a thickness of the ferromagnetic layer is in a range from 0.04 μm to 14 μm, a total diameter of the central conductor and the cover layer is in a range from 0.05 mm to 0.4 mm, a cross-sectional area of the central conductor is in a range from 85% to 95% of a total cross-sectional area of the central conductor and the cover layer, relative magnetic permeability of the ferromagnetic layer is in a range from 5 to 10000, and a frequency used is in a range from 200 Hz to 30 MHz.

* * * * *